(12) United States Patent
Iguchi

(10) Patent No.: US 11,114,423 B2
(45) Date of Patent: Sep. 7, 2021

(54) IMAGE-FORMING ELEMENT

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 305 days.

(21) Appl. No.: 15/776,216

(22) PCT Filed: Nov. 9, 2016

(86) PCT No.: PCT/JP2016/083202
§ 371 (c)(1),
(2) Date: May 15, 2018

(87) PCT Pub. No.: WO2017/094461
PCT Pub. Date: Jun. 8, 2017

(65) Prior Publication Data
US 2018/0358339 A1    Dec. 13, 2018

(30) Foreign Application Priority Data
Dec. 1, 2015   (JP) .............................. JP2015-235023

(51) Int. Cl.
*H01L 25/16*   (2006.01)
*G09G 3/3233*   (2016.01)
(Continued)

(52) U.S. Cl.
CPC .............. *H01L 25/167* (2013.01); *G09F 9/33* (2013.01); *G09G 3/32* (2013.01); *G09G 3/3233* (2013.01);
(Continued)

(58) Field of Classification Search
CPC ... H01L 25/167; H01L 25/0753; H01L 33/62; H01L 33/505; H01L 33/54; H01L 33/504;
(Continued)

(56) References Cited

U.S. PATENT DOCUMENTS 5,621,225 A    4/1997 Shieh et al.
6,784,933 B1 *  8/2004 Nakai ................... H01L 27/115
                                                        257/291

(Continued)

FOREIGN PATENT DOCUMENTS

JP    H06-334217 A    12/1994
JP    H10-12932 A     1/1998
(Continued)

OTHER PUBLICATIONS

Liu, Z. J. et al., "Monolithic LED Microdisplay on Active Matrix Substrate Using Flip-Chip Technology", IEEE journal of selected topics in quantum electronics, vol. 15, No. 4, p. 1298-1302, (2009).

(Continued)

*Primary Examiner* — Alexander Eisen
*Assistant Examiner* — Kebede T Teshome
(74) *Attorney, Agent, or Firm* — ScienBiziP, P.C.

(57) ABSTRACT

An image-forming element includes a plurality of pixels, and projects and displays light emitted from the pixels. The image-forming element includes a light emitting element which includes a light source emitting the light and a mounting substrate on which a plurality of light emitting elements are provided on a mounting surface. A plurality of light sources which are segmented and included in at least one pixel are provided, and each of the light sources includes power supply electrodes provided on the same surface or a surface facing the mounting substrate. The mounting substrate includes a drive circuit which drives the light source and electrodes which are provided on the mounting surface (Continued)

and are electrically connected to the power supply electrodes of the light source. In each pixel, an area occupation ratio of the light source with respect to a region area of the pixel is 15% or more and 85% or less. The drive circuit includes a switch circuit which selectively short-circuits the electrodes electrically connected to the power supply electrodes of the light source with other electrodes or wirings in the drive circuit, or at least one non-volatile memory transistor for adjusting a light emission intensity of the light emitting element.

7 Claims, 40 Drawing Sheets

(51) Int. Cl.
| | | |
|---|---|---|
| G09F 9/33 | (2006.01) | |
| G09G 3/32 | (2016.01) | |
| H01L 25/075 | (2006.01) | |
| H01L 33/62 | (2010.01) | |
| H01L 33/20 | (2010.01) | |
| H01L 33/00 | (2010.01) | |
| G09G 3/00 | (2006.01) | |
| H01L 33/50 | (2010.01) | |
| H01L 33/54 | (2010.01) | |
| H01L 21/66 | (2006.01) | |
| H01L 33/42 | (2010.01) | |
| H01L 33/60 | (2010.01) | |

(52) U.S. Cl.
CPC .......... *H01L 25/0753* (2013.01); *H01L 33/62* (2013.01); *G09G 3/006* (2013.01); *G09G 2300/0426* (2013.01); *G09G 2300/0814* (2013.01); *G09G 2300/0842* (2013.01); *G09G 2330/12* (2013.01); *H01L 22/22* (2013.01); *H01L 33/007* (2013.01); *H01L 33/0093* (2020.05); *H01L 33/0095* (2013.01); *H01L 33/20* (2013.01); *H01L 33/42* (2013.01); *H01L 33/504* (2013.01); *H01L 33/505* (2013.01); *H01L 33/508* (2013.01); *H01L 33/54* (2013.01); *H01L 33/60* (2013.01); *H01L 2224/16225* (2013.01); *H01L 2224/81* (2013.01); *H01L 2224/95* (2013.01); *H01L 2933/0041* (2013.01); *H01L 2933/0066* (2013.01); *H01L 2933/0091* (2013.01)

(58) Field of Classification Search
CPC ....... H01L 33/20; H01L 33/60; H01L 33/508; H01L 33/42; H01L 33/0079; H01L 33/007; H01L 2933/0091; H01L 2933/0041; H01L 2933/0095; H01L 2933/0066; H01L 2224/16225; H01L 2224/81; H01L 2224/95; H01L 22/22; G09G 3/3233; G09G 3/32; G09G 3/006; G09G 2300/0842; G09G 2300/0426; G09G 2330/12; G09F 9/33
See application file for complete search history.

(56) References Cited

U.S. PATENT DOCUMENTS

| | | | |
|---|---|---|---|
| 9,111,464 | B2 | 8/2015 | Bibl et al. |
| 2002/0064032 | A1 | 5/2002 | Oohata |
| 2004/0130015 | A1 | 7/2004 | Ogihara et al. |
| 2006/0077195 | A1* | 4/2006 | Kageyama ........... G09G 3/3233 345/204 |
| 2010/0238310 | A1* | 9/2010 | Shizukuishi ...... H01L 27/14643 348/220.1 |
| 2010/0320479 | A1 | 12/2010 | Minato et al. |
| 2014/0085169 | A1 | 3/2014 | Illek et al. |
| 2015/0138050 | A1* | 5/2015 | Kim .................... H04N 13/341 345/76 |
| 2018/0135841 | A1* | 5/2018 | Yonezawa ......... G02F 1/133603 |

FOREIGN PATENT DOCUMENTS

| | | | |
|---|---|---|---|
| JP | 2002-118124 A | 4/2002 | |
| JP | 2002-141492 A | 5/2002 | |
| JP | 3813123 B2 | 8/2006 | |
| JP | 2008262993 A * | 10/2008 | ............. H01L 24/95 |
| JP | 2010-087224 A | 4/2010 | |
| JP | 2014-514608 A | 6/2014 | |
| WO | 2009/069671 A1 | 6/2009 | |

OTHER PUBLICATIONS

J Day et al., "III-Nitride full-scale high-resolution microdisplays", AIP Publishing, Applied Physics Letters 99(3), 031116, (2011).

* cited by examiner

SECTION TAKEN ALONG LINE A-A

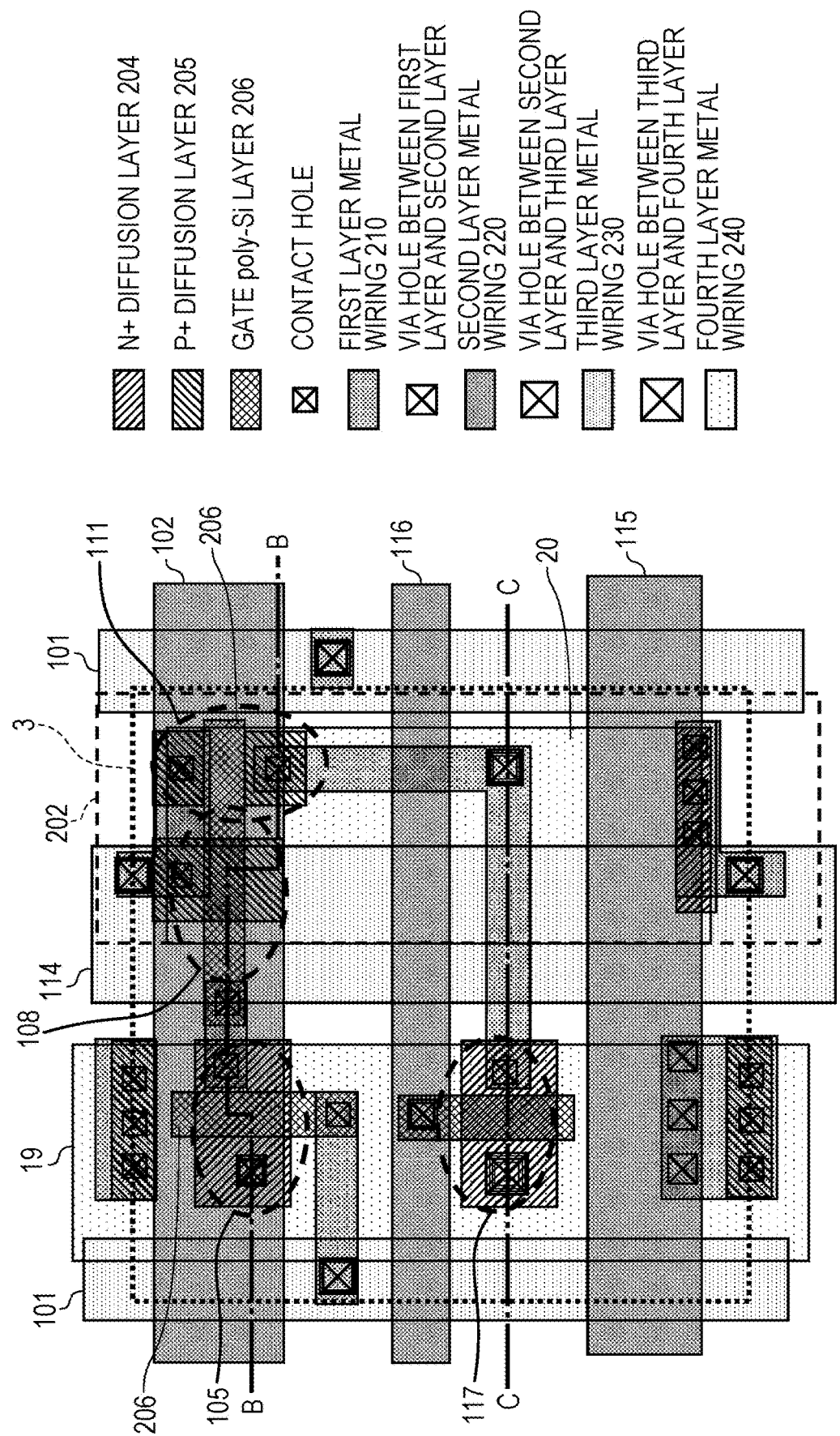

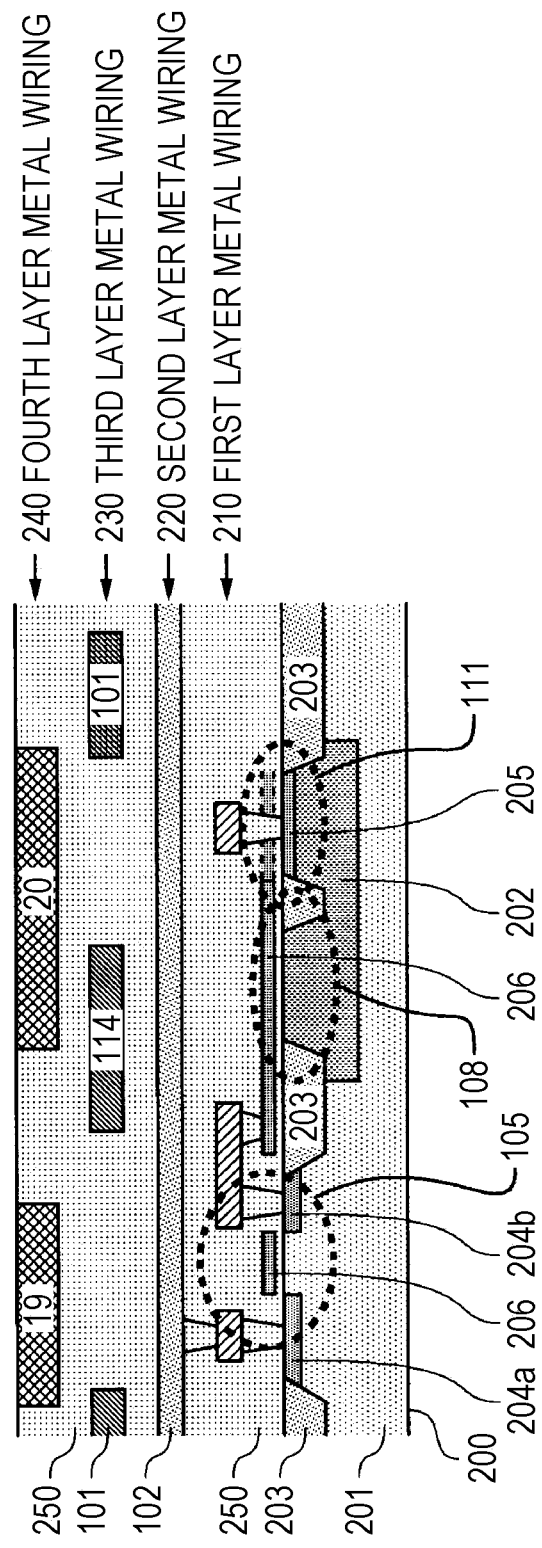

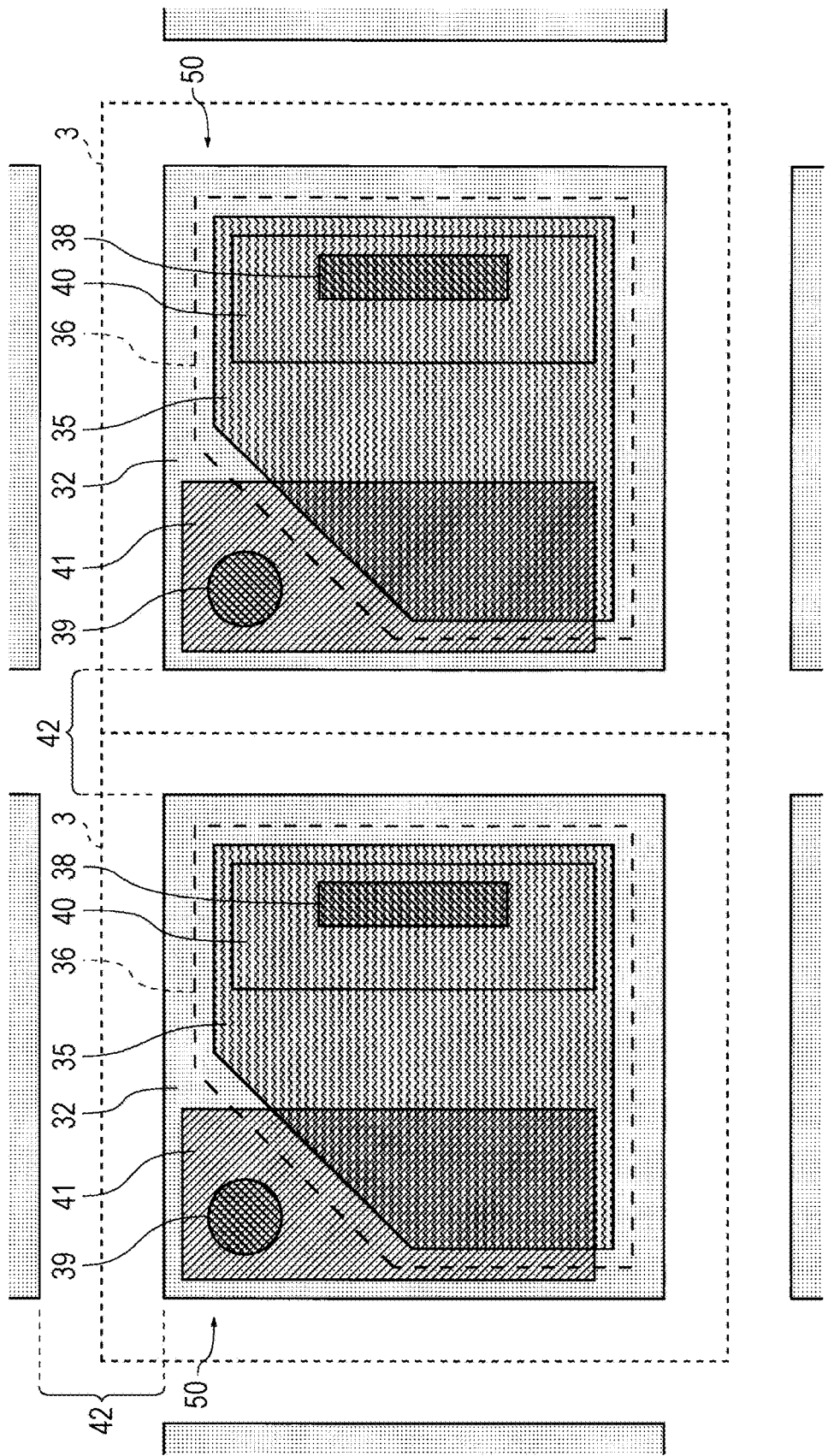

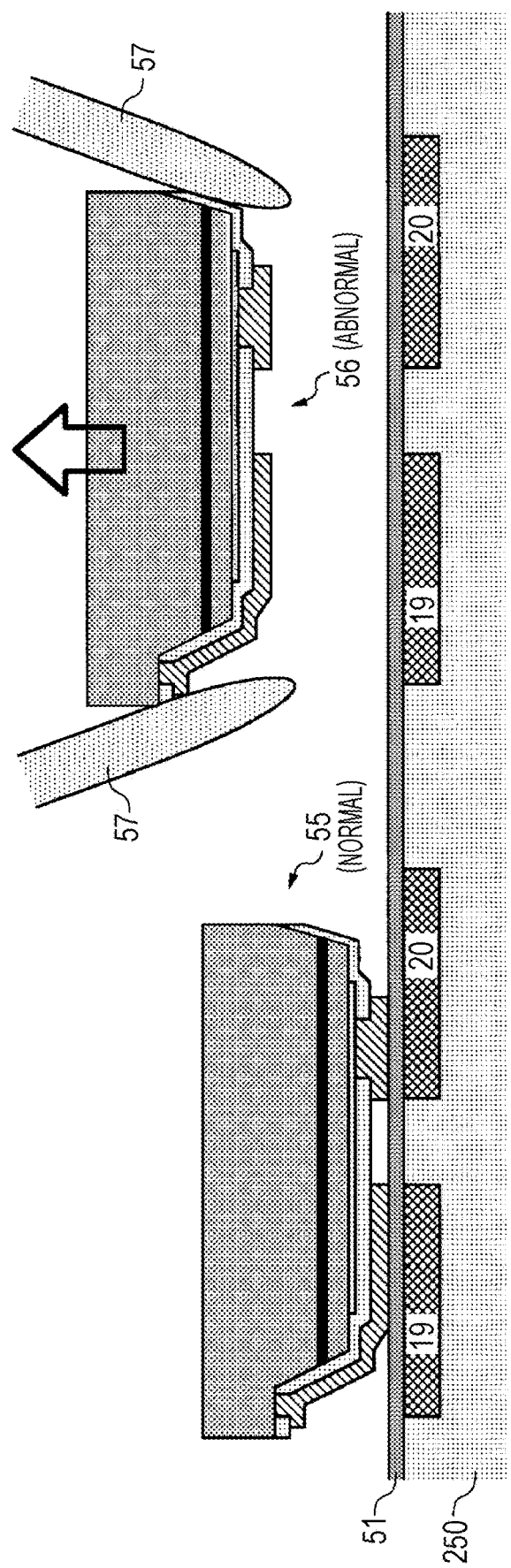

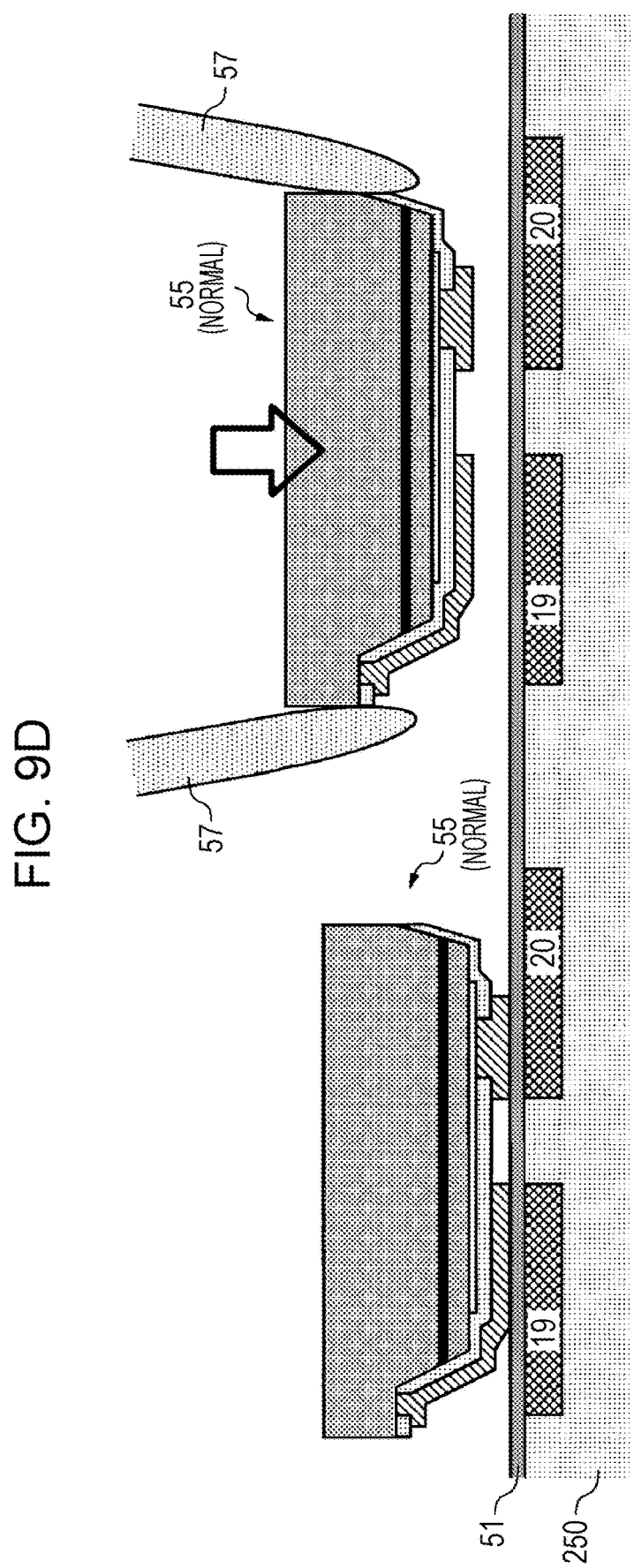

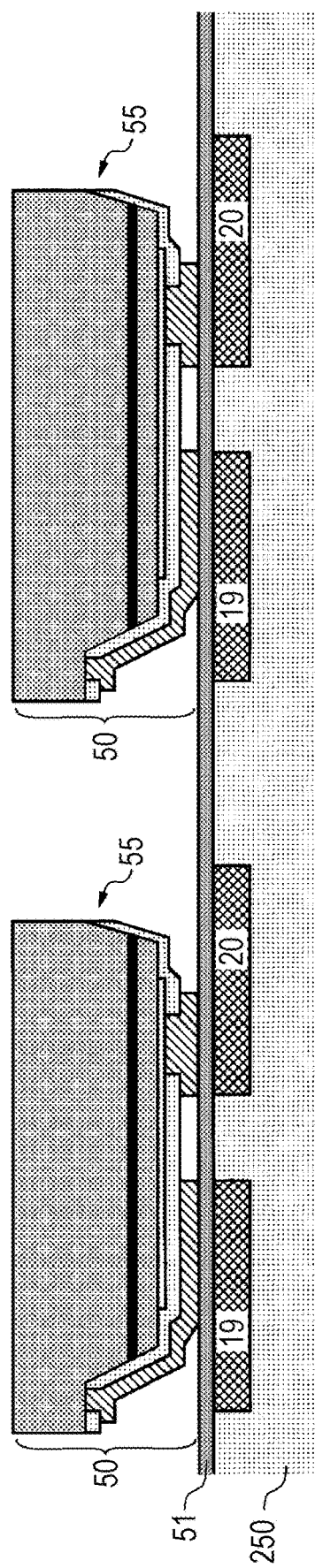

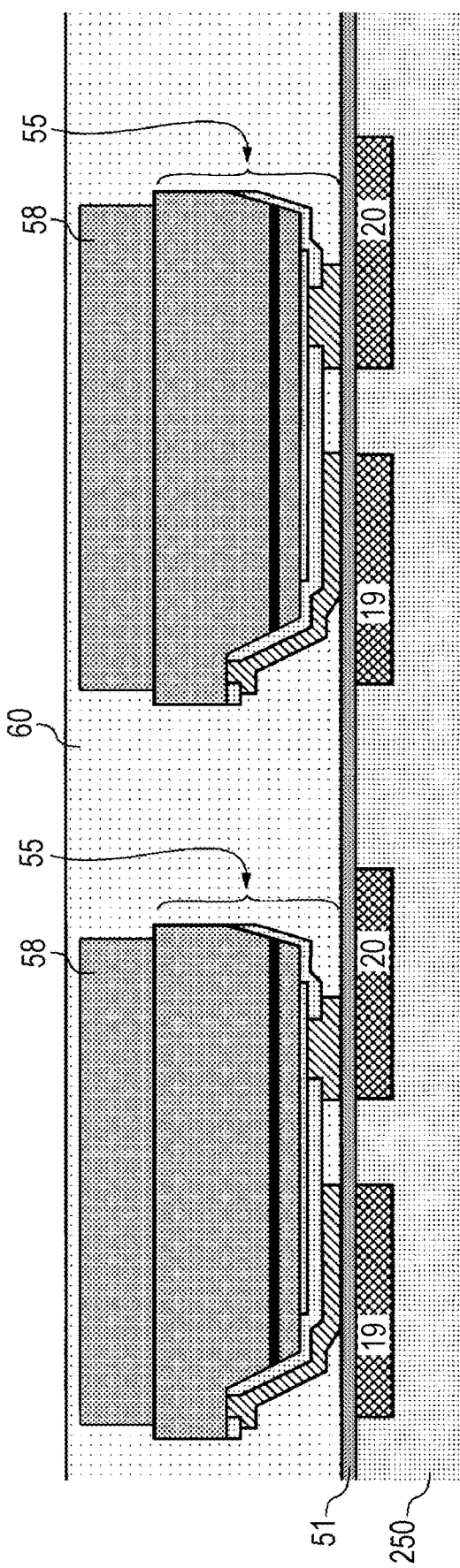

AREA OCCUPATION RATIO OF MESA PORTION: 65%
AREA OCCUPATION RATIO OF COMPOUND SEMICONDUCTOR LAYER: 77%

AREA OCCUPATION RATIO OF MESA PORTION: 58%
AREA OCCUPATION RATIO OF COMPOUND SEMICONDUCTOR LAYER: 81%

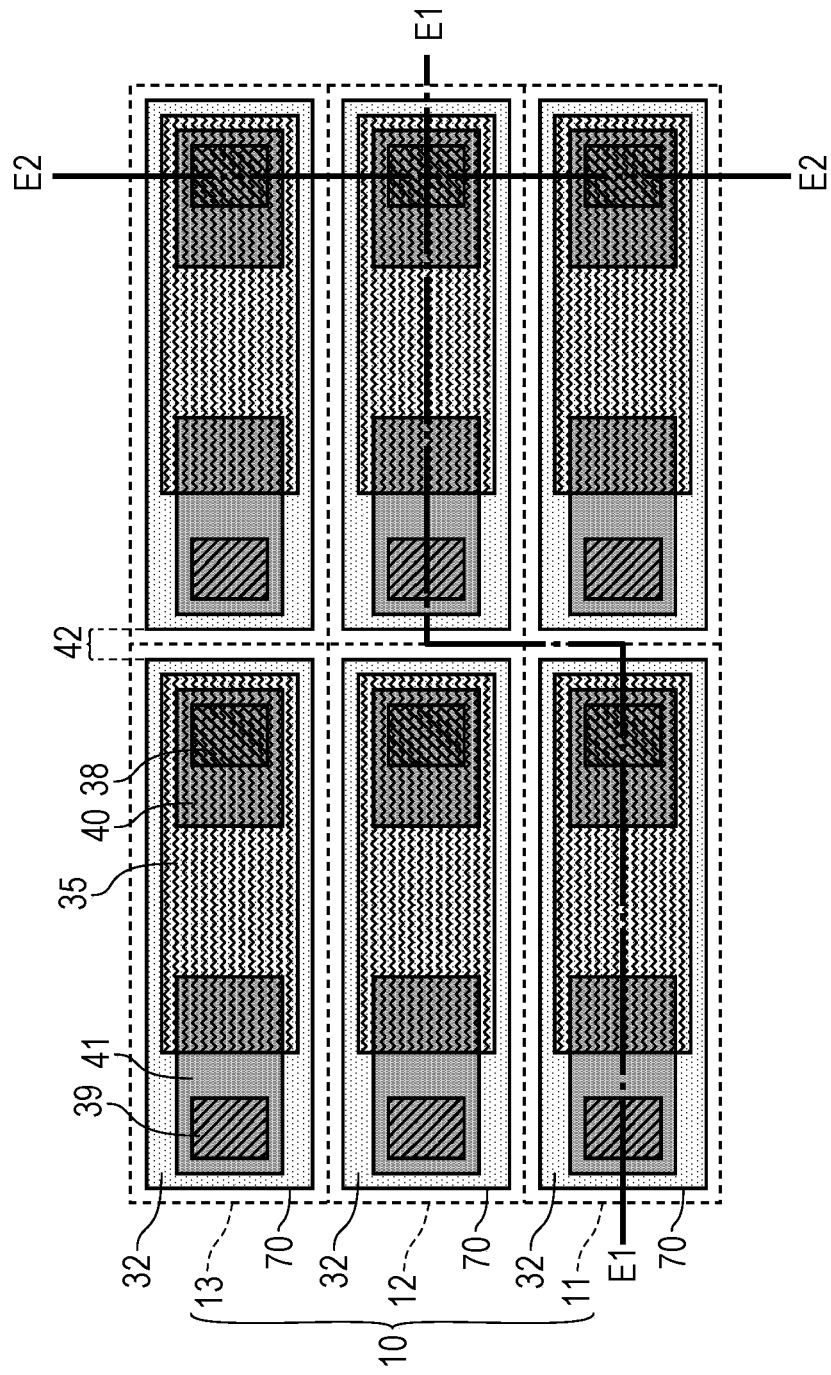

SECTION TAKEN ALONG LINE D-D

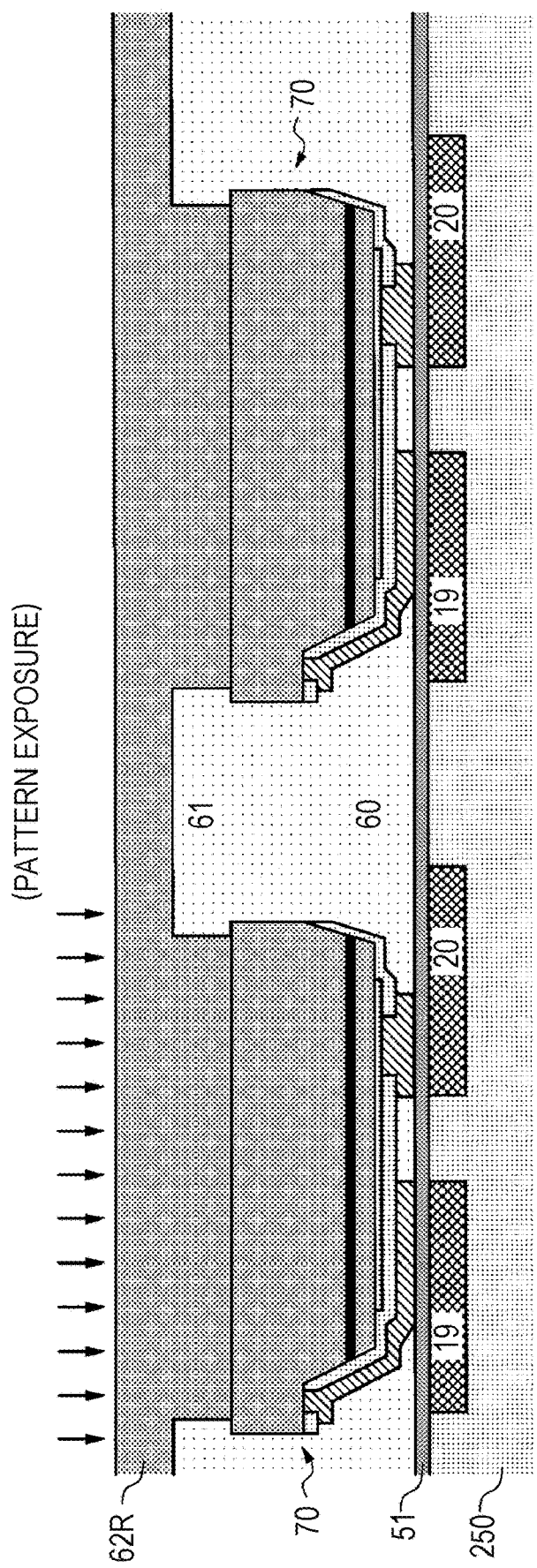

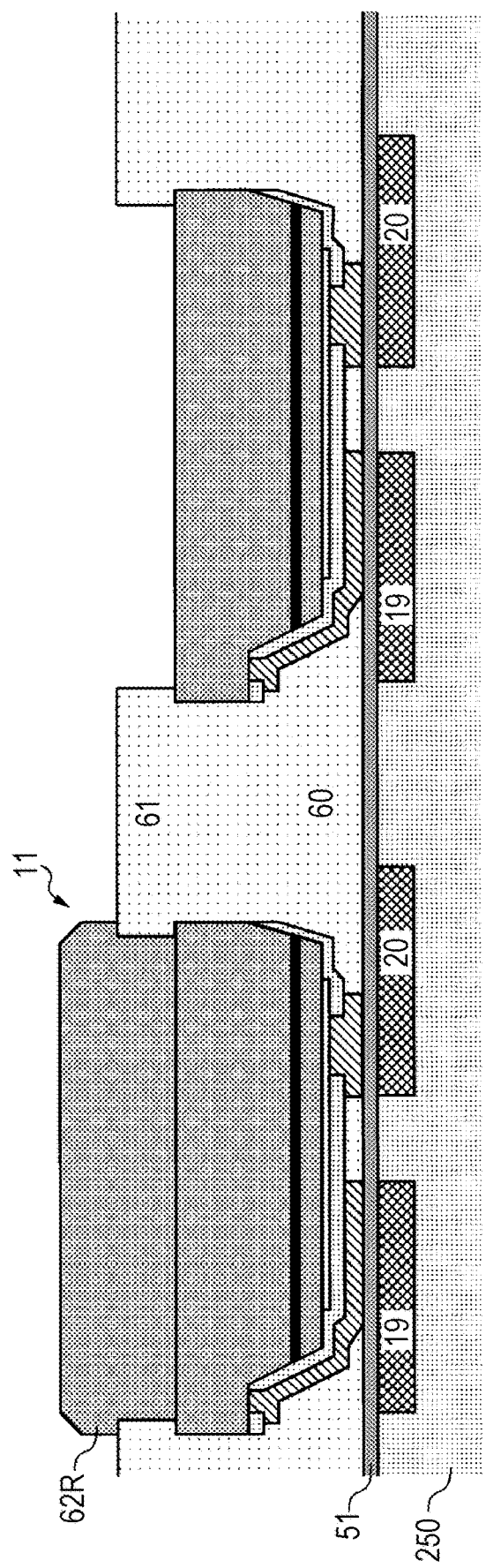

IMAGE-FORMING ELEMENT

TECHNICAL FIELD

The present invention relates to an image-forming element that includes a plurality of pixels and projects and displays light emitted from the pixels.

BACKGROUND ART

In a projector, a head-up display (HUD), or the like, light emitted from a light source is separated into light of three primary colors of red, green, and blue. Further, by changing an intensity of the light for each pixel and combining and projecting the charged light using an optical switch, a color image is formed. As the optical switch, a liquid crystal element or a digital mirror device (DMD) is used. As the liquid crystal element, for example, a reflection type liquid crystal element (for example, liquid crystal on silicon (LCOS)) in which a liquid crystal layer is provided on a liquid crystal drive circuit element configured with a transmissive liquid crystal panel and a silicon LSI, is used. In the DMD, a fine mirror is formed oN the drive circuit disposed for each pixel, and light is switched by adjusting an angle of the mirror.

In a method of forming a color image using the optical switch as described above, there is a difference in dark pixels depending on whether to shield or absorb the light from the light source by the liquid crystal or whether to output the light to an outside of an optical path by the mirror. However, in both cases, light is wasted. In both a bright scene and a dark scene, energy consumption by the light source does not change, and this results in a large energy loss. In addition, in a case where a liquid crystal element is used for the optical switch, it is difficult to completely shield light, and as a result, there is a problem that contrast of the image is decreased. In a case where the DMD is used for the optical switch, in some cases, the contrast may be decreased due to stray light directed to the outside of the optical path. As described above, in a display using an optical switching element such as a liquid crystal element or a DMD, energy of the light source is wasted.

In order to reduce power consumption, in a display, an idea of forming a pixel using a self light emitting element has been proposed. For example, PTL 1 discloses a structure in which LED chips are integrated on a silicon substrate on which drive circuits are formed, the LED chip including a light emitting layer formed using AlInGaP. PTL 2 discloses a structure in which LED chips are integrated on a silicon substrate on which drive circuits are formed in the same manner, the LED chip including a light emitting layer formed using an InGaN layer. In addition, NPL 1 discloses a structure in which blue LED chips are integrated on a silicon substrate on which drive circuits are formed in 30 rows and 30 columns or in 60 rows and 60 columns, the blue LED chip including a light emitting layer formed using an InGaN layer. In addition, an example in which phosphors of three colors are disposed on the LED of each pixel is also disclosed. A pixel pitch is 140 [μm] or 70 [μm]. In NPL 2, a monochrome display element including 160×120 pixels has been prototyped for a structure in which green LED chips are integrated on a silicon substrate on which drive circuits are formed, the green LED chip including a light emitting layer formed using InGaN. A pitch between the pixels is 15 [μm].

In the techniques disclosed above, a current is supplied from the drive circuit on the silicon substrate to the LED chip of each pixel correspond to luminance information of each pixel. Thus, a pixel in a dark state does not consume a current, and a pixel in a bright state only consumes a current according to luminance. Therefore, current consumption can be greatly reduced, as compared with an optical switching method which is mainly used at present. In addition, an epitaxial layer (in general, an N-type epitaxial layer) of the LED chip is used as one electrode (in general, a negative electrode) of the LED. Alternatively, in some cases, an epitaxial growth substrate of the LED chip may be used as a holding layer of the LED chip.

In addition to the techniques, as an example of a technique in the related art of the present invention, PTL 3 discloses a structure in which AlGaAs-based LEDs are adhered on a silicon substrate on which drive circuits are formed. In addition, PTL 4 discloses an example in which a pixel is configured with an LED chip including a cathode and an anode provided on one side of the LED chip. That is, so-called flip chip connection is applied to an LED display.

CITATION LIST

Patent Literature

PTL 1: Japanese Unexamined Patent Application Publication No. 10-12932
PTL 2: Japanese Unexamined Patent Application Publication No. 2002-141492
PTL 3: Japanese Patent No. 3813123
PTL 4: U.S. Pat. No. 9,111,464

Non Patent Literature

NPL 1: Liu, Z. J. et al., "Monolithic LED Microdisplay on Active Matrix Substrate Using Flip-Chip Technology", IEEE journal of selected topics in quantum electronics, Vol. 15, No. 4, p. 1298-1302, (2009)
NPL 2: J Day et al., "III-Nitride full-scale high-resolution microdisplays", Applied Physics Letters 99(3), 031116, (2011)

SUMMARY OF INVENTION

Technical Problem

However, the following problems exist in production of the LED display chip by using the structures and methods described in PTL 1 to PTL 4 and NPL 1 and NPL 2.

First, as in PTL 1 and PTL 2 and NPL 1 and NPL 2, a case where the substrate for forming the LED chips and the epitaxial layer of the LED are continuous between the pixels, or a case where the substrate for forming the LED chips and the epitaxial layer of the LED are partitioned between the pixels to be very close, is considered. In these cases, light leaks from a pixel emitting light to adjacent pixels, and as a result, the adjacent pixels also slightly emit light. Since a part of light is confined inside the epitaxial layer and the substrate, the confined light leaks to the adjacent pixels via the epitaxial layer and the substrate, and as a result, the leaked light is emitted from the adjacent pixels to the outside. This phenomenon is inevitable in the above techniques. In addition, this phenomenon causes a problem that luminance of a dark pixel adjacent to a bright pixel is increased, and as a result, contrast of the image is decreased.

In addition, in PTL 1 to PTL 3 and NPL 1 and NPL 2, an upper/lower electrode type LED chip is used for a pixel (the upper/lower electrode type refers to a structure in which a cathode and an anode are vertically provided with the light emitting layer therebetween. Generally, a cathode electrode is provided in contact with a lower surface of an N-type epitaxial layer below the light emitting layer, and an anode electrode is provided in contact with an upper surface of a P-type epitaxial layer above the light emitting layer.). When the upper/lower electrode type LED chip is used, after one electrode of the LED chip is connected to an electrode on the silicon substrate on which the drive circuit are formed, unless the other electrode of the LED chip and another electrode on the silicon substrate are connected to each other, it is not possible to test characteristics of the LED chip. In a case where each pixel is tested after the electrodes of the LED chip are connected to the electrodes on the silicon substrate, even when a pixel with a defect such as nor-lighting or a gray scale defect is found by testing, it is not easy to repair the defective pixel. In a case of repairing the defective pixel, it is necessary to disconnect the LED chip from the silicon substrate, remove the defective LED chip, replace the defective LED chip with a normal LED chip, connect one electrode of the normal LED chip to the electrode of the silicon substrate, and connect the other electrode of the normal LED chip to the electrode of the silicon substrate. Such a repairing step causes a cost increase, and in some cases, the adjacent pixels may be damaged. Thus, the repairing step is not realistic. For this reason, in such a display, it is very difficult to repair pixel defects, and a yield is remarkably decreased when repairing the pixel defects.

In consideration of the above circumstances, an object of the present invention is to provide an image-forming element with excellent color rendering and high contrast, and to establish a technology capable of manufacturing an image-forming element with low defects and high yield.

Solution to Problem

According to the present invention, there is provided an image-forming element that includes a plurality of pixels and projects and displays light emitted from the pixels, the element including: a light emitting element which includes a light source emitting the light; and a mounting substrate on which a plurality of light emitting elements are provided on a mounting surface, in which a plurality of light sources which are segmented and included in at least one pixel are provided, in which each of the light sources includes a plurality of power supply electrodes provided on the same surface, in which the mounting substrate includes a drive circuit which drives the light source and electrodes which are provided on the mounting surface and are electrically connected to the power supply electrodes of the light source, and in which, in each pixel, an area occupation ratio of the light source with respect to a region area of the pixel is 15% or more and 85% or less.

In addition, according to the present invention, there is provided an image-forming element that includes a plurality of pixels and project and displays light emitted from the pixels, the element including: a light emitting element which includes a light source emitting the light; and a mounting substrate on which a plurality of light emitting elements are provided on a mounting surface, in which a plurality of light sources which are segmented and included in at least one pixel are provided, in which each of the light sources includes at least one power supply electrode on a surface facing the mounting substrate, in which the mounting substrate includes a drive circuit which drives the light source and electrodes which are provided on the mounting surface and are electrically connected to the power supply electrodes of the light source, and in which the drive circuit includes a switch circuit which selectively short-circuits the electrodes electrically connected to the power supply electrodes of the light source with other electrodes or wirings in the drive circuit.

In addition, according to the present invention, there is provided an image-forming element that includes a plurality of pixels and projects and displays light emitted from the pixels, the element including: a light emitting element which includes a Light source emitting the light; and a mounting substrate on which a plurality of light emitting elements are provided on a mounting surface, in which a plurality of light sources which are segmented and included in at least one pixel are provided, in which each of the light sources includes one or a plurality of power supply electrodes provided on the same surface, in which the mounting substrate includes a drive circuit which drives the light source and electrodes which are provided on the mounting surface and are electrically connected to the power supply electrodes of the light source, and in which the drive circuit includes at least one non-volatile memory transistor for adjusting a light emission intensity of the light emitting element.

In the image-forming element, the light source may be a compound semiconductor light emitting diode.

In the image-forming element, the mounting substrate may be a semiconductor substrate. The drive circuit, an array selection circuit which selects the pixels arranged in a predetermined direction, and a signal output circuit which outputs a drive signal to the drive circuit for driving the light source of the pixel selected by the array selection circuit may be monolithically formed on the mounting substrate.

The image-forming element may further include an anisotropic conductive film which is provided on at least the electrodes of the mounting substrate, and the power supply electrodes of each of the light sources may be provided on the electrodes of the mounting substrate via the same anisotropic conductive film.

The image-forming element may further include a first light shielding layer having a light reflection property or a light absorption property, and the first light shielding layer may be provided between the adjacent light sources.

In the image-forming element, the light emitting element may further include a wavelength conversion layer that converts the light emitted from the light source into light having a different wavelength and emits the converted light to the outside.

The image-forming element may further include a second light shielding layer having a light reflection property or a light absorption property, and the second light shielding layer may be provided in at least a portion between the adjacent wavelength conversion layers.

In the image-forming element, a plurality of wavelength conversion layers may be provided in the light emitting element in the light emitting element, and each of the wavelength conversion layers may convert the emitted light into light having a wavelength among wavelengths different from each other.

Further, in the image-forming element, the light source may be provided for each of the wavelength conversion layers.

Alternatively, in the image-forming element, plurality of wavelength conversion layers may be provided for each of the light sources.

In the image-forming element, a plurality of light emitting elements with the same configuration may be provided for each pixel.

Advantageous Effects of Invention

According to the present invention, it is possible to provide as image-forming element with excellent color rendering and high contrast. Further, it is possible to establish a technology capable of manufacturing an image-forming element with low defects and high yield.

BRIEF DESCRIPTION OF DRAWINGS

FIG. 5 is a perspective plan view illustrating an example of a pattern layout of the pixel drive circuit.

FIG. 6A is a sectional view illustrating a sectional structure taken along an one-dot chain line B-B.

FIG. 8 is a top view illustrating an example of a blue LED chip provided in a pixel array.

FIG. 9C is a view for explaining a step of removing the blue LED chip in which defective light emission is detected from the image drive circuit.

FIG. 9D is a view for explaining a step of adhering an alternative normal blue LED chip.

FIG. 9F is a view for explaining a step of firing the LED display chip while pressurizing the LED display chip.

FIG. 9H is a view for explaining a step at forming a light-shielding reflection layer on the pixel array.

FIG. 14A is a perspective plan view illustrating a configuration example of a pixel including independent light emitting elements.

FIG. 17A is a view illustrating a step of applying a wavelength conversion layer and exposing a pattern to light.

FIG. 17B is a view illustrating a step of developing and baking the wavelength conversion layer.

DESCRIPTION OF EMBODIMENTS

Figure 1:
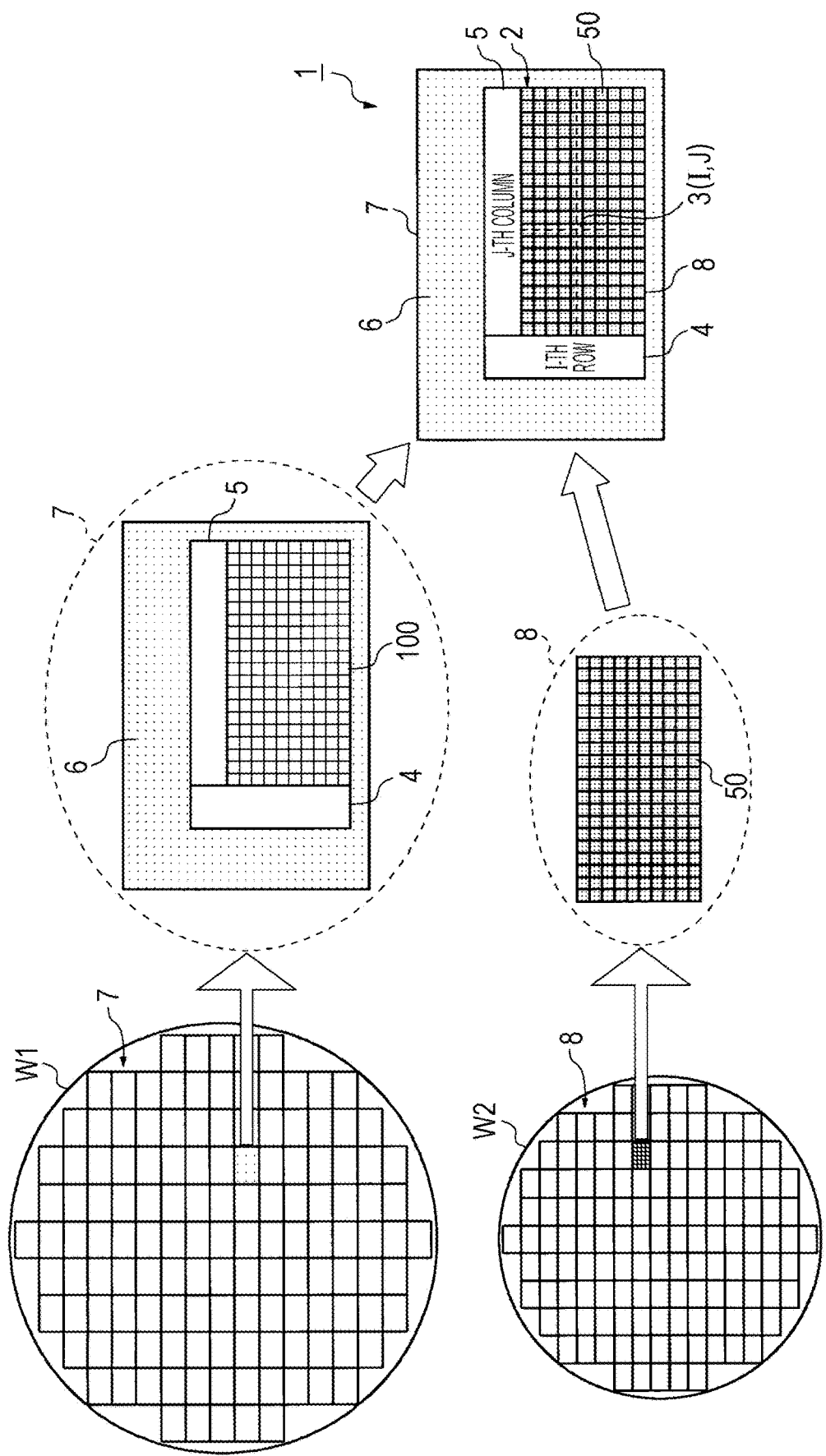
FIG. 1 is a schematic diagram for explaining a configuration of an LED display chip.

Hereinafter, an embodiment of the present invention will be described with reference to toe drawings, taking an example of an LED display chip 1 on which a light emitting diode (LED) is mounted as a 11 source. The LED display chip 1 is an example of an image-forming element that includes a plurality of pixels 3 and forms an image by projecting and displaying light emitted from the pixels 3 on a projection surface (not illustrated). In the following description, in a case where the LED display chip 1 emits monochrome light, a light emitting element 10 refers to an entire light emitting portion of each pixel 3, and in a case where the LED display chip 1 emits color light, a light emitting element 10 refers to a light emitting portion of each color of the pixels 3. In addition, a state in which a single LED or a plurality of integrated LEDs are separated from adjacent LEDs is referred to as segmentation. The LED and the LED chip refer to a light source configured with a compound semiconductor layer 31, electrodes 40 and 41, and the like to be described later, and do not include a wavelength conversion layer 62 that converts the light emitted from the LED or the LED chip into light having a different wavelength. In addition, in a configuration in which the wavelength conversion layer 62 is provided in the LED or the LED chip, the light emitting element 10 refers to an element including the LED or the LED chip and the wavelength conversion layer 62. Here, in a configuration in which the wavelength conversion layer 62 that converts the light emitted from the LED into light having a different wavelength is not provided in the LED or the LED chip, the light emitting element 10 refers to the LED itself or the LED chip itself.

First Embodiment

In the present embodiment, a color image is displayed using three kinds of LED display chips 1. Each LED display chip 1 emits monochrome light of each of red (R), green (G), and blue (B). A color image is formed by superimposing light emitting images projected from the LED display chips 1R, 1G, and 1B. For example, a red LED chip including an AlInGaP-based red LED is mounted on a red light emitting element 11 of the LED display chip 1R for displaying red. For example, a green LED chip including an InGaN-based green LED is mounted on a green light emitting element 12 of the LED display chip 1G for displaying green. For example, a blue LED chip 50 including an InGaN-based blue LED is mounted on a blue light emitting element 13 of the LED display chip 1B for displaying blue. The red LED, the green LED, and the blue LED are compound semiconductor light emitting diodes that emit monochrome light of each of red (R), green (G), and blue (B). In the following description, the red light emitting element 11, the green light emitting element 12, and the blue light emitting element 13 are simply referred to as the light emitting element 10 when the light emitting elements are collectively referred to. The LED display chip 1 is capable of brightly playing an image, and thus the LED display chip 1 is suitable for large-screen projection display.

Hereinafter, a configuration of the LED display chip 1 will be described taking an example of the LED display chip 1B for displaying blue. The configurations of the LED display chip 1R for displaying red and the LED display chip 1G for displaying green are the same, and thus descriptions thereof will be omitted.

FIG. 1 is a schematic diagram for explaining a configuration of the LED display chip 1B. As illustrated in a right portion of FIG. 1, the LED display chip 1B includes an LSI 7 and a light emitting array 8 provided in a pixel array 2 including a plurality of pixels 3.

In the right portion of FIG. 1, a configuration example of the LED display chip 1B is schematically illustrated. In addition, a configuration example of the LSI 7 is schematically illustrated in an upper center portion of FIG. 1, and a plan view illustrating an example of a silicon wafer W1 on which the LSI 7 is monolithically formed is illustrated in an upper left portion of FIG. 1. In addition, a configuration example of the light emitting array 8 is schematically illustrated in a lower center portion of FIG. 1, and a plan view illustrating an example of a sapphire wafer W2 on which the light emitting array 8 is formed is illustrated in a lower left portion of FIG. 1.

Figure 2:
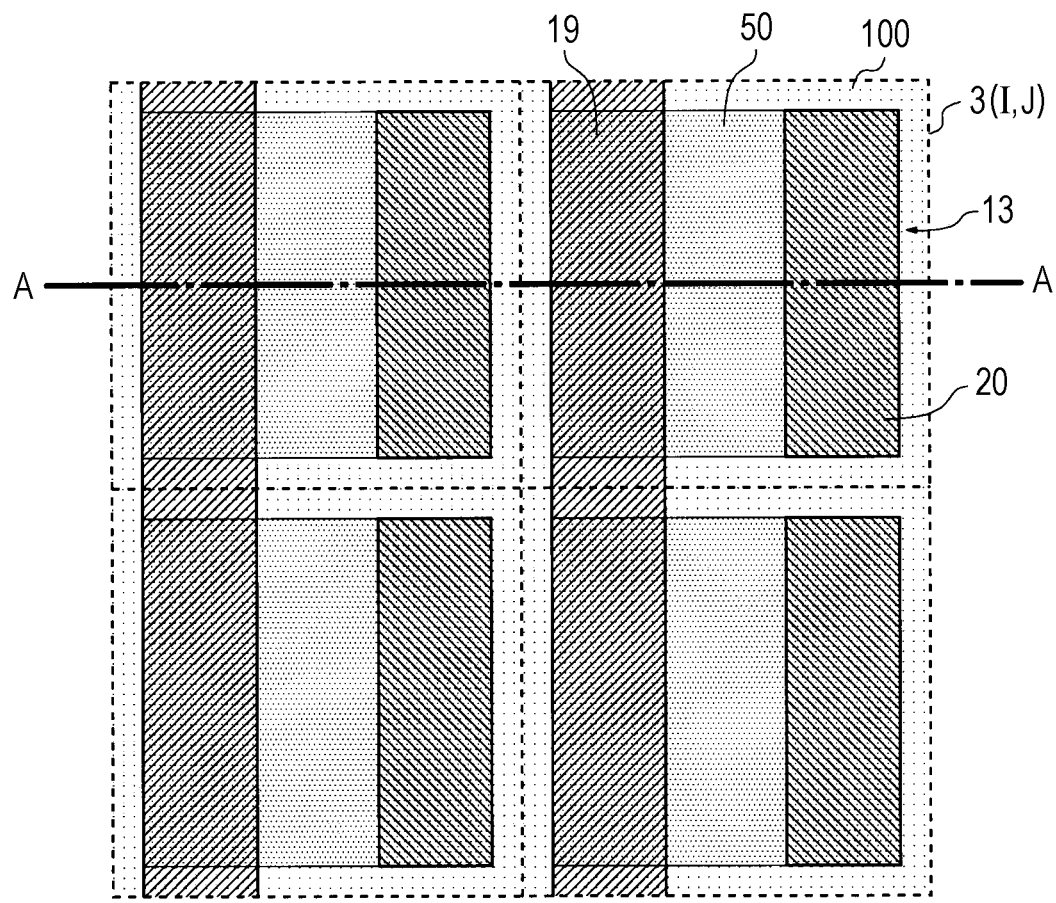
FIG. 2 is a perspective top view of a pixel according to a first embodiment.
Figure 3:
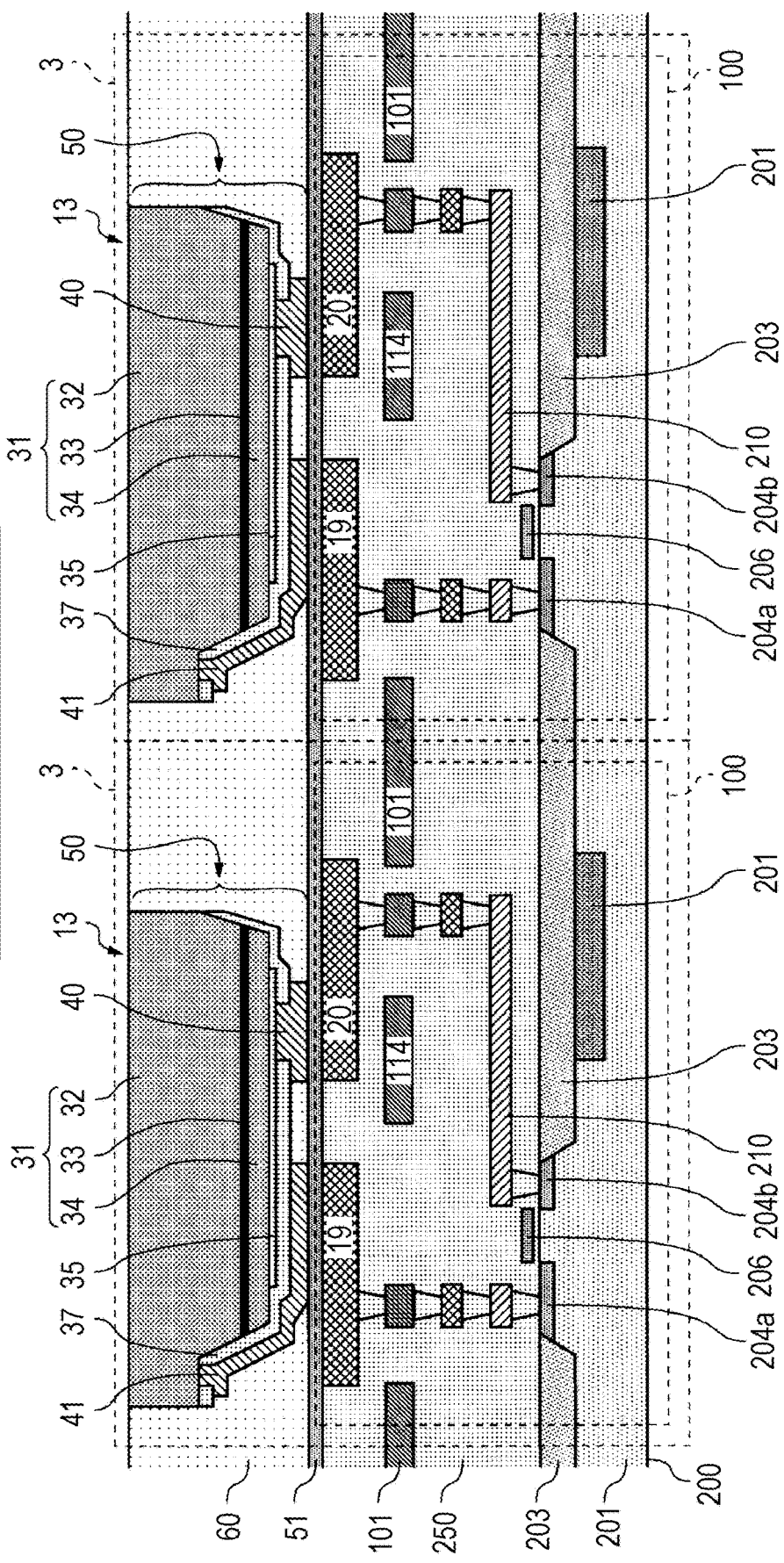
FIG. 3 is a sectional view illustrating a configuration example of the pixel according to the first embodiment.

In addition, FIG. 2 is a perspective top view of the pixel 3 according to the first embodiment. FIG. 3 is a sectional view illustrating a configuration example of the pixel 3 according to the first embodiment. FIG. 3 illustrates a sectional structure of the pixel 3 taken along an one-dot chain line A-A of FIG. 2.

The pixel array 2 is configured with total N×M pixels 3, which are two-dimensionally disposed in N rows and M columns. In the following, the pixel in an I-th row and a J-th column is represented by the pixel 3 (I, J). Both of N and M are positive integers, I is a positive integer of one or more and N or less, and J is a positive integer of one or more and M or less. For example, in a case of a full high vision standard display, N=1080 and M=1920, and the number of pixels 3 is approximately two millions. Each pixel 3 Includes a plurality of blue LED chips 50 or a single blue LED chip 50, the blue LED chip 50 being a self light emitting element.

The LSI 7 is a light emission control unit which can be formed by a general CMOS process and controls light emission by supplying power to the light emitting array 8. As illustrated in the upper left portion of FIG. 1, the LSI 7 is manufactured by monolithically forming various circuits for projecting and displaying an image on a silicon wafer in and dividing the silicon wafer W1 into individual units. As illustrated in the upper center portion of FIG. 1, the LSI 7 includes the various circuits, that is, a plurality of pixel drive circuits 100, a row selection circuit 4, a column signal output circuit 5, and an image processing circuit 6.

The pixel drive circuits 100 are provided in a two-dimensional array of N rows and M columns corresponding to each pixel 3. The pixel drive circuit 100 drives a blue LED (in this example, the blue chip 50) disposed on the pixel drive circuit 100 to emit light by supplying a drive current (to be described later) to the blue LED. The row selection circuit 4 selects an I-th row in which the pixel 3 (I, J) to be caused to emit light in the pixel array 2 is arranged based on image data. The column signal output circuit 5 controls light emission of the pixel 3 (I, J) in the selected i-th row based on the image data. The image processing circuit 6 controls the row selection circuit 4 and the column signal output circuit 5 based on the image data.

As illustrated in FIG. 3, the pixel drive circuit 100 is configured with various circuits monolithically formed on the silicon wafer 1 and wiring layers formed on the silicon wafer W1, and is formed by, for example, a CMOS process. At the uppermost portion of the pixel drive circuit 100, an N-side common electrode 19 and a P-side individual electrode 20, which are electrically connected to the blue LED chip 50, are provided on a mounting surface of the blue LED chip 50. The N-side common electrode 19 is a common electrode that is provided for each column of the pixels 3 two-dimensionally disposed and is electrically connected to an N-side electrode 41 to be described of the blue LED chip 50 of each of the pixels 3 arranged in a column direction. The P-side individual electrode 20 is provided for each pixel 3, and is electrically connected to a P-side electrode 40 to be described of the blue LED chip 50. The pixel drive circuit 100 drives the pixel 3 (I, J) to emit light by supplying the drive current 54 to the blue LED chip 50 of the pixel 3 (I, J) in the I-th row selected by the row selection circuit 4 according to a signal output from the column signal output circuit 5. A more detailed configuration of the pixel drive circuit 100 be described later.

The light, emitting array 8 is configured with a plurality of light emitting elements 10 (in this example, the blue LED chips 50) two-dimensionally disposed in N rows and N columns corresponding to each pixel 3. As illustrated in FIG. 3, the blue LED chip 50 includes a compound semiconductor layer 31, a transparent conductive film 35, a protection film 37, a P-side electrode 40, and an N-side electrode 41. The compound semiconductor layer 31 includes an N-side epitaxial layer 32, a light emitting layer 33, and a P-side epitaxial layer 34, and these layers 32 to 34 are stacked in this order. A more detailed configuration of the blue LED chip 50 will be described later.

In FIG. 3, the blue LED chip 50 is a blue LED which is segmented for each pixel 3. By the segmentation, light leakage to the adjacent blue LED chips 50 can be minimized, and contrast of the image projected by the LED display chip 1 can be enhanced. In addition, it, is also possible to suppress or prevent a problem such as misalignment between the blue LED chip 50 and the LSI 7 due to a difference in thermal expansion coefficient between the compound semiconductor layer 31 of the blue LED chip 50 and the silicon wafer 1 on which the LSI 7 is monolithically formed. Further, the blue LED chip 50 includes a cathode (N-side electrode 41) and an anode (P-side electrode 40). The cathode and the anode are respectively connected to the N-side common electrode 19 and the P-side individual electrode 20 of the pixel drive circuit 100 in the same manner. The P-side electrode 40 and the N-side electrode 41 are power supply electrodes provided on the same main surface. Therefore, a light emission test is performed when the blue LED chip 50 is connected to the pixel drive circuit 100, and in a case where defective emission is found, the blue LED chip 56 with defective light emission can be removed and replaced with a normal blue LED chip 55 (refer to FIGS. 9A to 9I to be described).

In addition, in a step of forming the segmented blue LED chips 50 (refer to FIGS. 7A to 7I to be described), preferably, the segmented blue LED chips 50 are collectively formed on a sapphire substrate 30 in a state of being two-dimensionally arranged in N rows and N columns corresponding to the pixels 3. In this manner, a variation in element characteristics between the blue LED chips 50 can be reduced, and thus uniformity of the image can be improved. In addition, when the light emitting array 8 is adhered to the LSI 7, the blue LED chips 50 can be collectively provided on the pixel drive circuits 100, and thus the step can be performed very simply.

A certain distance is required in a space between the adjacent blue LED chips 50 (for example, a separation groove 42 in FIG. 8 to be described). The reason is that, for example, in a case of performing an operation of removing the blue LED chip 50 with defective light emission from the pixel drive circuit 100, a space for inserting a tip of a micromanipulator is required. In addition, in order to suppress or prevent a decrease of contrast of the image and to reduce a loss of light, it is preferable to fill the space between the adjacent blue LED chips 50 with a material having a high reflection property and a low light absorption property (for example, light-shielding reflection layer 60 in FIG. 3). On the other hand, when the space between the adjacent blue LED chips 50 is increased focusing on these conditions, a light emitting region of each pixel 3 is reduced. As a result, light emission efficiency of the blue LED chip 50 is reduced, and this causes an increase in power consumption of the blue LED chip 50. Both of the conflicting requirements can be satisfied by setting an area occupation ratio of the blue LED chip 50 with respect to a region area of the pixel 3 to 15% or more and 85% or less.

Figure 10:
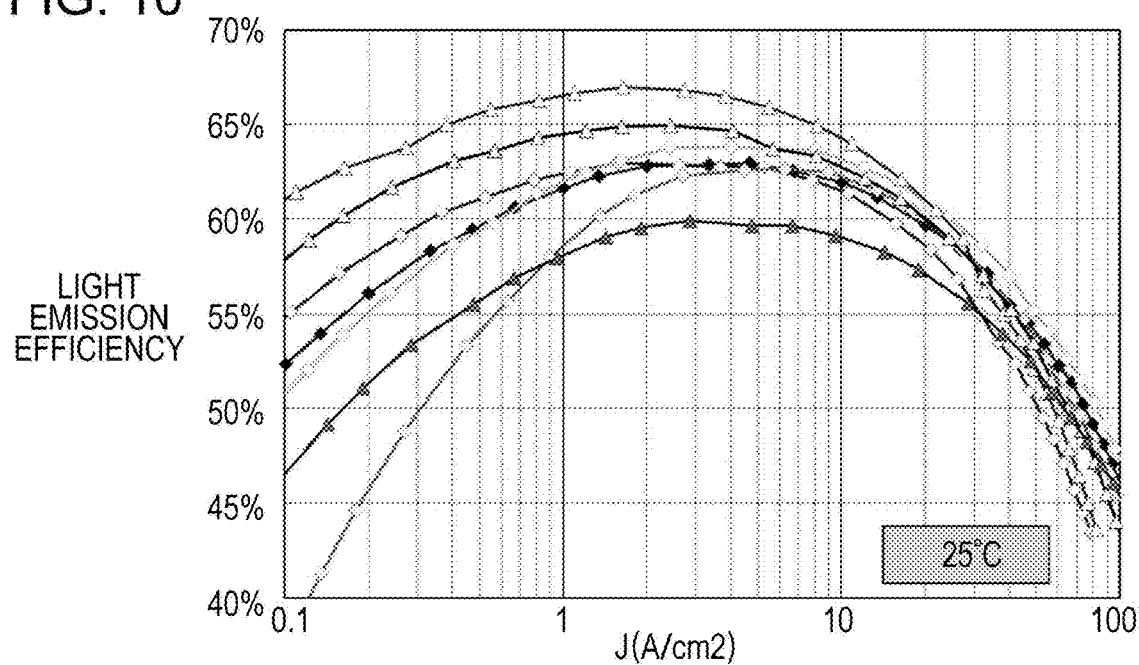
FIG. 10 is a graph illustrating current dependence of light emission efficiency of the clue LED chips having various shapes which are manufactured by different makers.

In addition, the light emission efficiency of the blue LED chip 50 becomes a maximum value in a case where current density of the drive current 54 is within a range of 1 $[A/cm^2]$ to 10 $[A/cm^2]$ (refer to FIG. 10 to be described). In order to suppress a decreasing rate of the light emission efficiency within 20% of the maximum value, the current density is to be suppressed to approximately 50 $[A/cm^2]$ or less. Further, in order to suppress the decreasing rate of the light emission efficiency within 10% of the maximum value, the current density is to be suppressed to approximately 20 $[A/cm^2]$ at the maximum. In order to output a light flux with maximum luminance of, for example, 2000 [lm] (lumen), in the blue LED display chip 1B having the lowest relative luminous efficiency, it is necessary to supply the drive current 54 of approximately 12 [μA] per one pixel to the blue LED chip 50. For example, in the blue LED chip 50 illustrated in FIG. 8 to be described, the current density is approximately 21 $[A/cm^2]$. Therefore, when current injection density into the light emitting layer 33 (to be described) of the blue LED chip 50 increases, the light emission efficiency of the blue LED chip 50 decreases and the current density further increases, resulting in a vicious circle. Thus, in order to decrease the current density, it is important to increase an area of a current injection region. A region into which the current can be injected corresponds to a mesa portion 36 of FIG. 8 to be described, and thus it is necessary to increase an area of the mesa portion 36. The area of the mesa portion 36 increases or decreases corresponding to an area of the compound semiconductor layer 31, and in principle, can approach the area of the compound semiconductor layer 31 excluding an area of an N-type contact hole 39. Therefore, in the following description, an area occupation ratio of the compound semiconductor layer 31 with respect to the region area of the pixel 3 is considered as an important parameter. The consideration is based on a premise that the shortest distance from an end portion of the transparent conductive film 35 to an end portion of the mesa portion 36 is as short as approximately 1 [μm] or less. The drive current 54 once flows through the transparent conductive film 35 to the P-side epitaxial layer 34. On the other hand, when the shortest distance from the end portion of the transparent conductive film 35 to the end portion of the mesa portion 36 is long, a voltage drop in the P-side epitaxial layer 34 is large, and the current is not injected into the end portion of the mesa portion 36.

The N-side electrode 41 and the P-side electrode 40 of the blue LED chip 50 are respectively connected to the N-side common electrode 19 and the P-side individual electrode 20 of the pixel drive circuit 100. The N-side electrode 41 and the P-side electrode 40 are formed at the same time in one process, and are connected by the same connection material (for example, refer to FIG. 7E to be described). Preferably, the N-side electrode 41 and the P-side electrode 40 are connected to each other via an anisotropic conductive film 51 As the anisotropic conductive film 51, for example, a resin adhesive layer in which conductive particles are dispersed can be used. In a pressurized and adhered portion of the anisotropic conductive film 51, a conductive path can be formed by proximity and mutual contact between the conductive particles. On the other hand, in a non-pressurized and non-adhered portion of the anisotropic conductive film 51, a conductive path is not formed, and electrical insulation is maintained. That is, the anisotropic conductive film 51 can be conducted by pressurization in a film thickness direction, and can be insulated in a film direction (a direction on a plane perpendicular to the film thickness direction). According to anisotropy of the anisotropic conductive film 51, there is no need to individually form a connection film on the N-side common electrode 19 and the P-side individual electrode 20. Therefore, the anisotropic conductive film 51 may be formed over an entire region of the pixel array 2. After the anisotropic conductive film 51 is formed, the plurality of blue LED chips 50 of the light emitting array 8 are collectively adhered to the pixel array 2. At this time, in a state where the blue LED chips 50 are formed on the sapphire substrate 30, the blue LED chips 50 are adhered to the LSI 7 on which the pixel drive circuits 100 are formed, and then the sapphire substrate 30 may be peeled off by a laser lift-off process. Conversely, after the blue LED chips 50 are adhered to a substrate for peeling in advance, the sapphire substrate 30 is peeled off by the laser lift-off, and then the blue LED chips 50 may be transferred to a transfer substrate 45 and be adhered to the LSI 7.

Preferably, the light emitting array 8 is tested before being fired while being pressurized. This is because, after firing the blue LED chip 50, when the blue LED chip 50 with defective light emission is found, it is difficult to repair the blue LED chip 50 with defective light emission. Therefore, after the blue LED chips 50 are adhered onto the anisotropic conductive film 51, when the anisotropic conductive film 51 becomes a conduction state by temporary pressurization, a light emission test of each blue LED chip 50 is performed. In a case where the blue LED chip 50 with defective light emission is detected, the blue LED chip 50 with defective light emission is removed by a micromanipulator needle 57, and a normal blue LED chip 50 is provided. In the following description, a reference numeral 55 is given to a normal LED chip, and a reference numeral 56 is given to a defective LED chip. A normal operation is confirmed after the replacement, and the light emitting array 8 is fired while being pressurized. Then, the step of adhering the light emitting array 8 is completed (refer to FIGS. 9A to 9I to be described).

A light-shielding reflection layer 60 is provided between the blue LED chips 50 (refer to FIG. 3). The light-shielding reflection layer 60 can suppress or prevent light leakage to the adjacent blue LED chips 50, and thus it is possible to prevent a decrease of contrast of the image. The light-shielding reflection layer 60 can be filled, for example, using a composite material in which white pigments are mixed with a silicone resin.

Next, a specific configuration example of the LED display chip 1B for displaying blue will be described. Each pixel 3 has a size of, for example, 10 [μm]×10 [μm], and the number of effective pixels is, for example, 480×640 (VGA standard). An effective portion of the pixel array 2 has a size of, for example, 4.8 [mm]×6.4 [mm]. The entire LED display chip 1B has a chip size of, for example, 8 [mm]×10 [mm] including the row selection circuit 4, the column signal output circuit 5, and the image processing circuit 6.

Figure 4:
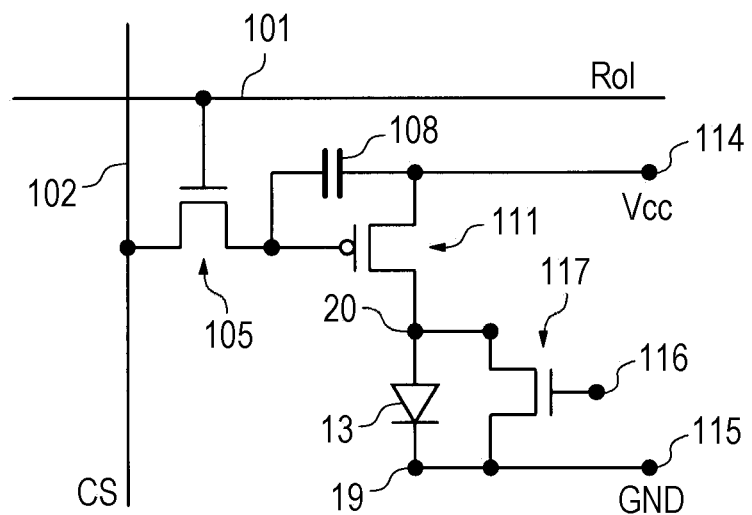
FIG. 4 is an equivalent circuit diagram illustrating a configuration example of a pixel drive circuit according to the first embodiment.

First, the pixel drive circuit 100 will be described in more detail. FIG. 4 is an equivalent circuit diagram illustrating a configuration example of the pixel drive circuit 100 according to the first embodiment. As illustrated in FIG. 4, the pixel drive circuit 100 includes a selection transistor 105, a holding capacitor 108, a driving transistor 111, and a test transistor 117. These components are monolithically formed on the silicon wafer 1 when the LSI 7 is manufactured. The selection transistor 105 is, for example, an N-type MOS transistor, and a gate terminal of the selection transistor 105 is connected to a row selection line (RoI) 101. In addition, a source terminal of the selection transistor 105 is connected to a column signal line (CS) 102, and a drain terminal of the selection transistor 105 is connected to one end of the holding capacitor 108 and a gate terminal of the driving transistor 111. The other end of the holding capacitor 108 is connected to a source terminal of the driving transistor 111 and a power supply line (Vcc) 114. The driving transistor 111 is, for example, a P-type MOS transistor, and a drain terminal of the driving transistor 111 is connected to the P-side individual electrode 20. An anode terminal of the blue light emitting element 13 (in this example, the blue LED chip 50) and a source terminal of the test transistor 117 are connected to the P-side individual electrode 20 in parallel. A gate terminal of the test transistor 117 is connected to a test signal line (TE) 116. Both of a cathode terminal of the blue light emitting element 13 and a drain terminal of the test transistor 117 are connected to a ground line (GND) 115. A circuit configuration of the pixel drive circuit Ton is not limited to the configuration illustrated in FIG. 4, and various well-known circuit configurations can be used.

When an I-th row of the pixel array 2 is selected, the row selection line (RoI) 101 of the I-th row is activated. At this time, in the pixel 3 (I, J), the selection transistor 105 transitions to an ON state, a column signal is applied from the column signal line (CS) 102 to the gate terminal of the driving transistor 111, and the drive current 54 flows through the blue light emitting element 13 from the power supply line (Vcc) 114. When a selection period of the I-th row ends and thus the selection transistor 105 transitions to an OFF state, a potential of the gate terminal of the driving transistor 111 is held by the holding capacitor 108. Therefore, the drive current 54 continues to flow through the blue light, emitting element 13 during a period from the end of the selection period to selection of the next I-th row.

In addition, the test transistor 117 is a switch circuit that selectively short-circuits an electrical connection between the P-side individual electrode 20 and the N-side common electrode 19, and is provided so as to test, for example, whether or not the pixel drive circuit 100 operates normally and whether or not outputs of the row selection circuit 4 and the column signal output circuit 5 are normal. The reason is as follows.

First, the blue light emitting element 13 should be provided only on the non-defective LSI 7. For this reason, before connecting the emitting array 8 to the LSI 7 (refer to the upper left portion of FIG. 1) cut out from the semiconductor substrate (for example, the silicon wafer W1), it is necessary to screen the non-defective LSI 7 by testing the LSI 7. At this time, a function of a portion which is not related to the pixel drive circuit 100 can be tested by a general circuit test technique. Here, in the pixel drive circuit 100 without the test transistor 117, before connecting the blue light emitting element 13 to the pixel drive circuit 100, a current cannot flow through the pixel 3, and as a result, it is difficult to test the LSI 7. For this reason, the test transistor 117 is formed in each pixel drive circuit 100.

When testing the pixel drive circuit 100, the test transistor 117 transitions to an ON state. In this case, since the N-side common electrode 19 and the P-side Individual electrode 20 are short-circuited, the drive current 54 flowing from the power supply line (Vcc) 114 to the blue light emitting element 13 can be measured. Thus, it is possible to detect almost all defects in the LSI 7 including defects of the pixels 3. In FIGS. 2 and 3, although the N-side common electrode 19 and the P-side individual electrode 20 are provided for each pixel, the N-side common electrode 19 can be shared by a plurality of pixels. For this reason, it is also necessary to test the drive circuit of the pixel without the N-side common electrode 19. In this case, in a test mode in which the test transistor 117 transitions to an ON state, the test transistor 117 may be disposed such that the P-side individual electrode 20 is directly connected to a wiring connected to the N-side common electrode 19. In a case where it is difficult to connect the P-side individual electrode 20 to the wiring connected to the N-side common electrode 19 in a layout design, the P-side individual electrode 20 may be directly connected to the GND wiring. This configuration can be also applied to a case where the light emitting element is configured with a so-called vertical electrode chip interposed between the N-side electrode and the P-side electrode, and where only one electrode of each light emitting element is directly connected to the pixel drive circuit.

Figure 6B:
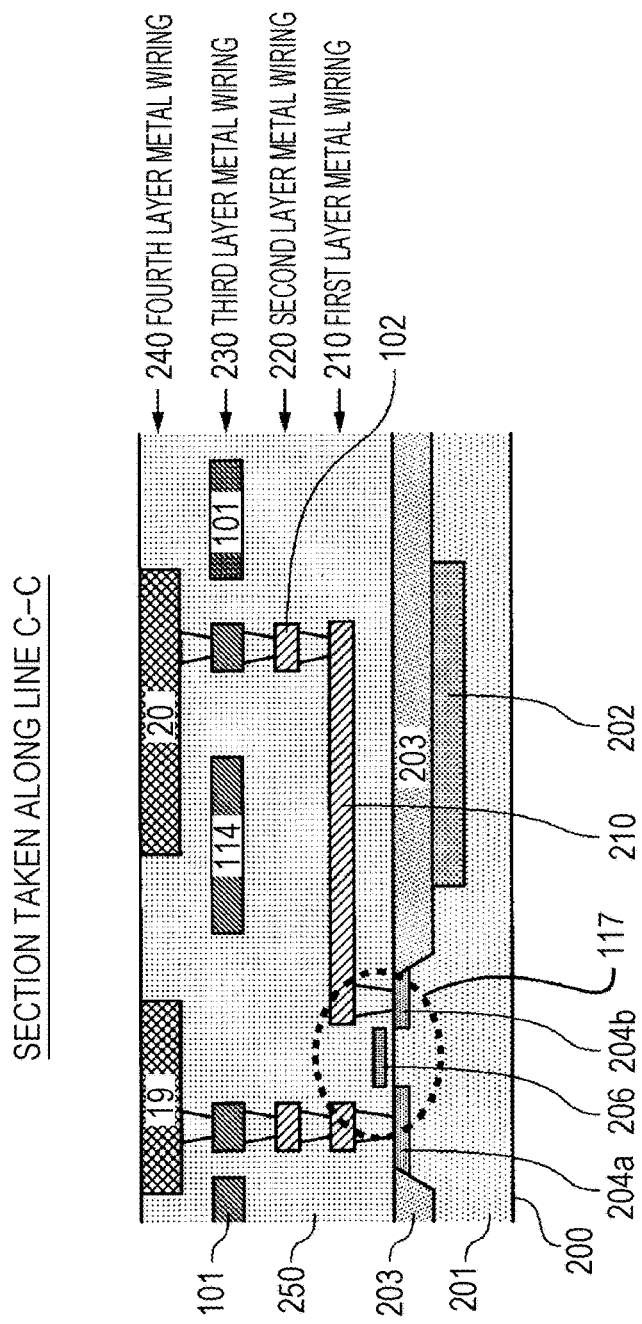
FIG. 6B is a sectional view illustrating a sectional structure taken along an one-dot chain line C-C.

Next, a case where the configuration of the pixel drive circuit 100 is realized by a four-layer wiring process will be described as an example. FIG. 5 is a perspective plan view illustrating an example of a pattern layout of the pixel drive circuit 100. In addition, FIGS. 6A and 6B are sectional structure diagrams of the pixel drive circuit 100. FIG. 6A illustrates a sectional structure taken along an one-dot chain line B-B of FIG. 5. FIG. 6B illustrates a sectional structure taken along an one-dot chain line C-C of FIG. 5. In the drawings, wiring layers are referred to as a first layer metal wiring 210 to a fourth layer metal wiring 240 in order from the lowest layer (that is, a layer farthest from a front surface) to the uppermost layer (that is, a layer farthest from the front surface).

The fourth layer metal wiring 240 (uppermost layer) is configured to include the N-side common electrode 19 and the P-side individual electrode 20 which are electrically connected to the blue LED chip 50. An upper surface of the fourth layer metal wiring 240 is exposed on the same surface as an upper surface of the pixel drive circuit 100. Thus, the upper surface of the pixel drive circuit 100 is a flat surface. The third layer metal wiring 230 is configured to include the row selection line (RoI) 101 and the power supply line (Vcc) 114. The second layer metal wiring 220 is configured to include the column signal line (CS) 102, the ground line (GND) 115, and the test signal line (TE) 116. The first layer metal wiring 210 (lowest layer) is configured to include a plurality of local wirings in the pixel 3. In the first layer metal wiring 210 to the fourth layer metal wiring 240, the wirings are separated from each other by an interlayer insulating layer 250 formed, for example, using $SiO_2$.

In addition, a gate poly-Si layer 206 formed between the first layer metal wiring 210 and a P-well layer 201 functions as the selection transistor 105 (N-type MOS transistor), a gate electrode of the driving transistor 111 (P-type MOS transistor), and one electrode of the holding capacitor 108.

In addition, an N-well layer 202, a shallow trench isolation (STI) layer 203, and N+ diffusion layers 204a and 204b are formed on the P-well layer 201 of the silicon substrate 200. The N-well layer 202 functions as a source electrode of the drying transistor 111 and the other electrode of the holding transistor 108, and a holding capacitance of the holding transistor 108 is formed between the N-well layer 202 and the gate poly-Si layer 206. In addition, a P+ diffusion layer 205 functioning as a drain electrode of the driving transistor 111 is formed on the N-well layer 202. The STI layer 203 has a function of element isolation, and is formed, for example, using $SiO_2$. The N+ diffusion layer 204a functions as a source electrode of the selection transistor 105, and the N+ diffusion layer 204b functions as a drain electrode of the selection transistor 105.

The layers 201 to 205, the gate poly-Si layer 206, and the first layer metal wiring 210 to the fourth layer metal wiring 240 are electrically connected to each other by a contact hole or a via hole. The completed silicon wafer W1 is tested in a state of the wafer before cutting out the LSI 7, and a position of the defective chip is recorded.

Figure 7A:
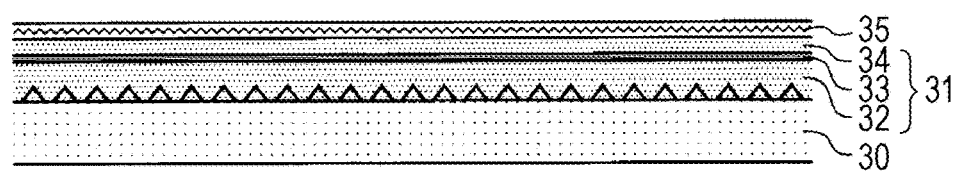
FIG. 7A is a view for explaining a step of epitaxially growing a compound semiconductor layer on a sapphire substrate and forming a transparent conductive film on the compound semiconductor layer.

Next, a manufacturing step of the InGaN-based blue LED chip 50 will be described as an example. FIGS. 7A to 7I are schematic views for explaining a manufacturing step of the blue LED chip 50. FIG. 7A is a view for explaining a step of epitaxially growing the compound semiconductor layer 31 on the sapphire substrate 30 and forming the transparent conductive film 35 on the compound semiconductor layer 31. FIG. 7F is a view for explaining a step of forming the mesa portion 36 on the epitaxial layers. FIG. 7C is a view for explaining a step of forming the protection film 37. FIG. 7D is a view for explaining a step of forming contact holes 38 and 39. FIG. 7E is a view for explaining a step of forming the P-side electrode 40 and the N-side electrode 41. FIG. 7F is a view for explaining a step of forming the separation groove 42. FIG. 7G is a view for explaining a step of adhering the separated blue LED chips 50 to a holding substrate 43. FIG. 7H is a view for explaining a step of separating each blue LED chip 50 from the sapphire substrate 30. FIG. 7I is a view for explaining a step of adhering each blue LED chip 50 to the transfer substrate 45.

As illustrated in FIG. 7A, the N-side epitaxial layer 32, the light emitting layer 33, and the P-side epitaxial layer 34 are epitaxially grown using an MOCVD apparatus in this order on a main surface of the sapphire substrate 30 (for example, a sapphire substrate having a diameter of four inch) on which an uneven pattern is formed, and thereby forming the compound semiconductor layer 31. The N-side epitaxial layer 32 has a complex multilayer structure (not illustrated) including an N-side buffer layer configured with a multilayer film including, for example, a buffer layer, an undoped GaN layer, an N-type contact layer (n-GaN layer), a superlattice layer, and the like. The light emitting layer 33 is, for example, a multiple-quantum well layer in which a quantum well layer (not illustrated) made of InGaN and a barrier layer (not illustrated) made of GaN are repeatedly stacked. The P-side epitaxial layer 34 has a multilayer structure (not illustrated) including, for example, a GaN layer, a p-type AlGaN layer, a p-type GaN layer, a p-type contact layer (p-GaN), and the like. After the compound semiconductor layer 31 is formed, the transparent conductive film 35 is formed on the P-side epitaxial layer 34 using a transparent conductive material such as ITO.

Although an area occupied by the blue LED chip 50 is relatively small, electric resistance of the P-side epitaxial layer 34 is still high to inject a current into an entire region of the P-side epitaxial layer 34. In addition, when the P-side electrode 40 and the N-side electrode 41 which are made of a metal material are directly stacked on the P-type epitaxial layer 34, reflectance at an interface between the P-side electrode 40 and the N-side electrode 41 and the P-type epitaxial layer 34 made of GaN is decreased, and this causes a decrease in light extraction efficiency. For this reason, it is preferable to form the transparent conductive film 35 and the protection film 37 to be described between the P-type epitaxial layer 34 and the P-side electrode 40 and between the P-type epitaxial layer 34 and the N-side electrode 41 such that the P-type epitaxial layer 34 is separated from the P-side electrode 40 and the N-side electrode 41. Thereby, the shortest distance between the P-type epitaxial layer 34 and the P-side electrode 40 and the shortest distance between the P-type epitaxial layer 34 and the N-side electrode 41 are lengthened.

Figure 7B:
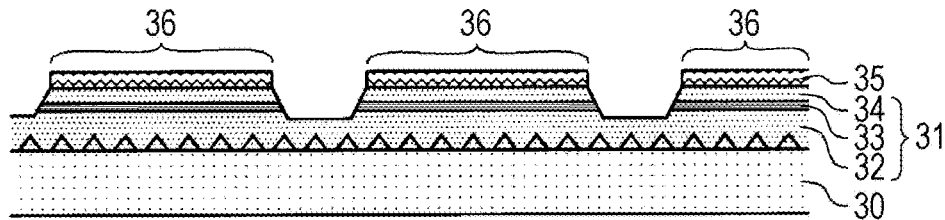
FIG. 7B is a view for explaining a step of forming a mesa portion on an epitaxial layer.
Figure 7C:
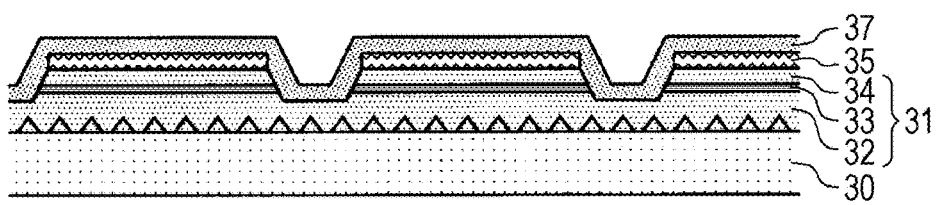
FIG. 7C is a view for explaining a step of forming a protection film.
Figure 7D:
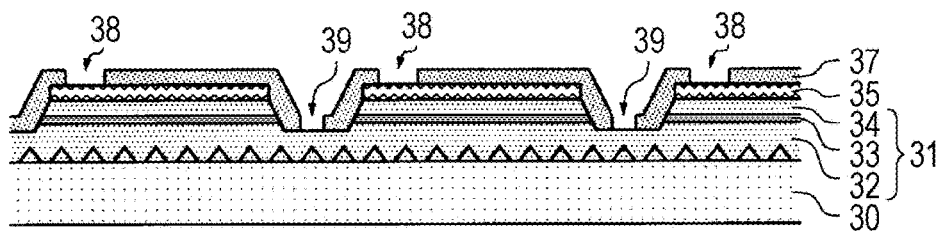
FIG. 7D is a view for explaining a step of forming each contact hole.
Figure 7E:
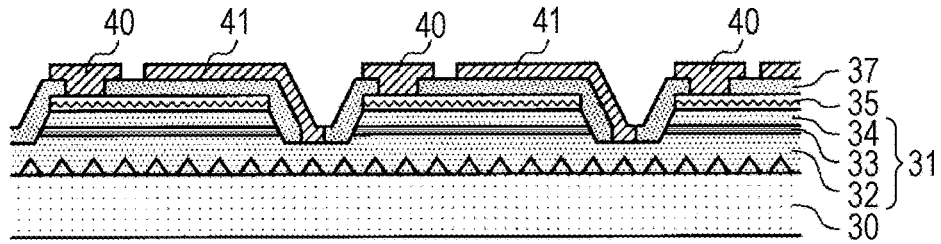
FIG. 7E is a view for explaining a step of forming a P-side electrode and an N-side electrode.
Figure 7F:
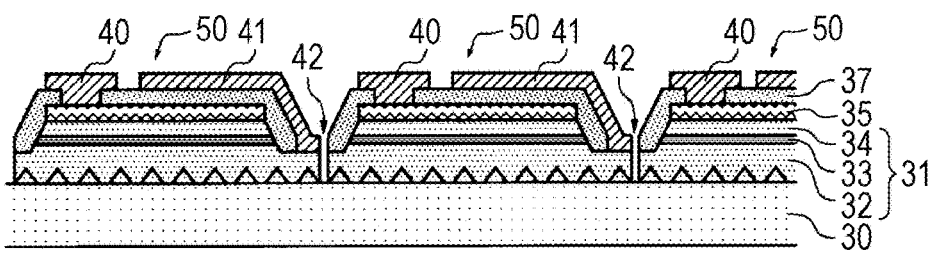
FIG. 7F is a view for explaining a step of forming a separation groove.
Figure 7G:
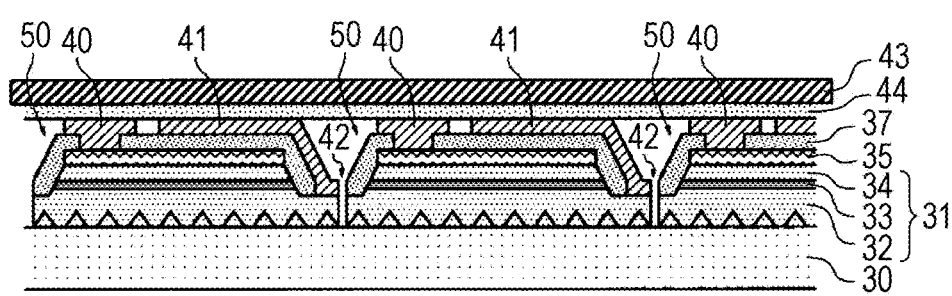
FIG. 7G is a view for explaining a step of adhering separated blue LED chips to a holding substrate.
Figure 7H:
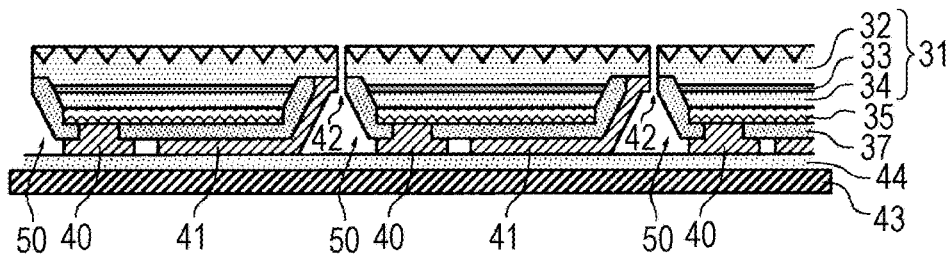
FIG. 7H is a view for explaining a step of separating each blue LED chip from a sapphire substrate.
Figure 7I:
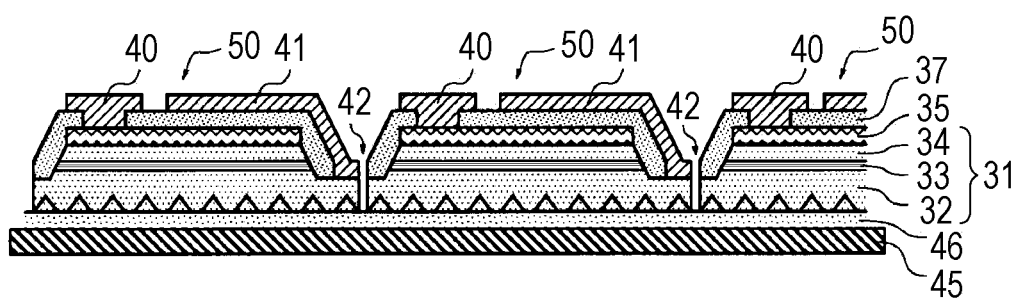
FIG. 7I is a view for explaining a step of adhering each blue LED chip to a transfer substrate.

As illustrated in FIG. 7B, the transparent conductive film 35 is patterned. Thereafter, a portion of the P-side epitaxial layer 34, a portion of the light emitting layer 33, and a portion of the N-side epitaxial layer 32 are removed by etching, and thus the mesa portion 36 is formed on the compound semiconductor layer 31.

As illustrated in FIG. 7C, the protection film 37 is formed on an exposed surface of the compound semiconductor layer 31 and an entire region of a front surface of the patterned transparent conductive film 35, for example, using $SiO_2$. At this time, the protection film 37 also covers a side wall portion of the mesa portion 36. Therefore, the protection film 37 can prevent light leakage at a PN junction portion of the side wall portion exposed by the formation of the mesa portion 36. Further, the protection film 37 can separate and electrically insulate the transparent conductive film 35 and the N-side electrode 41 from each other.

As illustrated in FIG. 7D, a portion of the protection film 37 formed on the patterned transparent conductive film 35 is removed, and thus P-side contact holes 38 are formed. In addition, a portion of the protection film 37 formed on a bottom surface of a recess portion between the mesa portions 36 is removed, and thus N-side contact holes 39 are formed. The recess portion is a portion obtained by etching and removing of the compound semiconductor layer 31 (refer to FIG. 7B).

As illustrated in FIG. 7E, an electrode film having a multilayer structure such as Al/Ni/Pt/Ni/Au is formed on the protection film 37 and the contact holes 38 and 39 by a vapor deposition method or the like. Then, a portion of the electrode film is removed, and thus the P-side electrode 40 and the N-side electrode 41 are formed. In the mesa portion 36, an upper surface of the P-side electrode 40 has the same height as an upper surface of the N-side electrode 41. The upper surfaces of the electrodes 40 and 41 are on the same surface, and thus this makes it easy to perform a step of adhering the light emitting array 8 onto the LSI 7 that is to be described.

As illustrated in FIG. 7F, in order to separate the blue LED chips 50 from each other, separation grooves 42 reaching the front surface of the sapphire substrate 30 are formed on the bottom surface of the recess portion between the mesa portions 36. Thereafter, the sapphire substrate 30 is further polished to be thin, and is cut into units of the light emitting array 8 (refer to the lower left portion of FIG. 1). A thickness of the polished sapphire substrate 30 is approximately 30 [μm] to approximately 200 [μm]. In addition, the cutting of the sapphire substrate 30 can be performed in the same manner as ordinary LED chip dicing, for example, by laser stealth dicing. In addition, it is preferable to provide a cut groove (not illustrated) for dividing the sapphire substrate 30 separately from the separation groove 42. This makes it possible to suppress or prevent a damage of the light emitting layer 33 caused by laser light applied to a rear surface of the sapphire substrate 30 when cutting the sapphire substrate 30, for example, using laser stealth dicing. According to the step of FIG. 7F, the blue LED chips 50 corresponding to one LED display chip are prepared in a state of being mounted on the sapphire substrate 30 and being divided for each light emitting array 8. The reason why the sapphire substrate 30 is cut and separated into units of the light emitting array 8 is that it is wasteful to connect a plurality of connected groups of the light emitting array to groups of the corresponding LSI 7 at once since the LSI 7 is generally larger than the light emitting array For example, when the sapphire wafer W2 is adhered to the silicon wafer W1, a useless region which is not used should be disposed on the sapphire wafer W2. As a result, it is difficult to efficiently use the sapphire wafer and the epitaxial layers formed on the sapphire wafer. In a case where the LSI 7 can be formed in the same size as the light emitting array 8, the wafers can be adhered to each other one to one. Here, in addition to the pixel drive circuits 100, it is also necessary to mount the row selection circuit 4, the column signal output circuit 5, the image processing circuit 6, and the like on the LSI 7. For this reason, it is difficult to make the LSI 7 have the same size as the light emitting array 8.

As illustrated in FIG. 7G, the P-side electrode 40 and the N-type electrode 41 of each blue LED chip 50 are adhered onto the holding substrate 43 via an adhesive layer 44.

Further, as illustrated in FIG. 7H, in a state where the P-side electrode 40 and the N-type electrode 41 of each blue LED chip 50 are directed in a vertically downward direction, the sapphire substrate 30 is separated from the compound semiconductor layer 31. That is, the sapphire substrate 30 is removed from each blue LED chip 50. The step of FIG. 7H may be performed in a state of FIG. 7G.

As illustrated in FIG. 7I, the rear surface of each blue LED chip 50 (that is, the main surface on the N-side epitaxial layer 32 side) is adhered onto the transfer substrate 45 via an adhesive layer 46. In each blue LED chip 50, the P-side electrode and the N-type electrode 41 are directed in a vertically upward direction, and the light emitting array 8 is ready to be adhered to the LSI 7.

FIG. 8 illustrates an example of the blue LED chip 50 after the processing of FIG. 7I. FIG. 8 is a top view illustrating an example of the blue LED chip 50 provided in the pixel array 2. In a state of FIG. 8, in a case where a width of the separation groove 42 with respect to the size of the pixel 3 (for example, 10 [μm]×10 [μm]) is 1.6 μm, in each blue LED chip 50, the area occupation ratio of the compound semiconductor layer 31 with respect to the region area of the pixel 3 is approximately 71%. In addition, the area occupation ratio of the mesa portion 36 with respect to the region area of the pixel 3 is, for example, 54%.

Next, a method of attaching and electrically connecting the light emitting array 8 to the LSI 7 will be described. The light emitting array 8 is provided only on a non-defective chip portion among chip portions of the LSI 7 formed on the silicon wafer W1.

Figure 9A:
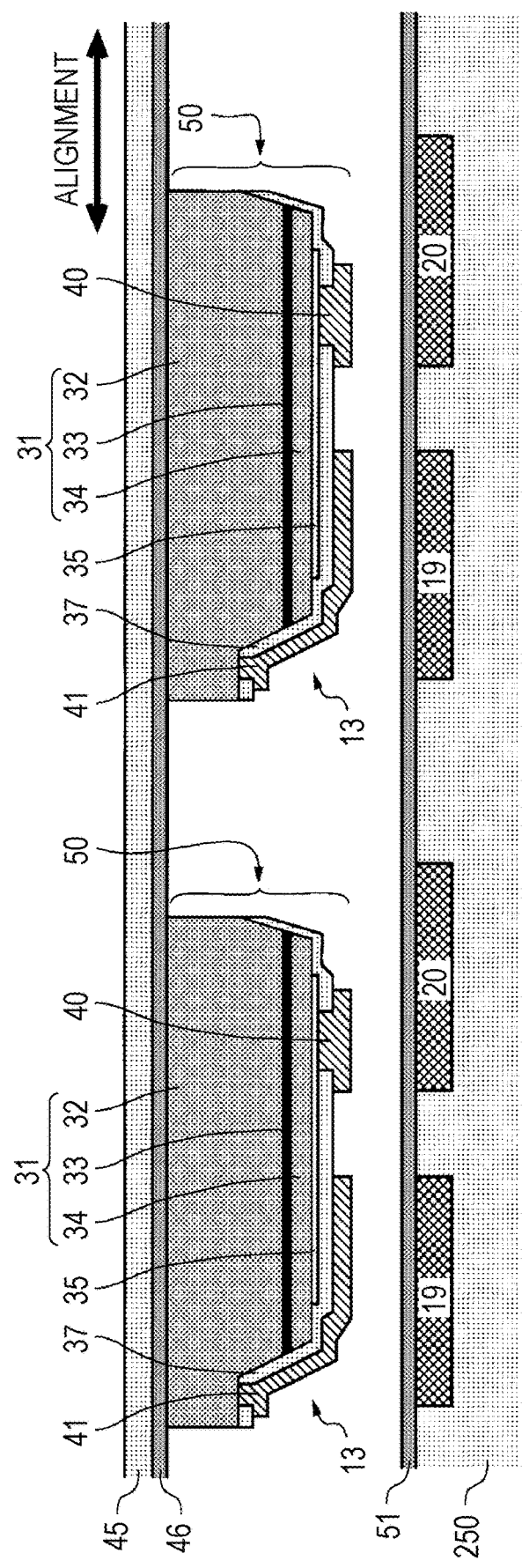
FIG. 9A is a view for explaining a step of mounting a blue LED chip on an image drive circuit.
Figure 9B:
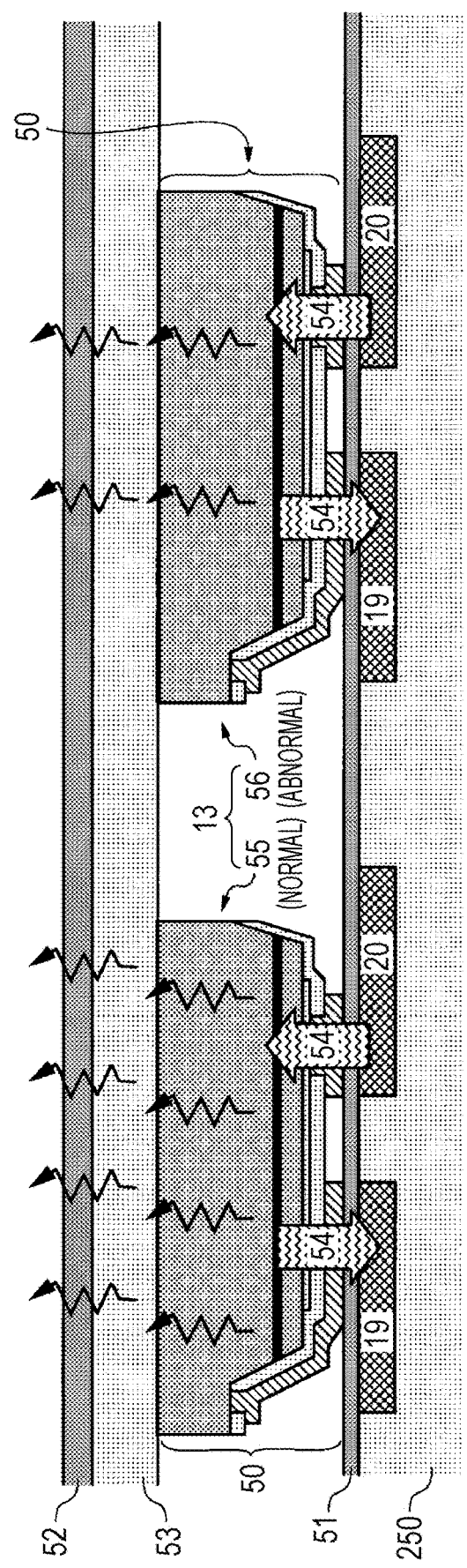
FIG. 9B is a view for explaining a step of performing a light emission test of pixels.
Figure 9E:
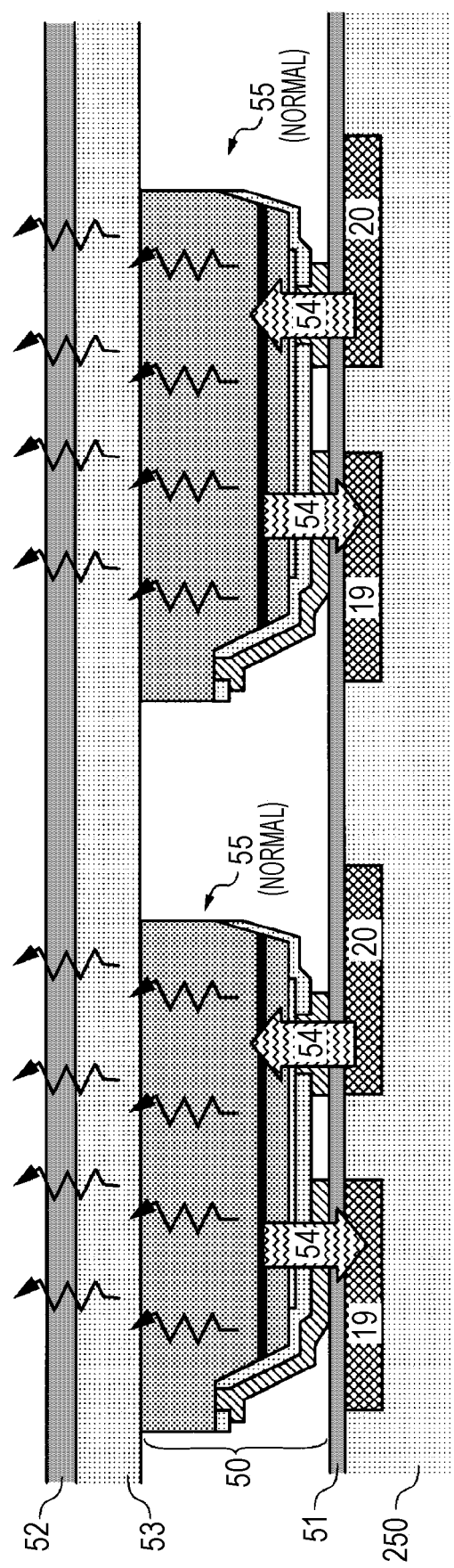
FIG. 9E is a view for explaining a step of performing a Light emission test of pixels again.
Figure 9G:
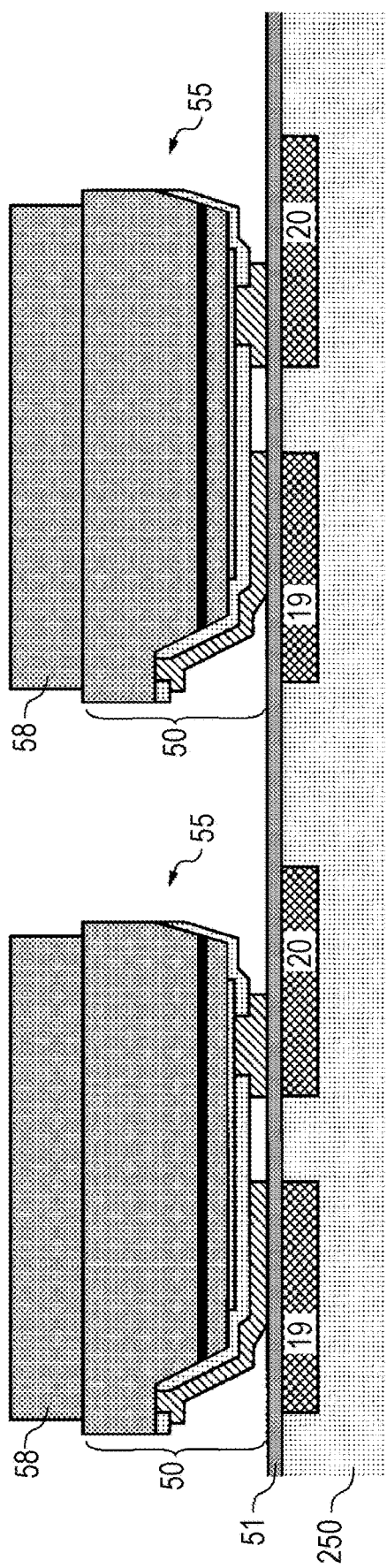
FIG. 9G is a view for explaining a step of forming a resist pattern on the blue LED chip.
Figure 9I:
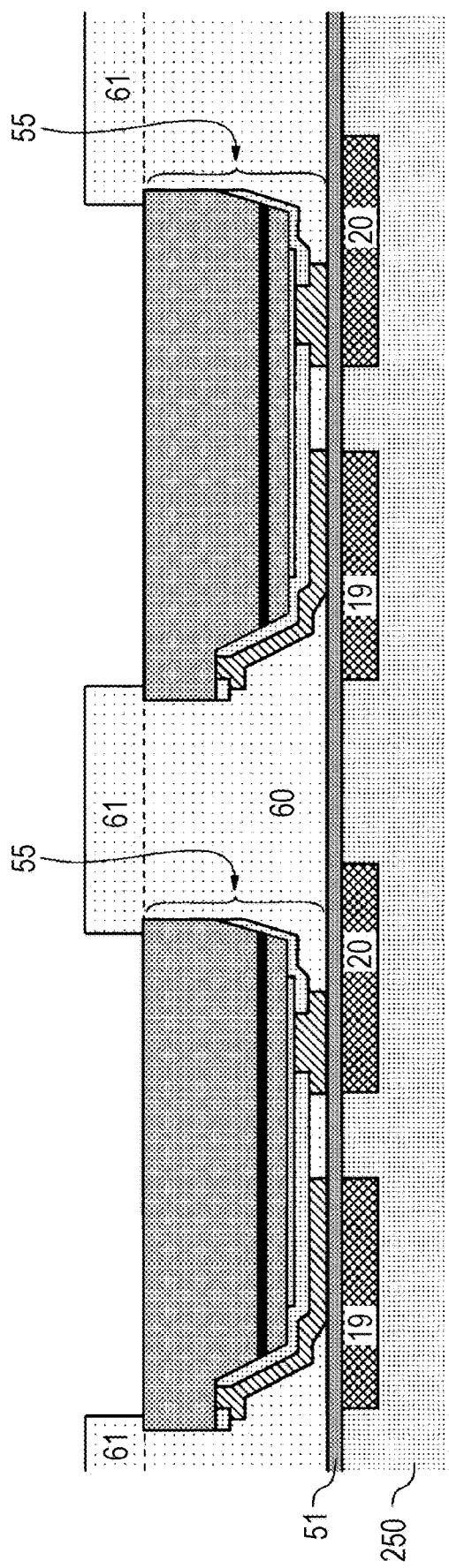
FIG. 9I is a view for explaining a step of removing a resist pattern.

FIGS. 9A to 9I are schematic views for explaining a method of providing the blue LED chip 50 on the image drive circuit 100. FIG. 9A is a view for explaining a step of attaching the blue LED chip 50 onto the image drive circuit 100. FIG. 9B is a view for explaining a step of performing the light emission test of the pixel 3. FIG. 9C is a view for explaining a step of removing the blue LED chip 56 in which defective light emission is detected from the image drive circuit 100. FIG. 9D is a view for explaining a step of adhering an alternative normal blue LED chip 55. FIG. 9E is a view for explaining a step of performing a light emission test of the pixels 3 again. FIG. 9F is a view for explaining a step of firing the LED display chip 1 while pressurizing the LED display chip 1. FIG. 9G is a view for explaining a step of forming a resist pattern 58 on the blue LED chip 50. FIG. 9H is a view for explaining a step of forming the light-shielding reflection layer 60 on the pixel array 2. FIG. 9I is a view for explaining a step of removing the resist pattern 58. In FIGS. 9A to 9I, the electrodes 19 and 20 and the interlayer insulating film 250 that are connected to the blue LED chip 50 are mainly illustrated as the structure of the LSI 7, and other components are not illustrated. In addition, zigzag arrows of FIGS. 9B and 9E indicate blue light emitted by self light emitting of the blue LED chip 50.

First, as illustrated in FIG. 9A, the anisotropic conductive film 51 is formed on the pixel drive circuit 100 of the LSI 7 formed on the silicon wafer W1, and the light emitting array 8 is adhered onto the anisotropic conductive film 51. Thus, the blue LED chip 50 is provided on the pixel drive circuit 100 for each pixel 3. At this time, an alignment with high precision is performed such that the P-side electrode 40 and the N-side electrode 41 of the blue LED chip 50 accurately face the P-side individual electrode 20 and the N-side common electrode 19 of the pixel crave circuit 100. When inspecting the alignment, it is possible to detect a portion in which the blue LED chip 50 is missed in the light emitting array 8, the blue LED chip 50 with obvious shape abnormality, and the like. In this case, a normal blue LED chip 50 can be adhered or the abnormal blue LED chip 50 can be replaced with a normal blue LED chip 50 in the same manner as a step to be described (for example, refer to FIGS. 9C and 9D).

As illustrated in FIG. 9B, the silicon wafer W1 before cutting out the LSI 7 is pressurized, for example, by a transparent substrate 52 (for example, a glass plate) in which transparent resin cushion layers 53 are stacked. By the pressurization processing, the blue LED chip 50 is temporarily fixed onto the pixel drive device 100 via the anisotropic conductive film 51. In this state, a light emission test is performed by supplying the drive current 54 to each pixel 3.

As illustrated in FIG. 9C, in a case where an LED chip 56 with defective light emission is detected by the light emission test, the LED chip 56 from which a predetermined light emission amount is not obtained, the LED chip 56 is separated and removed from the anisotropic conductive film 51 by the micromanipulator needle 57. This step is performed before pressurization and firing, and thus the LED chip 56 with defective light emission can be relatively easily separated from the pixel drive circuit 100.

As illustrated in FIG. 9D, a normal blue LED chip 50 is provided on the pixel 3 from which the LED chip 56 with defective light emission is removed. At this time, the anisotropic conductive film 51 removed together with the LED chip 56 with defective light emission can be repaired, for example, by supplementing the removed portion using a micropipette.

As illustrated in FIG. 9E, the light emission test similar to that of FIG. 9B is performed again for the adhered blue LED chip 50. In a case where a blue LED chip 56 with defective light emission is detected again, the steps of FIGS. 9C to 9E can be performed again.

As illustrated in FIG. 9F, in a case where the blue LED chip 56 with defective light emission is not detected, the silicon wafer W1 on which the LSI 7 is formed is fired while being pressurized, and thus the blue LED chip 50 is fixed on the pixel drive circuit 100 via the anisotropic conductive film 51.

Next, as illustrated in FIG. 9G, a resist pattern 58 is formed on the rear surface of the blue LED chip 50. At this time, the resist pattern 58 is also formed on the front surface of the silicon wafer W1 other than the pixel array 2.

As illustrated in FIG. 9H, in a state where the resist pattern 58 is formed, the light-shielding reflection layer 60 is formed. For example, the light-shielding reflection layer 60 is coated on an entire area of the surface of the silicon wafer W1 on which the LSI 7 is formed, and is baked. As the light-shielding reflection layer 60, for example, a resin in which white pigments are dispersed at a high concentration can be used. As the white pigments, for example, titanium oxide flue particles can be used Preferably, a diameter of the particle is set as small as possible.

As illustrated in FIG. 9I, the thin light-shielding reflection layer 60 remained on the resist pattern 58 is removed by etching, and the resist pattern 58 is peeled off. By the processing, a dam layer 61 is formed between the adjacent blue LED chips 50 by the same material as that of the light-shielding reflection layer 60. A boundary between the light-shielding reflection layer 60 and the dam layer 61 has the same height as that of the rear surface of the blue LED chip 50.

According to the steps described above, the light emitting array 8 is provided on the LSI 7. In the step of FIG. 9H, although the white pigment is used as a material for forming the light-shielding reflection layer 60, when a thickness of the light-shielding reflection layer 60 is approximately several µm, it is difficult to completely prevent light leakage. In order to further suppress light leakage, it is more effective to absorb light using a black pigment. On the other hand, when using the black pigment, light output greatly decreases. The reason is as follows. In a case of using a white pigment, light which is returned to the blue LED chip 50 by reflection is emitted again to the front surface, and thus luminance is improved. On the other hand, in a case of using a black pigment, the luminance improvement effect does not occur. Here, in the present embodiment, although a white pigment is used for the light-shielding reflection layer 60 because luminance is prioritized, a light-shielding layer using a black pigment can be used in place of the light-shielding reflection layer 60 in a case where contrast is prioritized.

When repairing the portion with defective light emission on the light emitting array 8 as illustrated in FIGS. 9C and 9D according to the present embodiment, for one LED display chip 1, average eight repairs are required. In addition, without repairing, a yield of obtaining non-defective chips is almost zero. Therefore, the configuration according to the present invention has a very large effect when manufacturing the low-defect LED display chip 1 with high yield.

In order to reliably repair the portion with defective light emission, a width of the separation groove 42 is very important. For example, in a case where the width of the separation groove 42 is 1.6 µm, a complete repair rate is 67%. On the other hand, in a case where the width of the separation groove 42 is 1 µm or less, the complete repair rate is halved. This is because is the alternative normal blue LED chip 55 is brought into contact with the adjacent pixel 3 when repairing, and as a result, the following trouble frequently occurs: the normal blue LED chip 55 becomes defective or the alternative normal blue LED chip 55 is not correctly provided. Although the trouble can be improved when accuracy of an operation of the micromanipulator needle 57 used for repairing is improved, it is still considered that the separation groove 42 has a width of 1 µm or more.

On the other hand, in a case where the width of the separation groove 42 is increased to 2.5 µm, the complete repair rate is improved to 90%. Here, in order to facilitate repairing, the width of the separation groove 42 is not limitlessly increased. This is because the density of the current flowing through the blue LED chip 50 increases, the light emission efficiency of the blue LED chip 50 decreases, and as a result, power consumption increases. FIG. 10 is a graph illustrating current dependence of the light emission efficiency of the blue LED chips 50 having various shapes which are manufactured by different makers. Generally, a region with a current density of 1 [A/cm$^2$] to 10 [A/cm$^2$] has the highest light emission efficiency. In order to suppress the decreasing rate of the light emission efficiency within 10% of the maximum value, the current density is to be suppressed to approximately 20 [A/cm$^2$] at the maximum. In order to suppress the decreasing rate of the light emission efficiency within 20% of the maximum value, the current density is to be suppressed to approximately 50 [A/cm$^2$] or less. In order to obtain a light flux with maximum luminance of 2000 [lm] (lumen), in the blue LED display chip 1B having the lowest relative luminous efficiency, it is necessary to supply a current of approximately 12 [µA] per one pixel. In this case, for example, the density of the current flowing through the blue LED chip 50 illustrated in FIG. 8 is approximately 21 [A/cm$^2$]. As a result, power consumption increases, and thereby luminance may be lowered than the maximum luminance of 2000 [lm]. Here, the area of the mesa portion 36 can be further decreased. In this case, the area occupation ratio of the blue LED chip 50 with respect to the region area of the pixel 3 becomes 34%. Therefore, in a high-end product with high cost, in a case where low power consumption is prioritized, it is necessary to increase the area occupation ratio of the blue LED chip 50, whereas in a case where cost is prioritized and an increase in power consumption is permitted, it is necessary to decrease the area occupation ratio of the blue LED chip 50. It is necessary to choose a design of the blue LED chip 50 in consideration of a cost increase according to yield improvement and whether a maximum luminance specification is guaranteed to what extent.

The relative luminous efficiency of red is equal to or greater than four times that of blue. Thus, in a case of the red LED display chip 1R, when the light emission efficiency of the red LED chip is the same as that of the blue LED chip 50, the drive current 54 required for the red LED chip is approximately half that of the blue LED chip 50 (A contribution of red to luminance is approximately twice the contribution of blue to luminance, and thus the drive current 54 required for the red LED chip does not become one-fourth of the drive current of the blue LED chip). In this case, the area occupation ratio of the red LED chip may be further reduced to approximately half that of the blue LED chip (17%).

In addition, the green LED display chip 1G can be formed in the same manner as the blue LED display chip 1B. The green LED display chip 1G has some differences only in the light emitting layer 33, and is not much different from the blue LED chip 50 in manufacturing steps. In a case of the red LED chip, although the red LED chip is formed using AlInGaNP and a substrate material and a peeling method of the substrate are changed, there is no structural change.

In addition, in an actual operation of the blue LED display chip 1B described above, luminance is 182 [lm], and contrast is above a measurement limit. In addition, maximum power consumption is 40 [W]. When the blue LED display chip 1B is combined with the red LED display chip 1R and the green LED d,splay chip 1G which have performance equivalent to that of the blue LED display chip 1B, performance capable of securing light emission luminance with maximum luminance of 2000 [lm] is obtained.

First Modification Example of First Embodiment

Figure 11A:
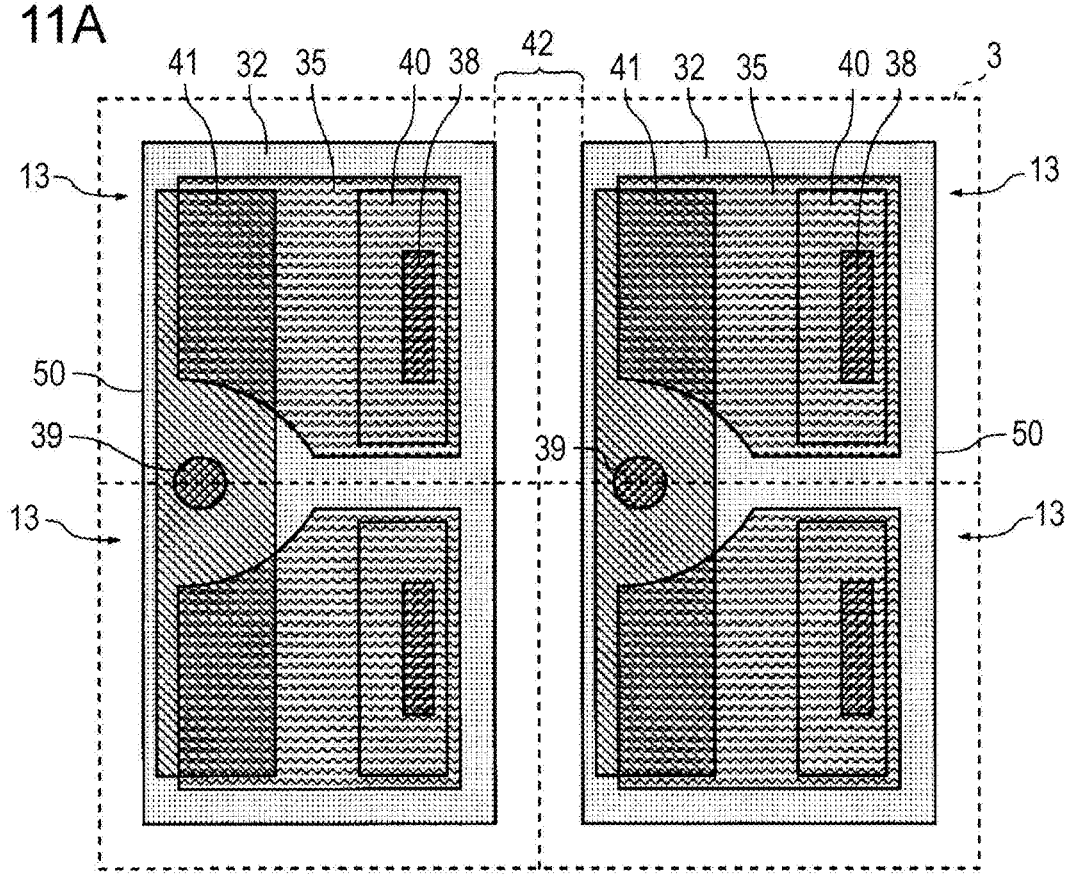
FIG. 11A is a top view illustrating a modification example of the blue LED chip provided in the pixel array.

In the above embodiment, although the individual LEDs are segmented (refer to FIG. 8), the present invention is not limited to this example, and the LEDs of the adjacent pixels 3 in the column direction may be integrated and segmented. FIG. 11A is a top view illustrating a modification example of the blue LED chip 50 provided in the pixel array 2. As illustrated in FIG. 11A, the blue LEDs provided in two adjacent pixels 3 in the column direction can be integrated without separating the compound semiconductor layers 31 of the blue LEDs. In this case, the separation groove 42 in a row direction is not formed between two adjacent blue LEDs in a vertical direction (column direction). Thereby, the area of the mesa portion 36 of each blue LED is increased, and thus the density of the current flowing through the blue LED chip 50 is decreased. Therefore, light emission efficiency of the blue LED chip 50 can be improved. In addition, the two adjacent blue LEDs in the column direction share the N-type contact hole 39, and thus the area of the mesa portion 36 can be further increased. Therefore, light emission efficiency can be further improved. In a case of FIG. 11A, as compared with the case of FIG. 8, the area occupation ratio of the compound semiconductor layer 31 is increased by approximately 10% (77.28/70.56=1.095), the area of the mesa portion 36 is increased by approximately 20% (65.28/54.35=1.201). As a result, conversion efficiency is improved by 2% to 3%. Further, a size of one blue LED chip 50 is larger than the size in FIG. 8, and thus handling when repairing the light emitting array 8 (for example, refer to FIGS. 9C and 9D) becomes easier. Therefore, repair efficiency can be improved. In a case of reducing the size of the pixel 3 in order to increase resolution of the image, it is difficult to repair the pixel 3 as the size of the pixel 3 is reduced. On the other hand, when the blue LEDs of the pixels 3 of a predetermined number (two in FIG. 11A) are integrated, repair efficiency can be further improved. Even when a plurality of blue LEDs are integrated, the number of pixels 3 to be repaired does not change greatly. Rather, repairing is performed more efficiently, and thus it is possible to reduce a cost. Here, since the blue LEDs of the pixels 3 connected in the column direction are integrated, light leakage slightly occurs between the pixels 3 via the integrated compound semiconductor layers 31. As a result, contrast in the column direction slightly decreases.

Second Modification Example of First Embodiment

Figure 11B:
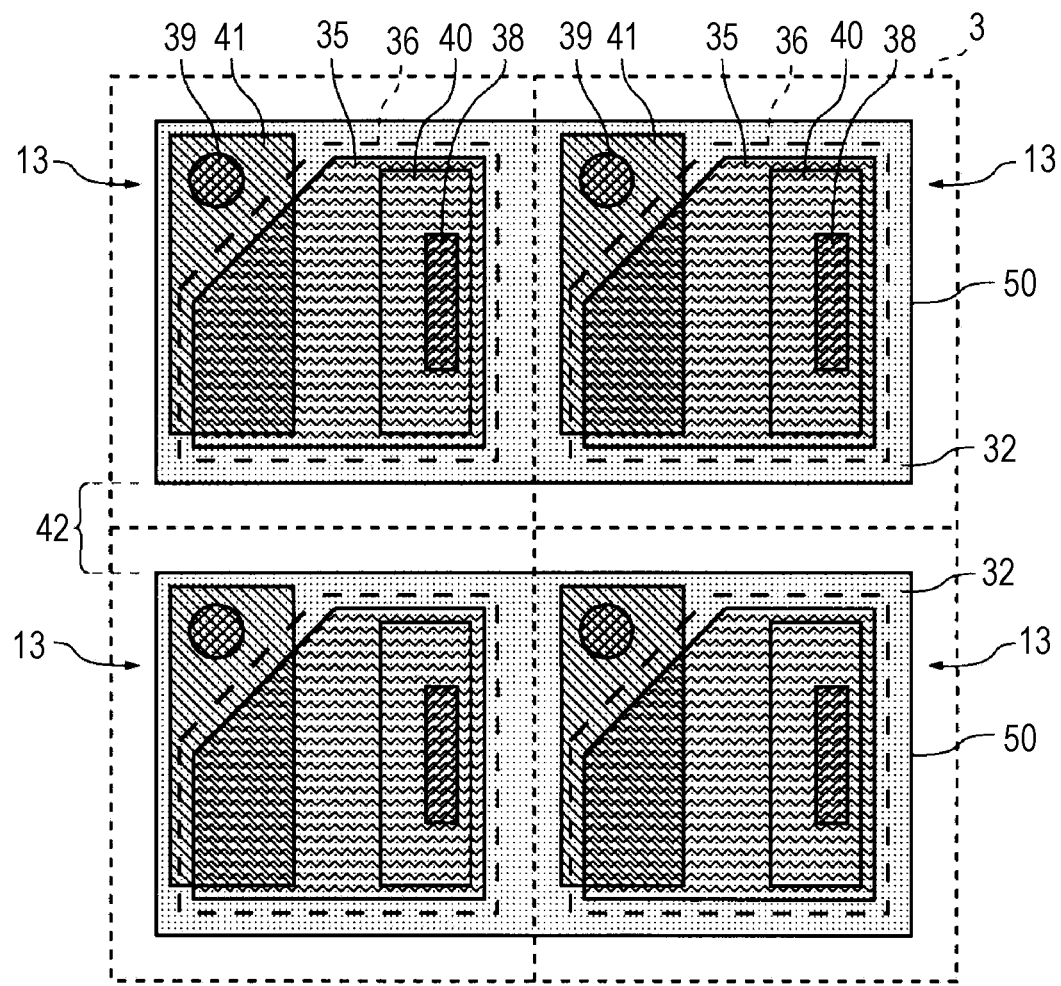
FIG. 11B is a top view illustrating another modification example of the blue LED chip provided in the pixel array.

The present invention is not limited to the examples illustrated in FIGS. 8 and 11A. Alternatively, the LEDs of the adjacent pixels 3 in the row direction may be integrated. FIG. 11B is a top view illustrating another modification example of the blue LED chip provided in the pixel array 2. As illustrated in FIG. 11B, the blue LEDs provided in two adjacent pixels 3 in the row direction can be integrated without separating the compound semiconductor layers 31 of the blue LEDs. In this case, the separation groove 42 in the column direction is not formed between two adjacent blue LEDs in a horizontal direction (row direction). Thereby, the area of the mesa portion 36 of each blue LED is increased, and thus the density of the current flowing through the blue LED chip 50 is decreased. Therefore, light emission efficiency of the blue LED chip 50 can be improved. In a case of FIG. 11B, as compared with the case of FIG. 8, the area occupation ratio of the compound semiconductor layer 31 is increased by approximately 10%, and the area of the mesa portion 36 is increased by approximately 17% (63.47/54.35=1.168). As a result, conversion efficiency is improved by 1% to 2%. Further, the size of one blue LED chip 50 is larger than the size in FIG. 8, and thus handling when repairing the light emitting array 8 becomes easier. Therefore, repair efficiency can be improved. In a case of reducing the size of the pixel 3 in order to increase resolution of the image, it is difficult to repair the pixel 3 as the size of the pixel 3 is reduced. On the other hand, when the blue LEDs of the pixels 3 of a predetermined number (two in FIG. 11B) are integrated, repair efficiency can be further improved. Even when the plurality of blue LEDs are integrated, the number of pixels 3 to be repaired does not change greatly. Rather, repairing is performed more efficiently, and thus it is possible to reduce a cost. Here, since the blue LEDs of the pixels 3 connected in the row direction are integrated, light leakage slightly occurs between the pixels 3 via the integrated compound semiconductor layers 31. As a result, contrast in the row direction slightly decreases. In addition, although an effect of improving the conversion efficiency of the blue LED chip 50 is smaller than that in the case of FIG. 11A, in FIG. 11B, there is an advantage that contrast of the image in the vertical direction does not decrease. In a case where vertical resolution is prioritized than horizontal resolution, the method of FIG. 11B is suitable for the case.

Third Modification Example of First Embodiment

The present invention is not limited to the examples illustrated in FIGS. 8, 11A, and 11B. Alternatively, the LEDs of the plurality of pixels 3 two-dimensionally disposed in n rows and m columns may be integrated. Here, n is a positive integer of two or more and less than N, and m is a positive integer of two or more and less than M. In this configuration, it is possible to increase the resolution while maintaining the yield. Hereinafter, an LED display chip 1 in which the size of each pixel 3 is 5 [μm]×5 [μm] and the number of effective pixels is 1080×1920 (full HD) will be described as an example. An effective portion of the pixel array 2 has a size of, for example, 5.4 [mm]×9.6 [mm]. In addition, the entire LED display chip 1 has a chip size of, for example, 8 [mm]×15 [mm] including the row selection circuit 4, the column signal output circuit 5, and the image processing circuit 6.

Figure 11C:
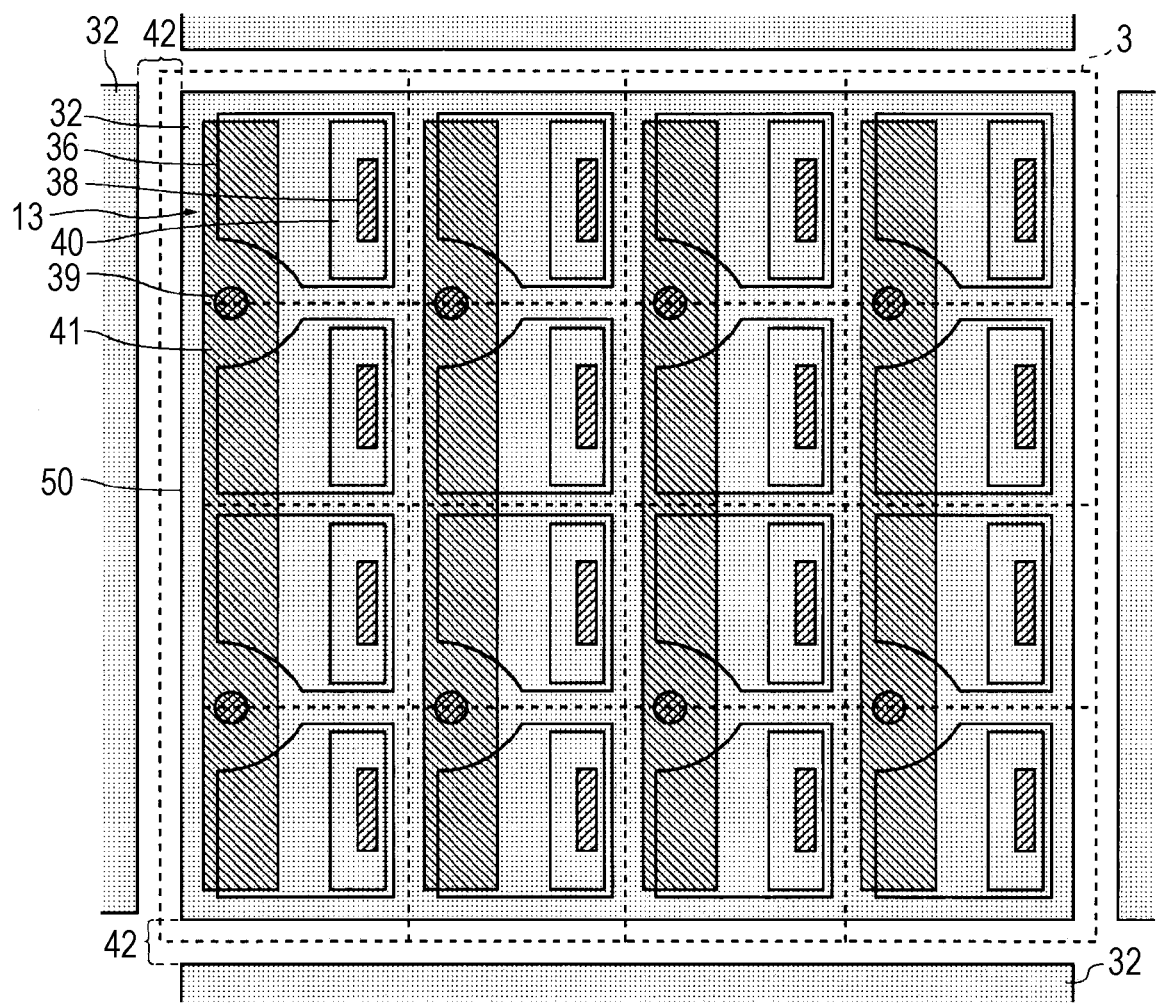
FIG. 11C is a top view illustrating still another modification example of the blue LED chip provided in the pixel array.

FIG. 11C is a top view illustrating still another modification example of the blue LED chip 50 provided in the pixel array 2. In FIG. 11C, the blue LEDs of 16 pixels 3 two-dimensionally disposed in four rows and four columns (in particular, the compound semiconductor layers 31 of the pixels 3) are integrated without being separated. In this case, the separation groove 42 is not formed between adjacent blue LEDs in the row direction and the column direction. Thereby, the area of the mesa portion 36 of each blue LED is increased, and thus the density of the current flowing through the blue LED chip 50 is decreased. Therefore, light emission efficiency of the blue LED chip 50 can be improved. Further, in FIG. 11C, two adjacent blue LEDs in the vertical direction (column direction) share the N-type contact hole 39, and thus the area of the mesa portion 36 can be further increased. Therefore, light emission efficiency can be further improved.

In the third modification example, similar to the first and second modification examples, the blue LEDs of 16 pixels 3 disposed in four rows and four columns are integrated, and each blue LED has a size of 20 [μm]×20 [μm]. In addition, the size of the compound semiconductor layer 31 is 18 [μm]×18 [μm]. This is because the size of the blue LED chip 50 is small in the structure of FIG. 8, and as a result, it difficult to repair the light emitting array In a case of FIG. 11C, the area occupation ratio of the compound semiconductor layer 31 with respect to the total region area of the 16 pixels 3 is 81%. In order to increase a repair success rate of the enlarged blue LED chip 50, the width of the separation groove 42 is increased to 2 [μm]. A pair of upper and lower pixels 3 sharing the N-side contact hole 39 are two-dimensionally disposed, and the blue LEDs are disposed in the same pattern as that of the pixels 3. A shape and a position of the mesa portion 36 of each pixel 3 are adjusted such that the region area of each pixel 3 is the same. Therefore, although the center position of the mesa portion 36 with respect to the region of the pixel 3 may be slightly different depending on the pixel 3, the different amount is small. Thus, there is no big problem in image quality of the image projected by the LED display chip 1. The area occupation ratio of the mesa portion 36 with respect to the region area of the pixel 3 is 58%.

The size of the pixel 3 according to the third modification example is, for example, smaller than that in the first embodiment. Thus, in FIG. 11C, the transparent conductive film 35 is not formed, and the P-side electrode 40 is directly brought into contact with the P-side epitaxial layer 34. Since sheet resistance of the P-side epitaxial layer 34 is as high as approximately $5 \times 10^4$ [Ω] there is a problem that a driving voltage of the pixel 3 is increased to approximately 0.5 V when the P-side electrode 40 is directly brought into contact with the P-side epitaxial layer 34. On the other hand, there is an advantage that a technical problem for forming a fine pattern of the transparent conductive film 35 can be avoided.

Similar to the first embodiment (refer to FIG. 8), when the width of the separation groove 42 is 1.6 [μm], the area occupation ratio of the compound semiconductor layer 31 is 85%, and the area occupation ratio of the mesa portion 36 increases to 64%. In order to reduce the power consumption, it is preferable to decrease the width of the separation groove 42 as in the first embodiment. On the other hand, in order to improve the yield, it is preferable to increase the width of the separation groove 42 as in the third modification example. In addition, in a case where the sizes of the segmented pixels 3 are set to 5 [μm]×5 [μm] and the width of the separation groove 42 is set to 2 [μm], the area occupation ratio of the compound semiconductor layer 31 is 36%, and the area occupation ratio of the mesa portion 36 is, for example, 5%. In this case, the current injection density is extremely high as ten times, and the light emission efficiency remarkably decreases. Therefore, the power consumption increases, and the maximum luminance decreases. In addition, handling of the small-sized blue LED chip 50 becomes difficult, and as a result, a repairing yield is inevitably reduced at present. On the other hand, in the third modification example, these problems can be avoided, and an LED display chip with high resolution can be manufactured. In the third modification example, although contrast may be decreased due to slight light leakage between the 16 pixels connected to each other, contrast when viewing the entire screen in a large scale is very high. Therefore, such a configuration for a liquid crystal display or the like is still superior.

As described above, according to the present embodiment, there is provided an image-forming element 1. The image-forming element 1 includes the plurality of pixels 3, and projects and displays the light emitted from the pixels 3. The image-forming element 1 includes the light emitting elements 10 each in which a light source 50 emitting light is included, and a mounting substrate 7 on which the plurality of light emitting elements 10 are provided on a mounting surface. A plurality of light sources 50 are provided by being segmented and included in at least one pixel 3, and each of the light sources 50 includes a plurality of power supply electrodes 40 and 41 provided on the same surface. The mounting substrate 7 includes drive circuits 100 for driving the light sources 50, and electrodes 19 and 20 which are provided on the mounting surface and are electrically connected to the power supply electrodes 40 and 41 of the light sources 50. Each pixel 3 is configured such that the area occupation ratio of the light source 50 with respect to the region area of the pixel 3 is 15% or more and 85% or less.

According to this configuration, when the light emitting element 10 including the light source 50 is provided on the mounting surface of the mounting substrate 7, the power supply electrodes 40 and 41 provided on the same surface of the light source 50 can be electrically connected to the electrodes 19 and 20 provided on the mounting surface. In addition, for example, when replacing the defective light source 56, removing of the defective light source 56 and adhering of the normal light source 55 can be performed relatively easily and efficiently. In addition, since each of the plurality of light sources 50 is segmented so as to be included in at least one pixel 3, it is possible to suppress light leakage to the adjacent pixels 3 via the inside of the light source 50. That is, light leakage to a dark pixel which is adjacent to a bright pixel can be suppressed. Therefore, it is possible to suppress or prevent a decrease of contrast of the image formed by the projected light of the pixel 3, and color mixing of the emitted light between the adjacent pixels 3. In addition, when the light sources 50 are segmented so as to be included in a plurality of pixels 3, it is possible to reduce the number of the light sources 50 when the light emitting element 10 including the light source 50 is provided on the mounting substrate and a handling difficulty can also be improved. Therefore, working efficiency is improved, and thus this facilitates mass production. Further, the area occupation ratio of each light source 50 with respect to the region area of each pixel 3 is set to 15% or more and 85% or less. In this configuration, suppression of light leakage to the adjacent pixels 3, suppression of a reduction in light emission efficiency and an increase in power consumption due to a reduction of a light emitting region, and suppression of occurrence of a difficulty in handling (for example, replacing work of the light source 50) due a reduction of a gap between the adjacent light sources 50 can be satisfied in a well-balanced way. Therefore, it is possible to manufacture an image-forming element having an excellent color rendering property and high contrast with low defects and high yield.

In addition, according to the present embodiment, there is provided an image-forming element 1. The image-forming element 1 includes the plurality of pixels 3, and projects and displays the light emitted from the pixels 3. The image-forming element 1 includes the light emitting elements 10 each which a light source 50 emitting light is included, and a mounting substrate 7 on which the plurality of light emitting elements 10 are provided on a mounting surface. A plurality of light sources 50 are provided by being segmented and included in at least one pixel 3, and each of the light sources 50 includes at least one of power supply electrodes 40 and 41 on a surface facing the mounting substrate 7. The mounting substrate 7 includes drive circuits 100 for driving the light sources 50, and electrodes 19 and 20 which are provided on the mounting surface and are electrically connected to the power supply electrodes 40 and 41 of the light sources 50. The drive circuit 100 is configured to include a switch circuit 117 which selectively short-circuits the electrodes 19 and 20 electrically connected to the power supply electrodes 40 and 41 of the light source 50 with other electrodes or wirings in the drive circuit 100.

According to this configuration, when the light emitting element 10 including the light source 50 is provided on the mounting surface of the mounting substrate 7, the at least one of power supply electrodes 40 and 41 provided on the surface facing the mounting substrate 7 can be electrically connected to the electrodes 19 and 20 provided on the mounting surface. In addition, for example, when replacing the defective light source 56, removing of the defective light source 56 and adhering of the normal light source 55 can be performed relatively easily and efficiently. In addition, since each of the plurality of light sources 50 is segmented so as to be included in at least one pixel 3, it is possible to suppress light leakage to the adjacent pixels 3 via the inside of the light source 50. That is, light leakage to a dark pixel which is adjacent to a bright pixel can be suppressed. Therefore, it is possible to suppress or prevent a decrease of contrast of the image formed by the projected light of the pixel 3, and color mixing of the emitted light between the adjacent pixels 3. In addition, when the light sources 50 are segmented so as to be included in the plurality of pixels 3, it is possible to reduce the number of the light sources 50 when the light emitting element 10 including the light source 50 is provided on the mounting substrate 7, and a handling difficulty can also be improved. Therefore, working efficiency is improved, and thus this facilitates mass production. Further, since the drive circuit 100 includes the switch circuit 117, before connecting the light source 50 to the drive circuit 100, it is possible to detect whether the drive circuit 100 is normal or abnormal by selectively short-circuiting the electrodes 19 and 20 with other electrodes or wirings in the drive circuit 100 using the switch circuit 117. Therefore, it is possible to manufacture an image-forming element having an excellent color rendering property and high contrast with low defects and high yield.

In the image-forming element 1, the light source 50 is a compound semiconductor light emitting diode.

According to this configuration, it is possible to reduce the power consumption to a relatively low level.

In the image-forming element 1, the mounting substrate 7 is a semiconductor substrate Wi. The drive circuit 100, the array selection circuit 4 for selecting the pixels 3 arranged in a predetermined direction (column direction), and the signal output circuit 5 which outputs a drive signal to the drive circuit 100 for driving the light source 50 of the pixel 3 selected by the array selection circuit 4 are monolithically formed on the mounting substrate 7.

According to this configuration, the drive circuit 100, the array selection circuit 4, and the signal output circuit 5 can be efficiently and compactly formed.

The image-forming element 1 described above further includes at least the anisotropic conductive film 51 provided on the electrodes 19 and 20 of the mounting substrate 7, and the power supply electrodes 40 and 41 of each of the light sources 50 are provided on the electrodes 19 and 20 of the mounting substrate 7 via the same anisotropic conductive film 51.

According to this configuration, the anisotropic conductive film 51 can be conducted by pressurization in the film thickness direction, and can be insulated in the film direction (direction on a plane perpendicular to the film thickness direction). Thus, it is not necessary to individually form a connection film on the electrodes 19 and 20 of the mounting substrate 7. That is, when the power supply electrodes 40 and 41 of the light source 50 are provided on the electrodes 19 and 20 of the mounting substrate 7, the power supply electrodes 40 and 41 and the electrodes 19 and 20 are electrically connected to each other by conduction of the anisotropic conductive film 51, and are electrically insulated from each other in other cases.

The image-forming element 1 described above further includes a first light shielding layer 60 having a light reflection property or a light absorption property, and the first light shielding layer 60 is provided between the adjacent light sources 50.

According to this configuration, light leakage to the adjacent light sources 50 can be suppressed or prevented by the first light shielding layer 60, and thus it is possible to prevent a decrease of contrast of the image 3.

Second Embodiment

Next, a second embodiment will be described. In the second embodiment, each of LED display chips 1R, 1B, and 1B outputs monochrome light of each of red (R), green (G), and blue (B) by converting light emitted from a blue-violet LED chip 70 into light having a different wavelength by a wavelength conversion layer. Hereinafter, a configuration different from that of the first embodiment will be described. In addition, the same reference numerals are given to the same components as those of the first embodiment, and explanations thereof will be omitted.

Each of light emitting elements 11, 12, and 13 of the LED display chips 1R, 1G, and 1B includes a blue-violet LED chip 70 and a wavelength conversion layer 62. The blue-violet LED chip 70 is an excitation light source of the red light emitting element 11, and emit near-ultraviolet light having a wavelength of 400 [μm] to 430 [μm]. The wavelength conversion layer 62 is different in each of the light emitting elements 11, 12, and 13. That is, the wavelength conversion layer 62 of the red light emitting element 11 of the red LED display chip 1R converts the near-ultraviolet light emitted from the blue-violet chip LED 70 into red light having a different wavelength, and outputs the red light to the outside. The wavelength conversion layer 62 of the green light emitting element 12 of the green LED display chip 1G converts the near-ultraviolet light emitted from the blue-violet LED chip 70 into green light having a different wavelength, and outputs the green light to the outside. The wavelength conversion layer 62 of the red light emitting element 13 of the blue LED display chip if converts the near-ultraviolet light emitted from the blue-violet LED chip 70 into blue light having a different wavelength, and outputs the blue light to the outside. Ac cord each of the LED display chips 1R, 1G, and 1B has a common structure in which the blue-violet LED chip 70 is adhered to the pixel drive circuit 100. In this configuration, there is no need to separately form the LED display chip 1 including the light emitting layer 33 which emits light of three kinds of different colors (wavelengths). Therefore, it is possible to shorten a development period of the LED display chip 1 and to reduce work-in-process. In addition, in general, an excitation efficiency of the near-ultraviolet light in the wavelength conversion layer 62 is high. Further, a luminous efficiency of the near-ultraviolet light is low. Therefore, even when some near-ultraviolet light components transmit through the wavelength conversion layer 62 and emit to the outside, there is an advantage that an action of decreasing color purity of the pixel 3 is small. In addition, as the wavelength conversion layer 62, various phosphors, quantum dot wavelength conversion layers, or the like can be used. The phosphor has a relatively low cost, and a performance of the phosphor is stable for a long period of time. The quantum dot wavelength conversion layer has an advantage that a half width at a light emission spectrum is narrow and a color gamut can be expanded. Further, there is no need to configure the wavelength conversion layer 62 with a single material. For example, a blue LED chip may be used as a light source, and white light may be formed by using a mixed phosphor of a yellow phosphor, a green phosphor, and a red phosphor. Thereafter, red, green, and blue light may be formed by disposing R, G, and B color filters. In this case, the wavelength conversion layer 62 has a two-layer structure of a phosphor layer and a color filter layer.

Figure 12:
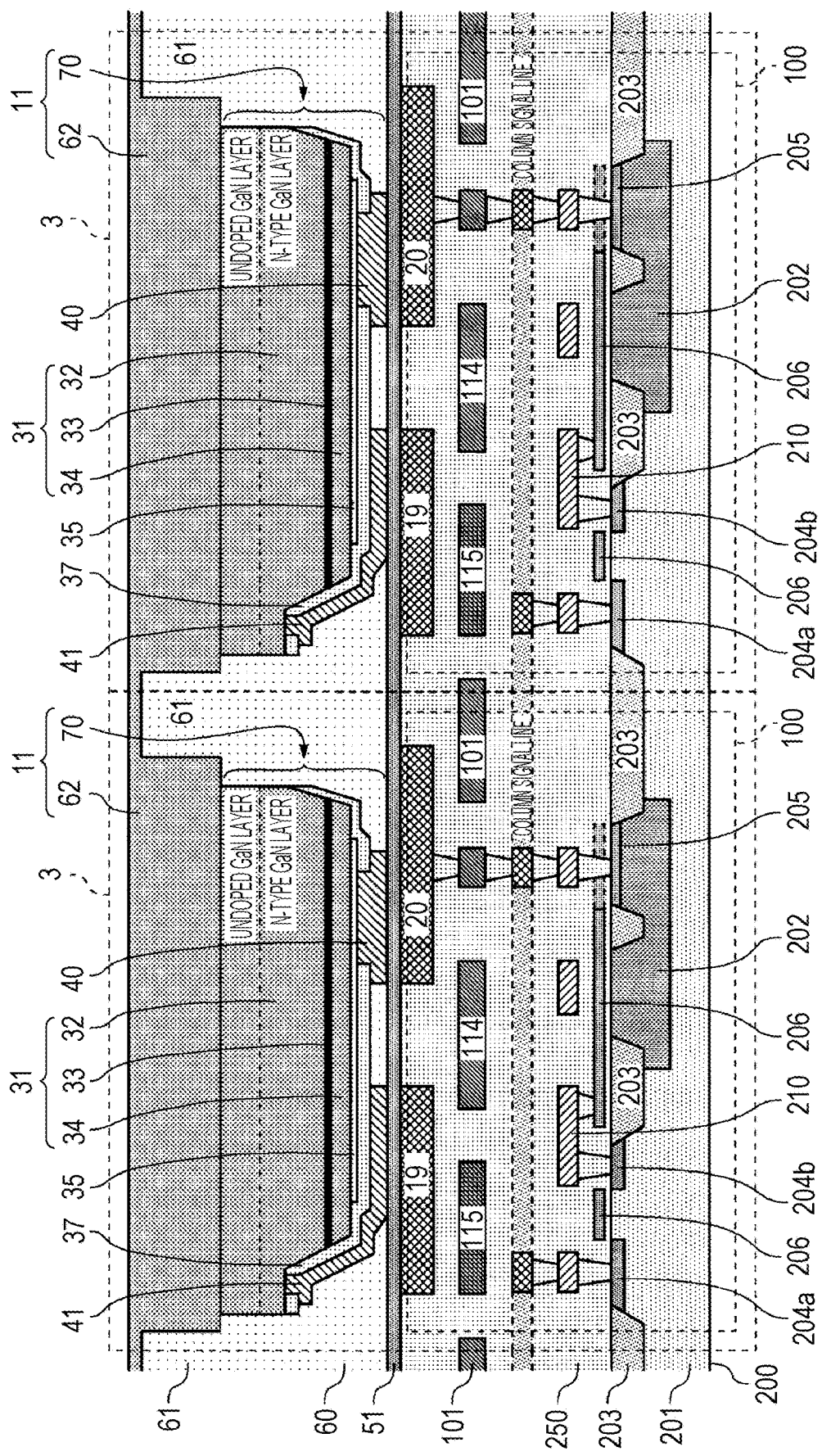
FIG. 12 is a sectional view illustrating a configuration example of a pixel according to a second embodiment.

FIG. 12 is a sectional view illustrating a configuration example of the pixel 3 according to the second embodiment. FIG. 12 illustrates a sectional structure of the pixel 3 taken along an one-dot chain line A-A of FIG. 2, for example. In the following description, although the pixel 3 of the red LED display chip 1R will be mainly described as an example, the pixel 3 of the green LED display chip 1G and the pixel 3 of the blue LED display chip 1B have the same configuration as that of the pixel 3 of the red LED display chip 1R, and explanations thereof will be omitted.

As illustrated in FIG. 12, a dam layer 61 is provided between adjacent blue-violet LED chips 70, and thus leakage of light transmitting through the wavelength conversion layer 62 is minimized. The dam layer 61 is formed using a material having a high reflection property and a low light absorption property, and is preferably formed using the same material as that of the light-shielding reflection layer 60. The size of the pixel 3 is as small as several micrometers to several tens of micrometers. As a result, it is technically difficult to provide the wavelength conversion layer 62 in each pixel 3, and a manufacturing cost is also high. Therefore, the wavelength conversion layer 62 is applied on the front surface of the pixel array 2 all at once, and thus steps can be simplified and the manufacturing cost can be reduced.

A structure and a manufacturing method of the blue violet LED chip 70 are substantially the same as those of the blue LED chip 50 (refer to, for example, FIGS. 7A to 7I).

A main difference between the blue-violet LED chip 70 and the blue LED chip 50 is that an In concentration of a quantum well layer of the light emitting layer 33 of the blue-violet LED chip 14 is lower than that of a quantum well layer of the blue LED chip 50 and that a bandgap of the well layer of the blue-violet LED chip 70 is wider than that of the well layer of the blue LED chip 50. Besides this, although a thickness of each layer of a multiple quantum well structure is slightly changed, the layer thickness has little effect on the configuration according to the present embodiment. In addition, the LSI 7 basically has the same configuration as that of the first embodiment. Here, a drive current 54 of the blue-violet LED chip 70 changes according to a difference in conversion efficiency of the wavelength conversion layer 62. In addition, temperature dependency in light conversion efficiency of the blue-violet LED chip 70 and the wavelength conversion layer 62 as a whole may be different depending on the light emitting elements 11, 12, and 13 of each color. In this case, the drive current 54 of the blue-violet LED chip 70 is controlled in accordance with a temperature variation of the LSI 7.

Next, a method of providing the light emitting array 8, which includes the blue-violet LED chips 70 two-dimensionally disposed, on the LSI 7 will be described. A step of adhering the blue-violet LED chip 70 on the image drive circuit 100 can be performed in the same manner as in the first embodiment (refer to FIGS. 9A to 9I). After the step of FIG. 9I, a fluorescent resin layer in which phosphor particles are mixed (that is, a precursor of the wavelength conversion layer 62) is applied on the entire surface of the pixel array 2, and is baked (fired). Thereby, as illustrated in FIG. 12, the wavelength conversion layer 62 is provided on the blue-violet LED chip 70. In this case, preferably, the fluorescent resin layer is removed from a region other than the pixel array 2. Further, it is necessary to remove the fluorescent resin layer from at least a pad electrode (not illustrated) connecting the LSI 7 and an external substrate (not illustrated). After covering the region at which the fluorescent resin layer is to be removed (for example, a portion near the pixel array 2) with a resist pattern in advance, the fluorescent resin layer may be applied, the thin fluorescent resin layer remaining on the resist pattern may be dissolved, and then the resist pattern may be removed.

The red LED display chip 1R formed by the above method has the following features: a decrease in luminance due to a temperature increase is small and long-term reliability is excellent, compared with a case where the red LED including the quaternary (for example, AlInGaP) compound semiconductor layer 31 is mounted on the red LED display chip 1R. This is because a nitride semiconductor mater al used for the green LED, the blue LED, or the like has a small decrease in luminance due to a temperature increase and a high mechanical strength as compared with the quaternary (AlInGaP) compound semiconductor. Therefore, it is possible to realize the red LED display chip 1R with good color balance even when used for a long time and low defects. In addition, an operation voltage of the AlInGaP-based red LED is 2.5 V, which is lower than the operation voltage of an InGaN-based LED (approximately 3 V). For this reason, it is necessary to separately design the LSI 7, and to design the LSI 7 having a wider operation range in order to make the LSI 7 common. As a result, there is a problem that a development period of the LSI 7 is increased. On the other hand, the LED display chips 1R, 1G, and 1B according to the present embodiment can have the same driving voltage, and thus there is also an advantage that the development period can be shortened.

As a red phosphor to be mixed in the wavelength conversion layer 62, various materials, for example, a nitride phosphor such as FOX ($Y_2O_3$:Eu) or $CaAlSiN_3$, a fluoride phosphor such as KSF, or the like can be used. Among the materials, a KSF phosphor such as $K_2(Si_{0.99}Mn_{0.01})F_6$ (a manganese-activated fluorinated tetravalent metal salt phosphor), which has a small light emission amount in an infrared region and has a sharp light emission peak in a wavelength region near 600 [nm] to 650 [nm], is advantageous in expanding the color gamut. In addition, for the wavelength conversion layer 62, a quantum dot material can also be used. In this case, there is an advantage that the half width at a light emission spectrum can be narrowed and the color gamut can be expanded.

Modification Example of Second Embodiment

As an excitation light source instead of the blue-violet LED chip 70, a blue LED chip 50 that emits blue light having a wavelength of 430 [nm] to 470 [nm] may be used. In this case, the wavelength conversion layer 62 is unnecessary in the blue LED display chip 1B. Therefore, in manufacturing steps of the blue LED display chip 1B, the step of forming the wavelength conversion layer 62 can be omitted, and thus the manufacturing cost can be reduced. Here, in the red LED display chip 1R and the green LED display chip 1G, color purity of the pixel may be decreased due to leakage of the blue light. In the following description, the pixel 3 of the green LED display chip 1G will be mainly described as an example. The pixel 3 of the red LED display chip 1R is the same as the pixel 3 of the green LED display chip 1G, and thus descriptions thereof will be omitted.

The green LED display chip 1G is configured by combining a blue LED chip 50 with high light emission efficiency and a wavelength conversion layer 62 which converts blue light emitted from the blue LED chip 50 into green light having a different wavelength. This is because light emission efficiency of the green LED is generally lower than that of the blue LED 50 even in a case where the green LED can be formed using a nitride compound semiconductor as in the blue LED 50. For this reason, it is necessary to increase a chip size of the green LED, and as a result, the green LED tends to be expensive.

For the wavelength conversion layer 62, various materials, for example, an oxide-based material ($Zn_2SiO_4$:Mn), a sulfide-based material (ZnS:CuAl, $Gd_2O_2S$:Tb), an oxynitride phosphor, or the like can be used. As a material with high light emission efficiency and high stability, β-type SiALON ($Eu_{0.05}Si_{11.5}Al_{0.5}O_{0.05}N_{19.95}$) is advantageous. In addition, a quantum dot material can be also used. In this case, there is an advantage that the half width at a light emission spectrum can be narrowed and the color gamut can be expanded.

A structure and a manufacturing method of the blue LED chip 50 are substantially the same as those in the first embodiment. The LSI 7 is the same as that in the second embodiment. A method of providing the light emitting array 8 including the blue LEDs 50, which are two-dimensionally disposed, on the LSI 7 is the same as that in the second embodiment, except that the blue LED chip 50 is used instead of the blue-violet LED chip 70 and the material of the wavelength conversion layer 62 (for example, β-SiALON phosphor) is different.

A green phosphor such as β-type SiALON has a wide light emission spectrum region. As a result, the color gamut of the green LED display chip 1G tends to be narrower than that of the green LED. Here, compared with a case where the green LED is used, in the green LED display chip 1G using the green phosphor, an NTSC ratio is lowered by approximately 10%, and on the other hand, the manufacturing cost can be reduced by 5% and the power consumption can be reduced by 19%.

As described above, in the image-forming element 1 according to the present embodiment, the light emitting element 10 further includes the wavelength conversion layer 62 which converts the light emitted from the light sources 70 and 50 into light having a different wavelength and outputs the converted light to the outside.

According to this configuration, the light emitted from the same light source 50 can be converted into light of different color by the wavelength conversion layer 62. That is, the same light source 50 can be used for the light emitting element 10.

The image-forming element 1 described above further includes a second light shielding layer 61 having a light reflection property or a light absorption property, and the second light shielding layer 61 is provided in at least a portion between the adjacent wavelength conversion layers 62.

According to this configuration, light leakage between the adjacent light emitting elements 10 (in particular, the wavelength conversion layers 62) can be suppressed or prevented by the second light shielding layer 61, and thus it is possible to prevent a decrease of contrast of the image 3.

Third Embodiment

Next, a third embodiment will be described. In the third embodiment, one LED display chip 1 projects a color image. Hereinafter, a configuration different from that of the first embodiment will be described. In addition, the same reference numerals are given to the same components as those of the first embodiment, and explanations thereof will be omitted.

Figure 13:
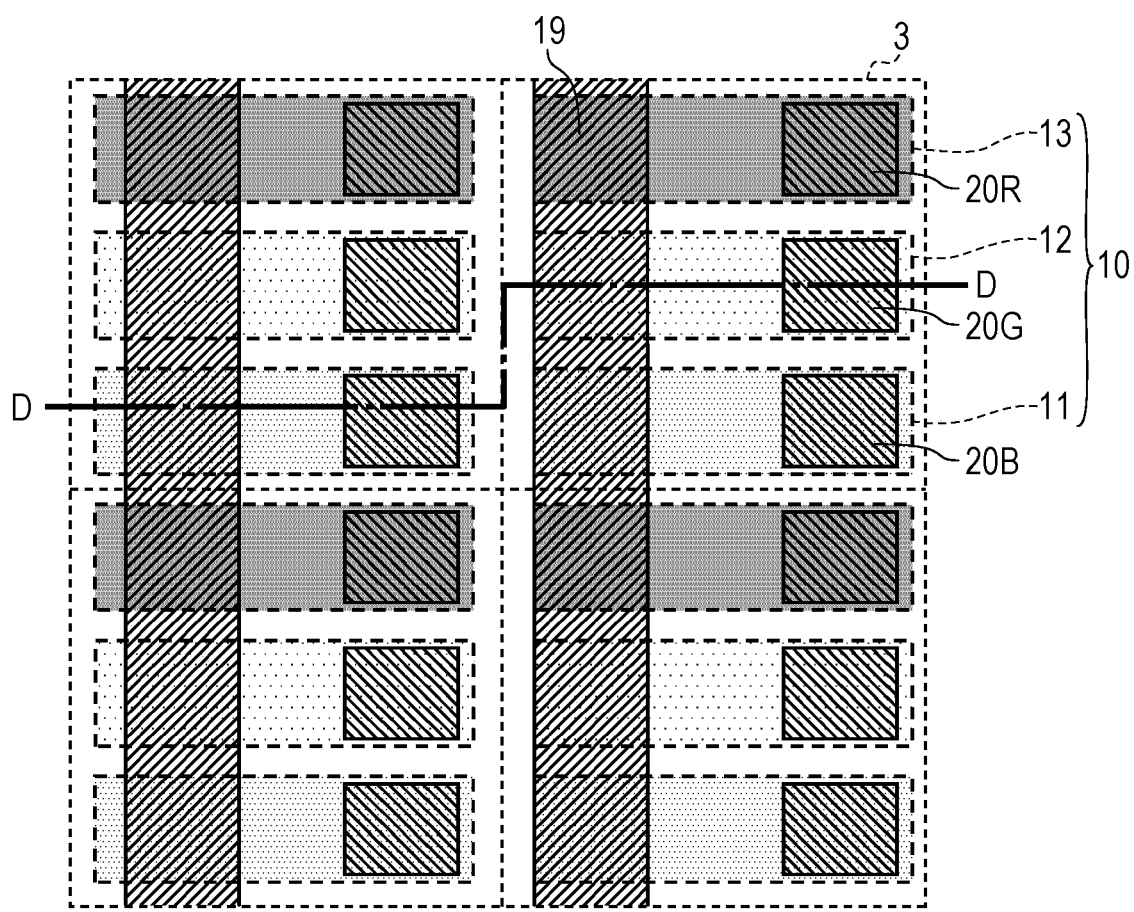
FIG. 13 is a perspective top view of a pixel according to a third embodiment.

FIG. 13 is a perspective top view of the pixel 3 according to the third embodiment. As illustrated in FIG. 13, in each pixel 3, a red light emitting element 11, a green light emitting element 12, and a blue light emitting element 13 are 7. Each of the light emitting elements 11 to 13 is configured to include, for example, a blue-violet LED chip 70 (that is, an excitation light source) and a wavelength conversion layer 62, and is provided on the pixel drive circuit 100 that supplies the drive current 54 to the light emitting element.

In the LED display chip 1 of FIG. 13, in a case where each of the light emitting elements 11 to 13 has the same size, the size of each of the light emitting elements 11 to 13 is approximately one-third of the size of the light emitting element 10 of the single-color LED display chip 1 (for example, refer to FIG. 2). For this reason, a manufacturing step of the LED chip and an adhering step of the LED chip to the LSI 7 become difficult. In particular, the wavelength conversion layers 62 for red and green are to be disposed on each LED chip with high accuracy. As a result, yield may be lowered in some cases. Here, since one LED display chip 1 can display a full color image, there is a big, advantage that an optical system can be configured very simply.

Figure 14B:
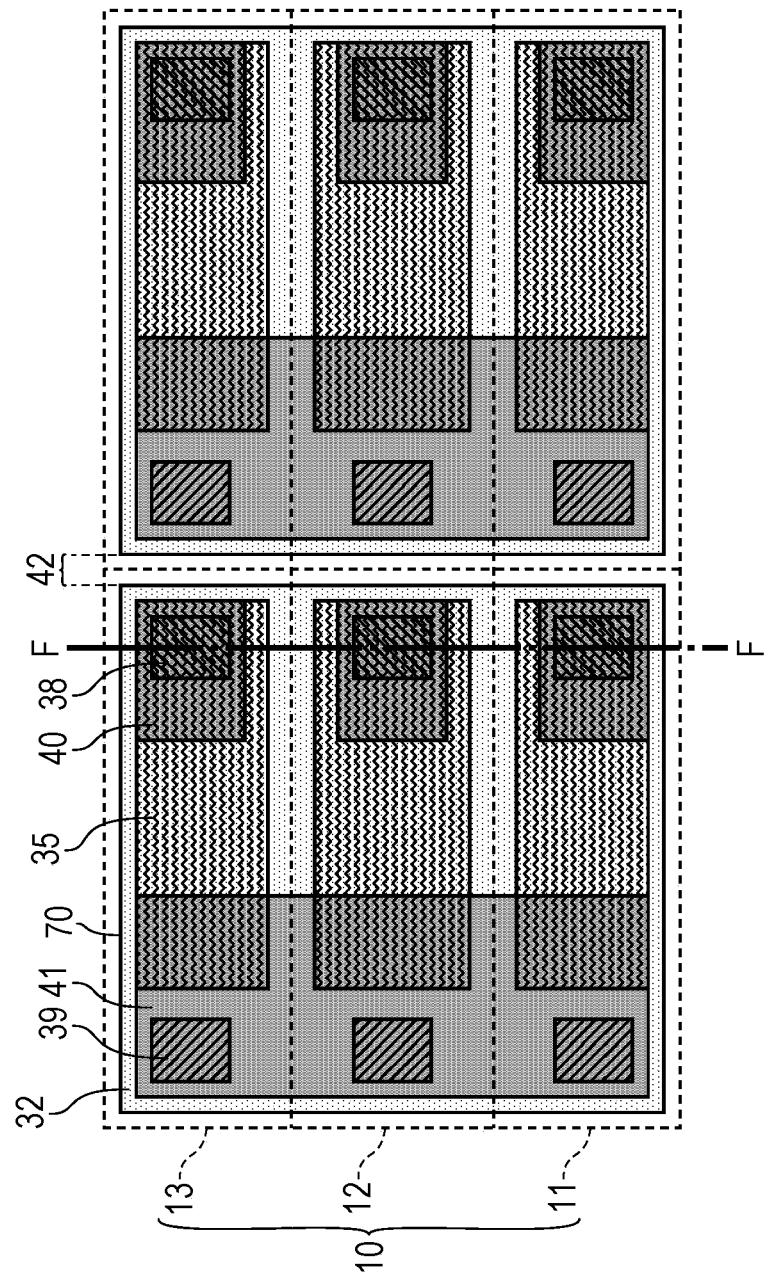
FIG. 14B is a perspective plan view illustrating a configuration example of a pixel including an integrated light emitting element.
Figure 14C:
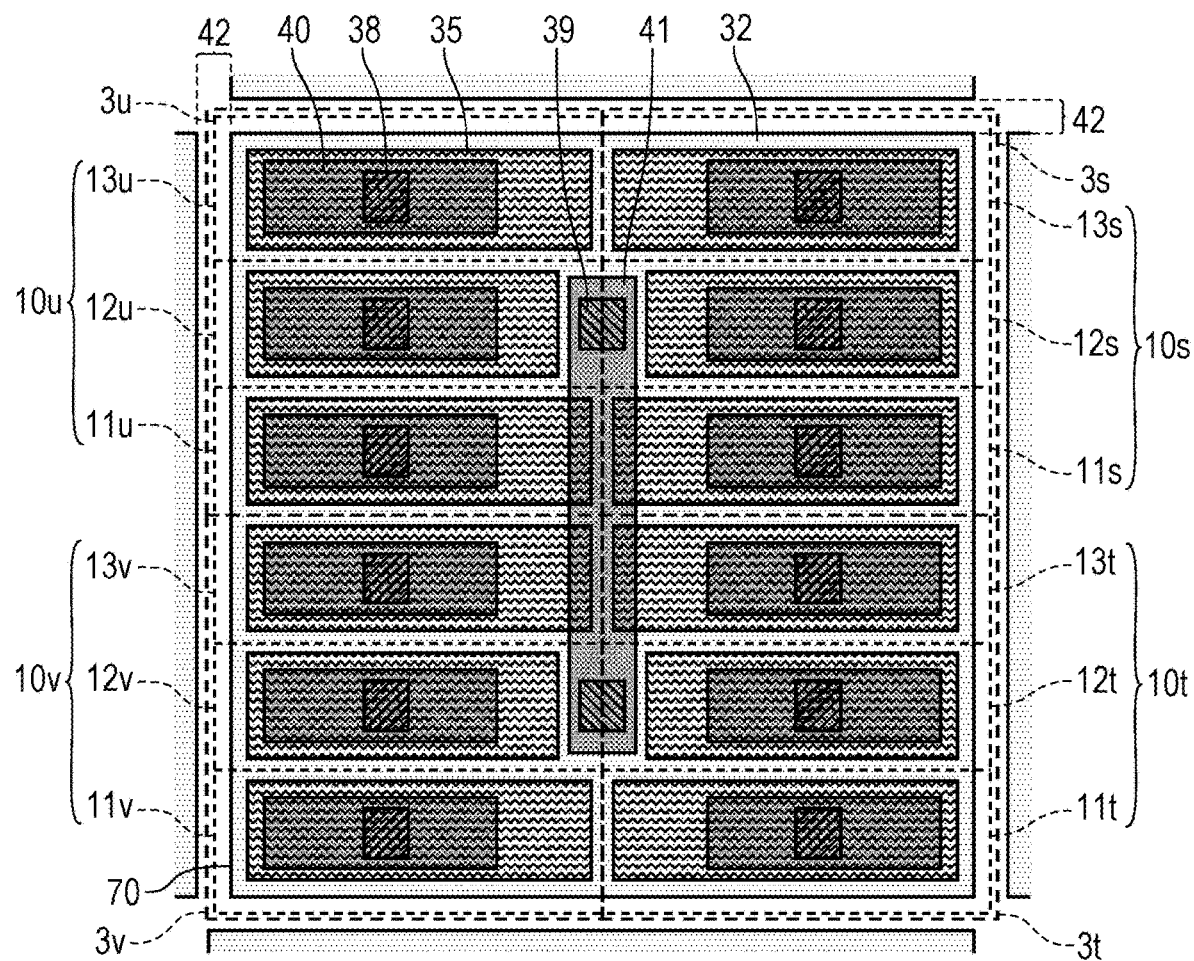
FIG. 14C is a perspective plan view illustrating a configuration example in which a plurality of pixels are integrated.

As a method for improving the difficulties in manufacturing, the structure of the LED display chip 1 can be changed. FIGS. 14A to 14C illustrate a configuration example of the pixel 3 according to the present embodiment. FIG. 14A is a perspective plan view illustrating a configuration example of the pixel 3 including independent light emitting elements 11 to 13. FIG. 14E is a perspective plan view illustrating a configuration example of the pixel 3 including an integrated light emitting element 10. FIG. 14C is a perspective plan view illustrating a configuration example in which a plurality of pixels 3 are integrated.

In FIG. 14A, three kinds of light emitting elements 11 to 13, which emit red light, green light, and blue light, include three independent blue-violet LED chips 70 as excitation light sources and wavelength conversion layers for red light, green light, and blue light. Each pixel 3 has a size of, for example, 20 [μm]×20 [μm], and the number of effective pixels is, for example, 480×640 (VGA standard). An effective portion of the pixel array 2 has a size of, for example, 9.6 [mm]×12.8 [mm]. In addition, the entire LED display chip 1 has a chip size of, for example, 15 [mm]×18 [mm] including the row selection circuit 4, the column signal output circuit 5, and the image processing circuit 6. A size of each blue-violet LED chip 70 of each of the light emitting elements 11 to 13 is 18 [μm]×4.67 [μm], and the blue-violet LED chips 70 are disposed with a distance of 2 [μm]. In this case, the total area occupation ratio of the blue-violet LED chips 70 with respect to the region area of the pixel 3 is 63%.

On the other hand, in FIG. 14B, the transparent electrode films 35 and the P-side electrodes 40 for the light emitting elements 11 to 13 are independently provided, whereas the compound semiconductor layers 31 are integrally formed. Each pixel 3 has a size of, for example, 20 [μm]×20 [μm], and the number of effective pixels is, for example, 480×640 (VGA standard). An effective portion of the pixel array 2 has a size of, for example, 9.6 [mm]×12.8 [mm]. In addition, the entire LED display chip 1 has a chip size of, for example, 15 [mm]×18 [mm] including the row selection circuit 4, the column signal output circuit 5, and the image processing circuit 6. A size of the blue-violet LED chip 70 for the integrated light emitting elements 11 to 13 is, for example, 18 [μm]×18 [μm]. In this case, the area occupation ratio of the blue-violet LED chip 70 with respect to the region area of the pixel 3 is 81%.

In FIG. 14E, in the light emitting elements 11 to 13, the compound semiconductor layers 31 are integrally formed, and the N-side electrodes 41 are integrally formed. With such a structure, the size of the compound semiconductor layer 31 can be increased, and thus handling of the blue-violet LED chip 70 becomes easier. It is easy to increase a size of the integrated light emitting element 10 and a width of the separation groove 42. Thus, there is an advantage that manufacturing can be facilitated and a cost can be reduced. On the other hand, light leaks to the adjacent blue-violet LED via the compound semiconductor layer 31, and as a result, color purity is slightly decreased. Here, since the adjacent pixels 3 are separated from each other by the light-shielding reflection layer 60, contrast does not decrease. In the integrated blue-violet LED chips 70, it is not necessary that the compound semiconductor layers 31 are all integrated. Portions of the P-side epitaxial layer 34, the light emitting layer 33, and the N-side epitaxial layer 32 may be separated between the light emitting elements. In this configuration, light leakage can be reduced, and thus it is possible to suppress a decrease of color purity.

In the integrated light emitting element 10 illustrated in FIG. 14B, in a case where at least one LED of the LEDs of each color is abnormal, it is necessary to replace one LED chip as a whole when repairing. Here, since the number of defective LEDs is not so large, a cost increase due to repairing is not a problem. Rather, an effect which makes repairing easier is much greater.

<Independent LED Display Chip 1>

Figure 15:
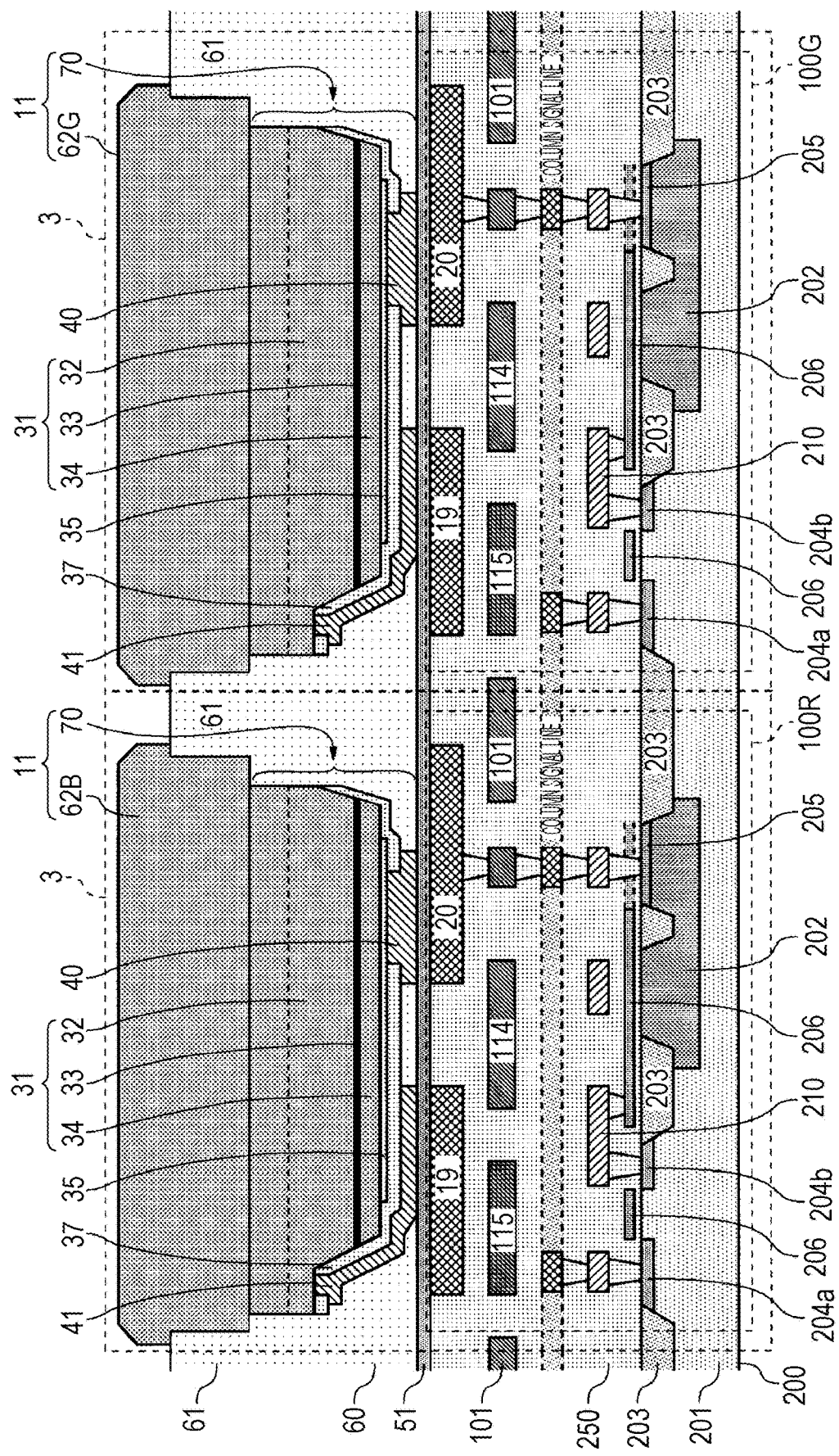
FIG. 15 is a sectional view illustrating a configuration example of a pixel in an independent LED display chip.

Next, a configuration example of the LED display chip 1 in which the independent light emitting elements 11 to 13 (refer to FIG. 14A) are adopted will be described focusing on characteristics. FIG. 15 is a sectional view illustrating a configuration example of the pixel 3 in the independent LED display chip 1. FIG. 15 illustrates an example of a sectional structure of the pixel 3 taken along an one-dot chain line D-D of FIG. 13. In the LED display chip 1, the light emitting elements 11 to 13 that respectively emit red light, green light, and blue light are provided on the pixel drive circuit 100.

Figure 16:
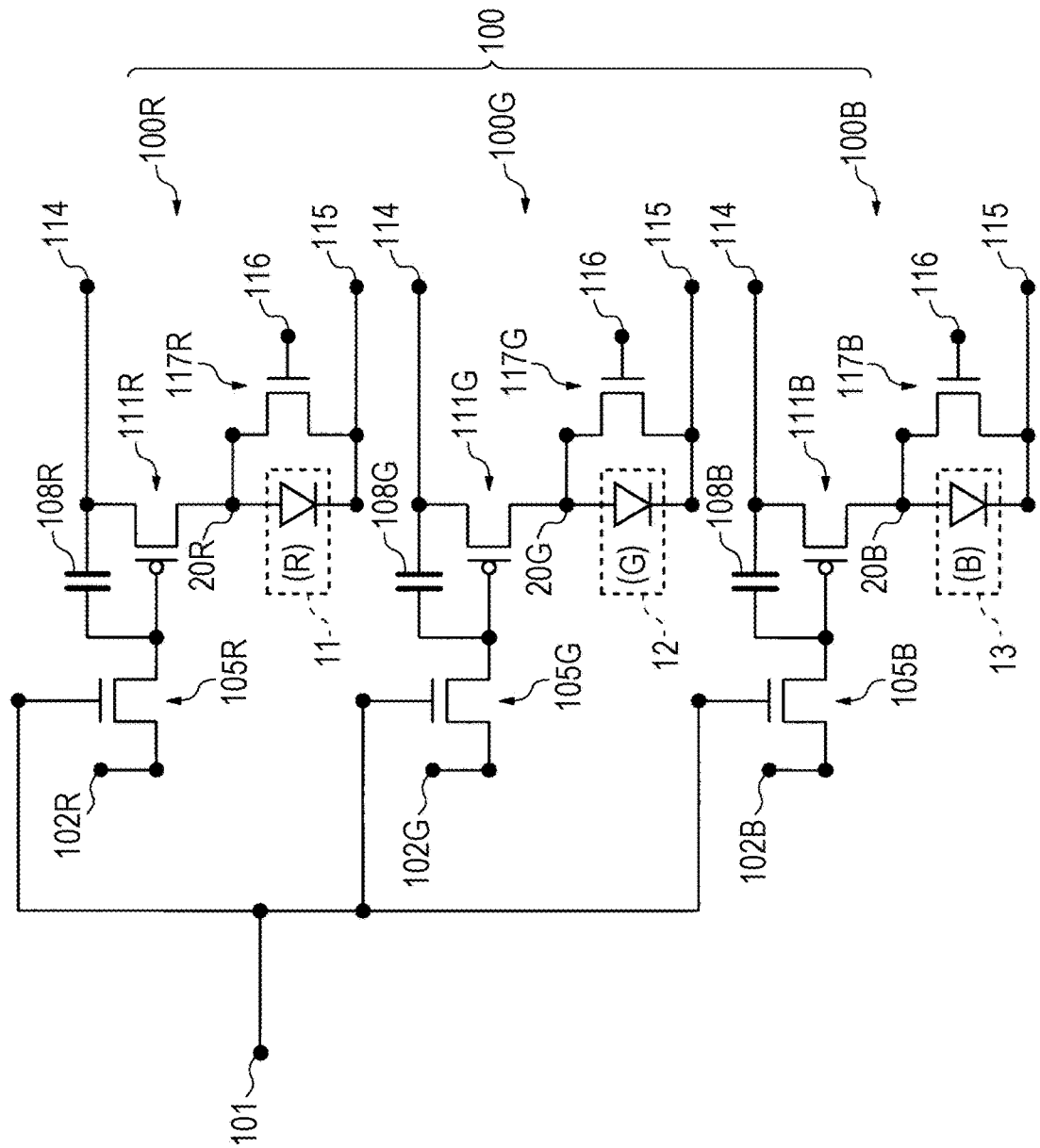
FIG. 16 is an equivalent circuit diagram illustrating an example of a pixel drive circuit for independent light emitting elements.

FIG. 16 is an equivalent circuit diagram illustrating an example of the pixel drive circuit 100 for the independent light emitting elements 11 to 13. As illustrated in FIG. 16, the pixel drive circuit 100 is configured to include a drive circuit 100R for supplying the drive current 54 to the red light emitting element 11, a drive circuit 100G for supplying the drive current 54 to the green light emitting element 12, and a drive circuit 10013 for supplying the drive current 54 to the blue light emitting element 13. These components are monolithically formed on the silicon wafer W1 when the LSI 7 is manufactured. The number of the drive circuits included in the pixel drive circuit 100 increases corresponding to the number of the light emitting elements 10.

A configuration of each of the drive circuits 100R, 100G, and 100B is the same as that in FIG. 4. That is, the drive circuit 100R for the red light emitting element 11 includes a selection transistor 105B, a holding capacitor 108R, a driving transistor 111R, and a test transistor 117R. The drive circuit 100G for the green light emitting element 12 includes a selection transistor 105G, a holding capacitor 108G, a driving transistor 111G, and a test to 117G. The drive circuit 100B for the blue light emitting element 13 includes a selection transistor 105B, a holding capacitor 108B, a driving transistor 111B, and a test transistor 117B.

In the drive circuit 100R, the selection transistor 105R is, for example, an N-type MOS transistor, and a gate terminal of the selection transistor 105R is connected to a row selection line (RoI) 101. In addition, a source terminal of the selection transistor 105R is connected to a column signal line (CS) 102R for the red light emitting element 11, and a drain terminal of the selection transistor 105R is connected to one end of the holding capacitor 108R and a gate terminal of the driving transistor 111B. The other end of the holding capacitor 108R is connected to a source terminal of the driving transistor 111R and a power supply line (Vcc) 114. The driving transistor 111R is, for example, a P-type MOS transistor, and a drain terminal of the driving transistor 111R is connected to the P-side individual electrode 20R for the red light emitting element 11. An anode terminal of the red light emitting element 11 and a source terminal of the test transistor 117R are connected to the P-side individual electrode 20R in parallel. A gate terminal of the test transistor 117R is connected to a test signal line (TB) 116. Both of a cathode terminal of the red light emitting element 11 and a drain terminal of the test transistor 117R are connected to a ground line (GND) 115. Other drive circuits 100G and 100B have the same configuration as that of the drive circuit 100R, and thus a description thereof will be omitted.

Next, a method of manufacturing the LED display chip 1 including the independent light emitting elements 11 to 13 will be described. The manufacturing steps can be performed in the same manner as in the first embodiment (refer to FIGS. 9A to 9I) except that the pixel 3 is enlarged and the blue-violet LED chip 70 is divided into three pieces. After the step of FIG. 9I, a step of providing wavelength conversion layers 62 (62R, 62G, and 62B) for each color is performed. Here, in the first embodiment, the first to third modification examples of the first embodiment, the second embodiment, and the modification example of the second embodiment, the resist pattern 58 for forming a pattern of the light-shielding reflection layer 60 is completely removed. On the other hand, in the present embodiment, only a portion of the resist pattern in the region of the pixel 3 is removed, and other portions of the resist pattern remain (not illustrated). The reason is that uniform applying of the wavelength conversion layers 62 cannot be performed because there is a stepped portion due to a difference in height of the blue-violet LED 70 at the region of the pixel 3 and portions other than the region of the pixel 3.

Figure 17C:
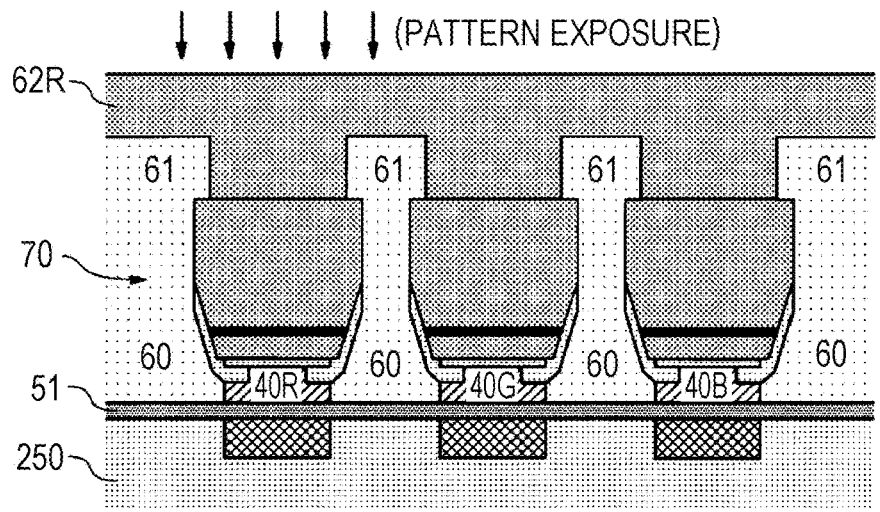
FIG. 17C is a view illustrating a step of applying a wavelength conversion layer and exposing a pattern to light.
Figure 17D:
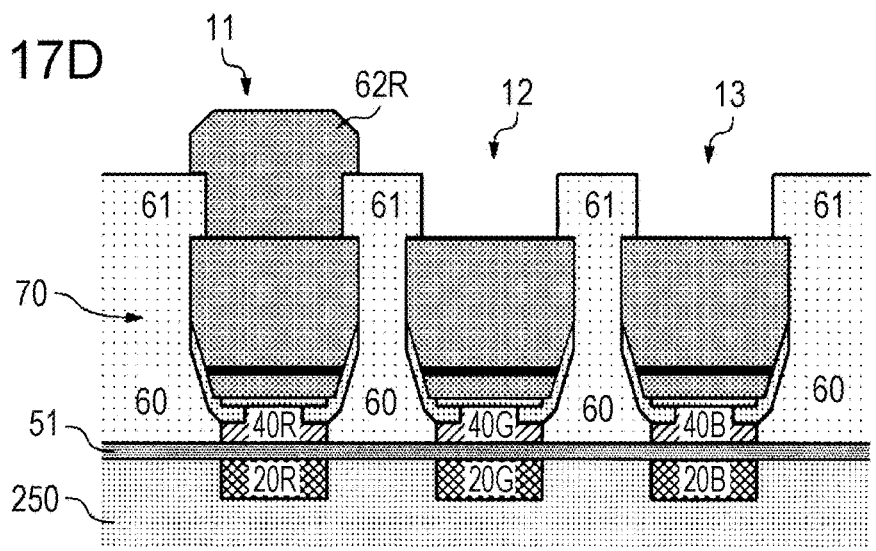
FIG. 17D is a view illustrating a step of developing and baking the wavelength conversion layer.

FIGS. 17A to 17D are views for explaining an example of a step of providing a wavelength conversion layer 62R for each color on the LED display chip 1 Pa which independent light emitting elements 11 to 13 are adopted. FIG. 17A and FIG. 17C are views illustrating a step of as the wavelength conversion layer 62R and exposing a pattern to light. FIG. 17B and FIG. 17D are views illustrating a step of developing and baking the wavelength conversion layer 62R. FIG. 17A and FIG. 17B illustrate a section taken along an one-dot chain line E1-E1 of FIG. 14A. FIG. 17C and FIG. 17D illustrate a section taken along a two-dot chain line E2-E2 of FIG. 14A. In the following description, a step of providing the wavelength conversion layer 62R for red will be described as an example.

First, as illustrated in FIG. 17A, a composite resin layer (negative resist layer) in which a red light emitting phosphor is dispersed is applied on the front surface of the pixel 3 (on the blue-violet LED 70 and the dam layer 61), and a portion on the blue-violet LED 70, which is to be the red light emitting element 11, is exposed to light. By the exposure, the composite resin layer on the portion is polymerized and insolubilized. Next, as illustrated in FIG. 17B, an unexposed portion of the composite resin layer (a portion other than the portion on the blue-violet LED 70) is dissolved using a developing solution. By the step, the wavelength conversion layer 62R for red can be left only at the portion at which the red light emitting element 11 is to be formed. By performing the same step as that in FIGS. 17A and 17B, the wavelength conversion layers 62G and 62B for green and blue are formed, and thus the light emitting elements 11 to 13 of three colors (R, G, and B) can be formed.

As a result of manufacturing the LED display chip 1 as described above, the average number of defective pixels per one LED display chip is approximately 31. By increasing the width of the separation groove 42 to 2 [µm], repairability of the defective portions is improved. On the other hand, since each blue-violet LED 70 has an elongated shape, handling when repairing becomes difficult, and as a result, the complete repair rate is decreased to approximately 30%. Here, as a result of actually operating the LED display chip 1, maximum luminance is 2000 [lm]. In addition, contrast is higher than a measurement limit, and power consumption is maximum 50 [W]. An NTSC ratio is 103%, and color gamut is also good.

<Integrated LED Display Chip 1>

Next, a configuration example of the LED display chip 1 in which the integrated emitting elements 11 to 13 (refer to FIG. 14B) are adopted will be described. In this configuration the LED chips that excite and emit red light, green light, and blue light are integrated. Thus, the size of the integrated LED chip is approximately three times the size of the independent LED chip. In addition, handling when repairing becomes easy, and thus there is an advantage that a yield is improved. Here, since the compound semiconductor layer is continuous without being separated, the excited light leaks not only into the wavelength conversion layer 62 for a target color (for example, red) but also into the wavelength conversion layer 62 for other colors (for example, green and blue). As a result, color purity of the pixel 3 slightly decreases.

Next, a method of manufacturing the LED display chip 1 including the integrated light emitting elements 11 to 13 will be described. In the LED display chip 1, the blue-violet LED chip 70 which excites the wavelength conversion layers 62R, 62G, and 62B for three colors is not segmented for each of the light emitting elements 11 to 13. In addition, the dam layer 61 is provided on the blue-violet LED chip 70 so as to separate each of the wavelength conversion layers 62R, 62G, and 62B. The manufacturing step of the integrated LED display chip 1 can be performed in the same manner as that in the first embodiment except for the above difference (refer to FIGS. 9A to 9I). After the step of FIG. 9I, a step of providing wavelength conversion layers 62 for each color is performed.

Figure 18A:
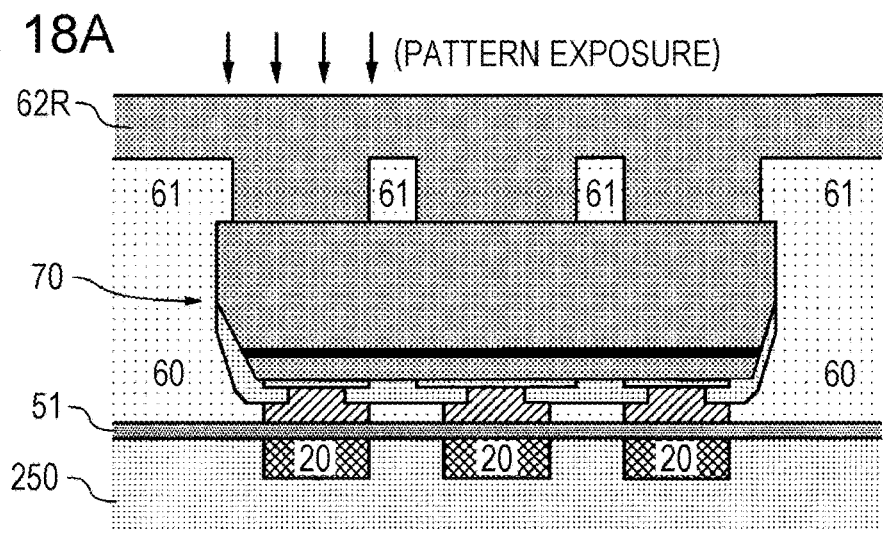
FIG. 18A is a view illustrating a step of applying a wavelength conversion layer for red and exposing a pattern to light.
Figure 18B:
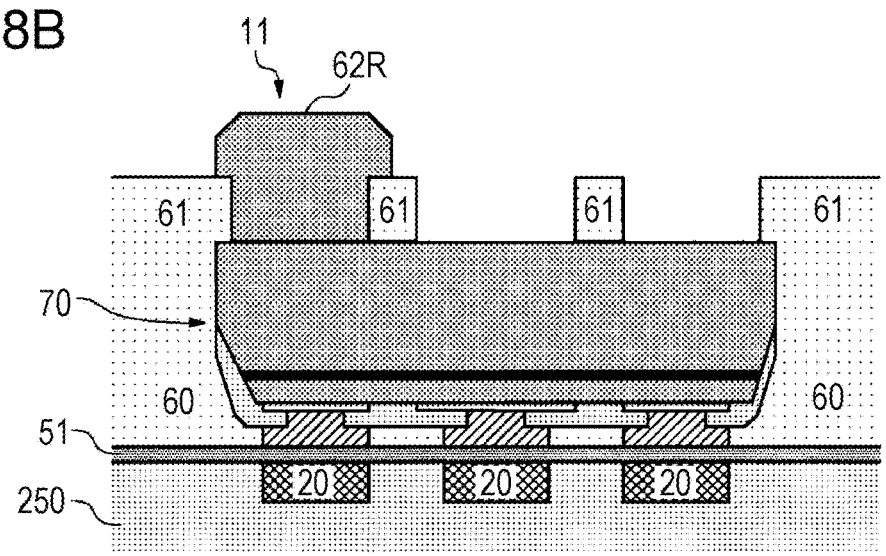
FIG. 18B is a view illustrating a step of developing and baking the wavelength conversion layer for red.
Figure 18C:
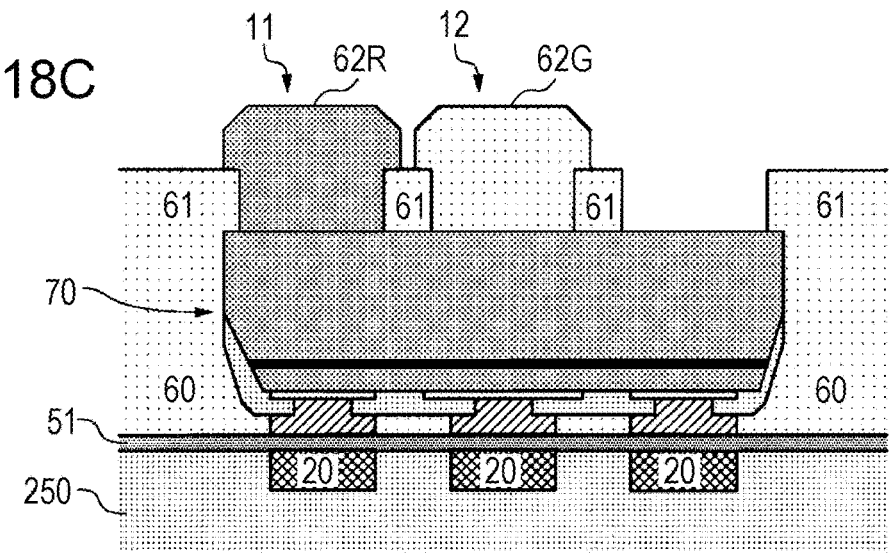
FIG. 18C is a view illustrating a step of developing and baking the wavelength conversion layer for green.
Figure 18D:
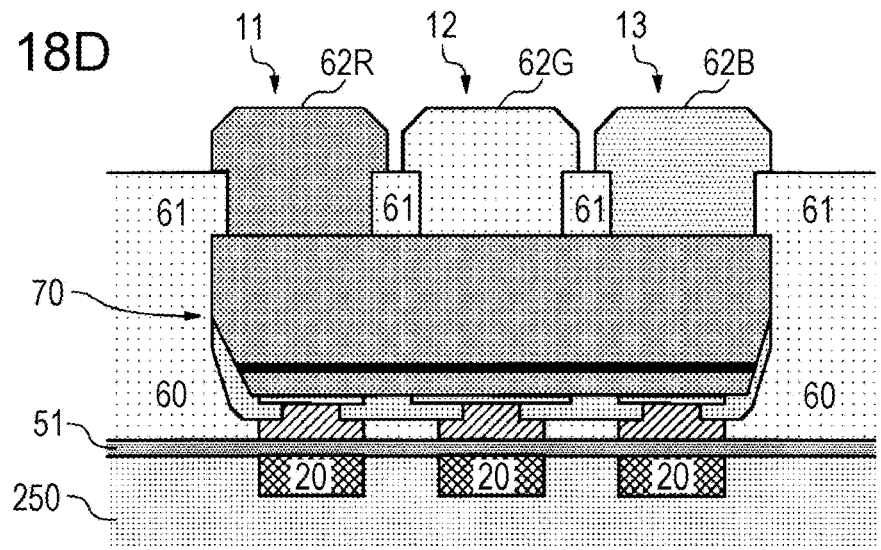
FIG. 18D is a view illustrating a step of developing and baking the wavelength conversion layer for blue.

FIGS. 18A to 18D are views for explaining an example of a step of providing wavelength conversion layers 62R to 62B for each color on the LED display chip 1 in which integrated light emitting elements 11 to 13 are adopted. FIG. 18A is a view illustrating a step of applying a wavelength conversion layer 62R for red and exposing a pattern to light. FIG. 18B is a view illustrating a step of developing and baking the wavelength conversion layer 62R for red. FIG. 18C is a view illustrating a step of developing and baking the wavelength conversion layer 62G for green. FIG. 18D is a view illustrating a step of developing and baking the wavelength conversion layer 62B for blue. FIG. 18A to FIG. 18D illustrate a section taken along an one-dot chain line F-F of FIG. 14B.

First, as illustrated in FIG. 18A, a composite resin layer (negative resist layer) in which a red light emitting phosphor is dispersed is applied on the front surface of the pixel 3 (on a rear surface of the blue-violet LED 70 and on the dam layer 61), and a portion corresponding to a light emitting region of the red light emitting element 11 is exposed and insolubilized. Then, as illustrated in FIG. 18B, an unexposed portion of the composite resin layer (a portion other than the portion corresponding to the light emitting region of the red light emitting element 11) is dissolved using a developing solution. By the step, the wavelength conversion layer 62R for red is provided at a portion at which the red light emitting element 11 is to be formed.

Next, in order to form the green light emitting element in the same manner as that in FIG. 18A, a composite resin layer (negative resist layer) in which a green light emitting phosphor is dispersed is applied on the front surface of the pixel 3, and a portion corresponding to a light emitting region of the green light emitting element 12 is exposed and insolubilized. Then, as illustrated in FIG. 18C, an unexposed portion is dissolved by using a developing solution, and the wavelength conversion layer 62G for green is provided at a portion at which the green light emitting element 12 is to be formed.

Next, in order to form the blue light emitting element 13, in the same manner as that in FIG. 18A, a composite resin layer (negative resist layer) in which a blue light emitting phosphor is dispersed is applied on the front surface of the pixel 3, and a portion corresponding to a light emitting region of the blue light emitting element 13 is exposed and insolubilized. Then, as illustrated in FIG. 18D, an unexposed portion is dissolved by using a developing solution, and the wavelength conversion layer 62B for blue is provided at a portion at which the blue light emitting element 13 is to be formed. By performing the above steps, the integrated light emitting elements 11 to 13 can be provided on the LED display chip 1. An order of forming the phosphors of each color is not limited to the above order. Further, the present invention is not limited to the above configuration, and the arrangement of the pixels can also be changed.

As a result of manufacturing the LED display chip 1 as described above, a yield is doubled as compared with the LED display chip 1 in which the independent light emitting elements 11 to 13 are adopted, and a cost is greatly reduced. On the other hand, an NTSC ratio is 100%, and color gamut is decreased.

<LED Display Chip 1 in which Plurality of Pixels 3 are Integrated>

Next, a configuration example of the LED display chip 1 adopting a configuration in which the plurality of pixels are integrated (refer to FIG. 14C; hereinafter, referred to as an integrated-multiple-pixel type) will be described. In this configuration, the plurality of pixels are integrated in the LED display chip 1 that excites and emits red light, green light, and blue light. In FIG. 14C, four pixels including the light emitting elements 10s, 10t, 10u, and 10v are integrated. Thus, a size of the integrated-multiple-pixel type LED chip is approximately 12 times the size of the independent LED chip. In addition, handling when repairing becomes easy, and thus a yield is further improved. Here, color purity of the LED display chip 1 may be slightly decreased. In addition, contrast may be decreased due to light leakage between the adjacent pixels.

In the integrated-multiple-pixel type LED display 1, as Illustrated in FIG. 14C, red light emitting elements 11s, 11t, 11u, and 11v, green light emitting elements 12s, 12t, 12u, and 12v, and blue light emitting elements 13s, 13t, 13u, and 13v are segmented, and one LED chip is configured with the segmented light emitting elements. The light emitting element 10s of the pixel 3s is configured with the red light emitting element 11s, the green light emitting element 12s, and the blue light emitting element 13s. The light emitting element 10t of the pixel 3t is configured with the red light emitting element lit, the green light emitting element 12t, and the blue light emitting element 13t. The light emitting element 10u of the pixel 3u is configured with the red light emitting element 11u, the green light emitting element 12u, and the blue light emitting element 13u. The light emitting element 10v of the pixel 3v is configured with the red light emitting element 11v, the green light emitting element 12v, and the blue light emitting element 13v. The P-side electrode 40 is individually provided for each of the light emitting elements 11s to 13v. Here, one N-side electrode 41 is provided for all of the light emitting elements 11s to 13v. By disposing the light emitting elements in this way, it is possible to reduce a region for forming the N-side contact hole 39 and a region for forming the N-side electrode 41 Therefore, in each of the light emitting elements 10s to 10v, it is possible to enlarge the mesa portion 36 (not illustrated), the transparent conductive film 35, the P-side contact hole 38, and the P-side electrode 40. By enlarging patterns of the mesa portion and the transparent conductive film 35, light emission efficiency can be increased. By enlarging the P-side contact hole 38, the light emitting element light emitting elements 10s to 10v can be easily manufactured. By enlarging the P-side electrode 40, alignment accuracy when adhering the light emitting element 10s to 10v to the LSI 7 can be relaxed, and the adhering becomes easier. In FIG. 14C, although an example in which four pixels are integrated is illustrated, the integrated-multiple-pixel type LED display chip 1 is not limited to this example. In the integrated-multiple-pixel type LED display chip 1, the number of pixels to be integrated is not limited to four, and can be increased or decreased, that is, can be plural other than four.

Modification Example of Third Embodiment

Figure 19A:
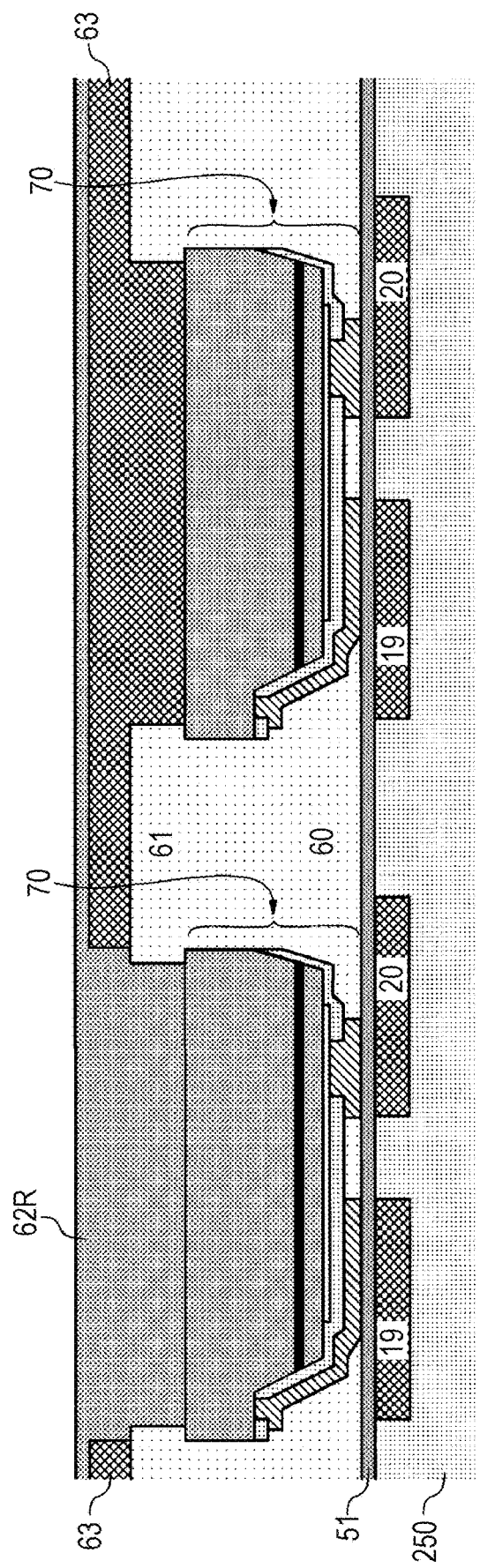
FIG. 19A is a view illustrating a step of forming a positive resist pattern and applying a wavelength conversion layer.
Figure 19B:
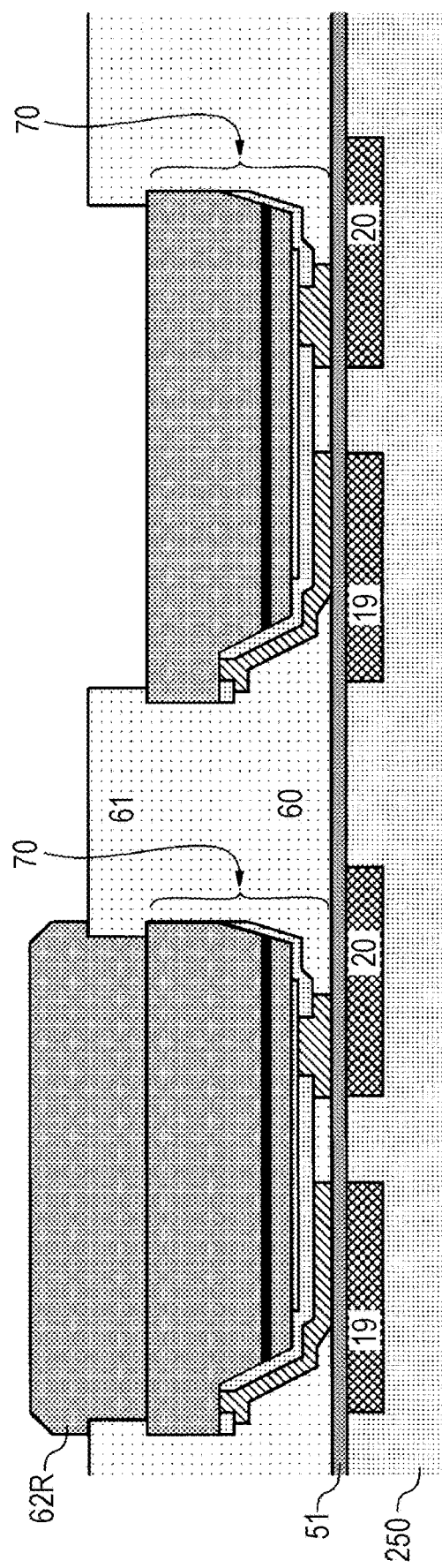
FIG. 19B is a view illustrating a step of removing a flat portion of the wavelength conversion layer and the positive resist pattern.

The wavelength conversion layers 62R to 62B may be formed by a method without exposing the composite resin layer. FIGS. 19A and 19B are views for explaining another example of a step of providing the wavelength conversion layer 62. FIG. 19A is a view illustrating a step of forming a positive resist pattern 63 and applying a wavelength conversion layer 62. FIG. 19B is a view illustrating a step of removing a flat portion of the wavelength conversion layer 62 and the positive resist pattern 63. For example, FIGS. 19A and 19B illustrate a section taken along an one-dot chain line E-E of FIG. 14A. FIGS. 19A and 19B illustrate a step of manufacturing the LED display chip 1 in which the independent light emitting elements 11 to 13 are adopted.

Since the step is the same as the step of manufacturing the LED display chip 1 in which the integrated light emitting elements 11 to 13 are adopted, explanations thereof will be omitted.

As illustrated in FIG. 19A, first, a mold of the positive resist pattern 63 is formed on a portion of the front surface of the pixel 3 other than the portion corresponding to the light emitting region of the red light emitting element 11, and the composite resin layer in which a red light emitting phosphor is dispersed is applied on the front surface of the pixel 3 (including the front surface on the positive resist pattern 63). Then, as illustrated in FIG. 19B, a surface layer portion of the composite resin layer is removed such that only the portion of the composite resin layer corresponding to the light emitting region of the red light emitting element 11 remains. That is, the composite resin layer on the positive resist pattern 63 and the positive resist pattern 63 are removed. By the step, the wavelength conversion layer 62R for red is provided at a portion at which the red light emitting element 11 is to be formed. In this method, since resolution capability of the positive resist pattern 63 is high, a pattern with higher accuracy can be formed as compared with the exposure method (refer to FIGS. 17A and 18A). Therefore, this method is suitable for a case of reducing the size of the pixel 3.

As described above, according to the present embodiment, there is provided an image-forming element 1. The image-forming element 1 includes a plurality of pixels 3, and projects and displays light emitted from the pixels 3. The image-forming element 1 includes light emitting elements 10 each in which a light source 70 emitting light is included, and a mounting substrate 7 on which a plurality of light emitting elements 10 are provided on a mounting surface plurality of light sources 70 are provided by being segmented and included in at least one pixel 3, and each of the light sources 70 includes at least one of power supply electrodes 40 and 41 on a surface facing the mounting substrate 7. The mounting substrate 7 includes drive circuits 100R, 100G, and 100B for driving the light sources 70, and electrodes 19 and 20 (20R, 20G, and 20B) which are provided on the mounting surface and are electrically connected to the power supply electrodes 40 and 41 of the light sources 70. Each of the drive circuits 1008, 100G, and 100B is configured to include each of switch circuits 117R, 117G, and 117B which selectively short-circuit the electrodes 19 and 20 electrically connected to the power supply electrodes 40 and 41 of the light source 70 with other electrodes or wirings in the drive circuits 100.

According to this configuration, when the light emitting element 10 including the light source 70 is provided on the mounting surface of the mounting substrate 7, the at least one of power supply electrodes 40 and 41 provided on the surface facing the mounting substrate 7 can be electrically connected to the electrodes 19 and 20 provided on the mounting surface. In addition, for example, when replacing the defective light source 56, removing of the defective light source 56 and adhering of the normal light source 55 can be performed relatively easily and efficiently. In addition, since each of the plurality of light sources 70 is segmented so as to be included in at least one pixel 3, it is possible to suppress light leakage to the adjacent pixels 3 via the inside of the light source 70. That is, light leakage to a dark pixel which is adjacent to a bright pixel can be suppressed. Therefore, it is possible to suppress or prevent a decrease of contrast of the image formed by the projected light of the pixel 3, and color mixing of the emitted light between the adjacent pixels 3. In addition, when the light sources 70 are segmented so as to be included in the plurality of pixels it is possible to reduce the number of the light sources 70 when the light emitting element 10 including the light source 70 is provided on the mounting substrate 7, and a handling difficulty can also be improved. Therefore, working efficiency is improved, and thus this facilitates mass production. Further, since the drive circuits 100R, 100G, and 100B include the switch circuits 117R, 117G, and 117B, before connecting the light sources 70 of the light emitting elements 11, 12, and 13 to the drive circuits 100R, 100G, and 100B, it is possible to detect whether the drive circuits 100R, 100G, and 100B are normal or abnormal by selectively short-circuiting the electrodes 19 and 20 with other electrodes or wirings in the drive circuits 100 using the switch circuits 117R, 117G, and 117B. Therefore, it is possible to manufacture an image-forming element having an excellent color rendering property and high contrast with low defects and high yield.

In the image-forming element 1, a plurality of wavelength conversion layers 62R, 62G, and 62B are provided in the light emitting elements 11, 12, and 13, and each of the wavelength conversion layers 62R, 62G, and 62B is configured to convert the emitted light into light having a wavelength among wavelengths different from each other.

According to this configuration, the light emitted from the same light source 70 can be converted into light of different color by each of the wavelength conversion layers 62R, 62G, and 62B. That is, the same light source 70 can be used for the light emitting elements 11, 12, and 13.

Further, in the image-forming element 1, the light source 70 is provided for each of the wavelength conversion layers 62R, 62G, and 62B.

According to this configuration, color mixing between the light emitting elements 11, 12, and 13 can be individually suppressed.

Alternatively, in the image-forming element 1, the plurality of wavelength conversion layers 62R, 62G, and 62B are provided for each of the light sources 70.

According to this configuration, since the light source 70 is common between the wavelength conversion layers 62R, 62G, and 62B that convert the light emitted from the light source 70, and thus a size of the light source 70 can be made relatively large. Therefore, handling of the light source 70 becomes easy. As a result, work efficiency is improved, and thus a yield is improved.

Fourth Embodiment

Next, a fourth embodiment will be described. In the fourth embodiment, in order to minimize repairing of the light emitting elements 10, two light emitting elements 10a and 10b with the same configuration are provided in one pixel 3. Hereinafter, a configuration different from those of the first embodiment to the third embodiment will be described. In addition, the same reference numerals are given to the same components as those of the first embodiment to the third embodiment, and explanations thereof will be omitted.

Figure 20:
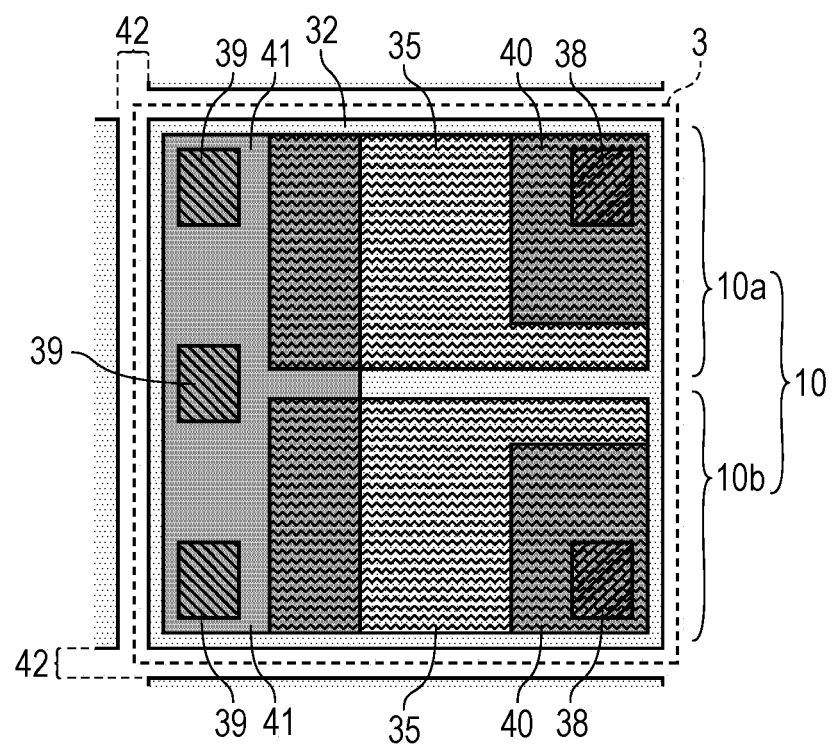
FIG. 20 is a perspective top view of a pixel according to a fourth embodiment.

FIG. 20 is a perspective top view of the pixel 3 according to the fourth embodiment. As illustrated in FIG. 20, a first light emitting element 10a and a second light emitting element 10b are mounted on one pixel 3. Although the transparent conductive film 35 and the P-side electrode 40 are provided for each of the light emitting elements 10a and 10b, the mesa portion 36 (that is, the compound semiconductor layer 31) is integrated and the N-side electrode 41 is made common. The first light emitting element 10a is generally used, and in a case where the first light emitting element 10a is detective in light emission, the second light emitting element 10b is used. In this manner, by separately using the light emitting elements 10, repairing work caused by the light emitting element 10 with defective light emission can be reduced. Here, in a case where a conduction failure occurs in the N-side electrode 40 or in a case where both of the first light emitting element 10a and the second light emitting element 10b are defective in light emission, it is necessary to replace the light emitting elements 10 of the pixel 3.

Figure 21:
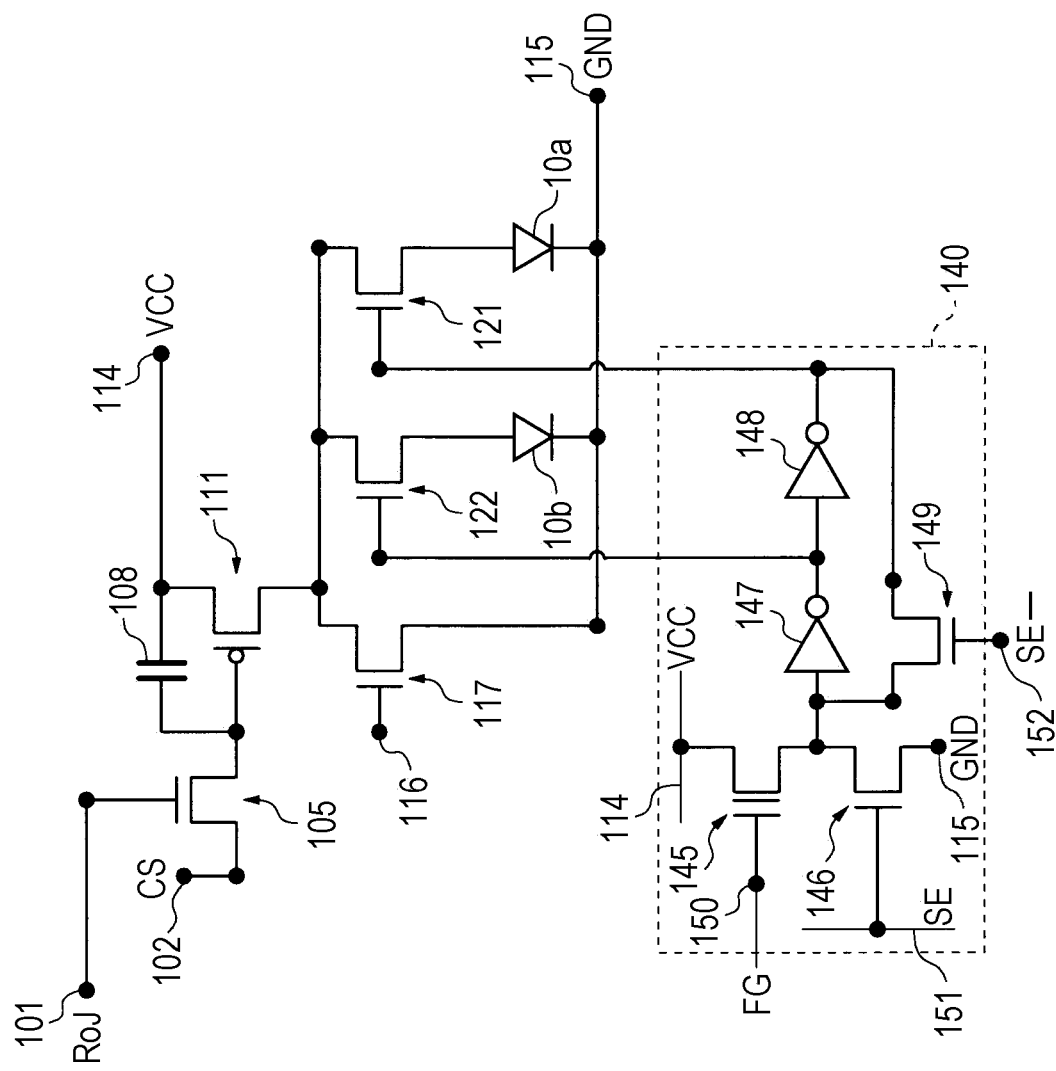
FIG. 21 is an equivalent circuit diagram illustrating an example of a pixel drive circuit according to a fourth embodiment.

In order to perform the above-described operation, a pixel drive circuit 100 that can selectively drive the first light emitting element 10a and the second light emitting element 10b is required. FIG. 21 is an equivalent circuit diagram illustrating an example of the pixel drive circuit 100 according to the fourth embodiment. As illustrated in FIG. 21, the pixel drive circuit 100 includes a selection transistor 105, a holding capacitor 108, a driving transistor 111, a test transistor 117, a first element selection transistor 121, a second element selection transistor 122, and a light emitting element selection circuit 140. These components are monolithically formed on the silicon wafer W1 when the LSI 7 is manufactured. In FIG. 21, although the pixel drive circuit 100 includes the light emitting element selection circuit 140, a part of the light emitting element selection circuit 140, for example, a portion in which a non-volatile memory transistor is provided may be disposed in another portion of the LSI 7.

The selection transistor 105 is, for example, an N-type MOS transistor, and a gate terminal of the selection transistor 105 is connected to a row selection line (RoI) 101. In addition, a source terminal of the selection transistor 105 is connected to a column signal line (CS) 102, and a drain terminal of the selection transistor 105 is connected to one end of the holding capacitor 108 and a gate terminal of the driving transistor 111. The other end of the holding capacitor 108 is connected to a source terminal of the driving transistor 111 and a power supply line (Vcc) 114. The driving transistor 111 is, for example, a P-type MOS transistor. A drain terminal of the driving transistor 111 is connected to source terminals of the first element selection transistor 121, the second element selection transistor 122, and the test transistor 117 in parallel. A drain terminal of the first element selection transistor 121 is connected to an anode terminal of the first light emitting element 10a. A drain terminal of the second element selection transistor 122 is connected to an anode terminal of the second light emitting element 10b. Each of gate terminals of the first element selection transistor 121 and the second element selection transistor 122 is connected to the light emitting element selection circuit 140 to be described. A gate terminal of the test transistor 117 is connected to a test signal line (TE) 116. Each of cathode terminals of the first light emitting element 10a and the second light emitting element 10b and a drain terminal of the test transistor 117 are connected to a ground line (GND) 115.

The light emitting element selection circuit 140 includes a non-volatile memory transistor 145, a select transistor 146, a first inverter circuit 147, a second inverter circuit 148, and a latch transistor 149. A source terminal of the non-volatile memory transistor 145 is connected to the power supply line (Vcc) 114, and a gate terminal of the non-volatile memory transistor 145 is connected to an FG line 150. A drain terminal of the non-volatile memory transistor 145 is connected to a source terminal of the select transistor 146, an input terminal of the first inverter circuit 147, and a source terminal of the latch transistor 149. A gate terminal of the select transistor 146 is connected to a signal line (SE) 151, and a drain terminal of the select transistor 146 is connected to the ground line (GND) 115. An output terminal of the first inverter circuit 147 is connected to a cafe terminal of the second element selection transistor 122 and an input terminal of the second inverter circuit 148. An output terminal of the second inverter circuit 148 is connected to a gate terminal of the first element selection transistor 121 and a drain terminal of the latch transistor 149. A gate terminal of the latch transistor 149 is connected to a signal line (SE−) 152. Here, although a stack gate transistor having a floating gate is used as the non-volatile memory transistor 145, the present invention is not limited to the example, and a transistor having another type of non-volatile memory effect such as a charge trap type can be used. In addition, an element having a non-volatile memory effect can be used in combination with a transistor.

In a light emission test of the first light emitting element 10a and the second light emitting element 10b, first, a light emission test of the first light emitting element 10a is performed. In a case where the first light emitting element 10a is defective in light emission, writing on the non-volatile memory transistor 145 of the pixel 3 is performed, and a threshold value of the non-volatile memory transistor 145 is increased. That is, by activating the signal line (SE) 151 to an ON state and supplying a high voltage to the signal line (FG) 150, writing can be performed in a case where the LED display chip 1 is powered ON, one of the first light emitting element 10a and the second light emitting element 10b is selected using the non-volatile memory transistor 145. In a state where the signal line (SE) 151 is activated to an ON state, when the signal line (FG) 150 is activated to an ON state, in a case where writing is not performed on the non-volatile memory transistor 145, since a driving capability of the non-volatile memory transistor 145 is higher, an input signal to the first inverter circuit 147 becomes High (hereinafter, referred to as H), an output signal of the first inverter circuit 147 and an input signal of the second inverter circuit 148 become Low (hereinafter, referred to as L), and an output signal of the second inverter circuit 148 becomes H. Thus, the first light emitting element 10a is selected. Thereafter, the signal line (FG) 150 and the signal line (SE) 151 are returned to an OFF state. At this time, a potential of the signal line (SE−) 152 becomes H. The potential which becomes H is fixed as long as the power is ON.

On the other hand, in a case where a threshold voltage of the non-volatile memory transistor 145 is high, even when the signal line (FG) 150 is activated to an ON state, since the non-volatile memory transistor 145 does not transition to an ON state, the input signal of the first inverter circuit 147 becomes L, the output signal of the first inverter circuit 147 and the input signal of the second inverter circuit 148 become H, and the output signal of the second inverter circuit 148 becomes L. Thus, the second light emitting element 10b is selected The pixel drive circuit 100 is configured in this manner, and thus the light emitting elements 10 with defective emission can be greatly reduced. In this case, a circuit scale of the pixel drive circuit 100 increases, or it is necessary to form the non-volatile memory transistor 145. On the other hand, there is no problem in formation when using a recent miniaturization process.

Next, an example of manufacturing the LED display chip 1 on which two light emitting elements 10a and 10b with the same configuration (refer to FIG. 20) are mounted will be described. An LED display chip 1 having the same function as that in the first embodiment is manufactured. The pixel drive circuit 100 illustrated in FIG. 21 is manufactured by increasing the size of the pixel 3 to a size in a fine processing level, for example, to a size of 10 [μm]×10 [μm]. Here, since it is necessary to form the non-volatile memory transistor 145, a time required for forming the pixel drive circuit 100 is slightly increased. In addition, since it is necessary to dispose increased signal lines, the number of wiring layers is also increased by one layer. In addition, since a circuit (not illustrated) for controlling the selection circuit 140 including the non-volatile memory transistor 145 is added, an area of the LED chip is increased by approximately 5%. As the number of steps is increased, a manufacturing cost is increased by approximately 12%.

A step of providing the light emitting elements 10 on the LSI 7 is the same as that in the first embodiment (refer to FIGS. 9A to 9I). An occurrence rate of defective light emitting elements 10, which are found in the step of testing defective light emission (refer to FIG. 9B), reduced by approximately 30%. This effect is considered to be obtained by the size reduction of the light emitting element 10. Further, 80% of the total of the defective light emitting elements 10 become normal by switching from the first light emitting element 10a to the second light emitting element 10b. Therefore, defects which require replacing of the light emitting elements 10 is reduced to 14% as compared with the case of the first embodiment. Accordingly, in a product with a large production amount, although a cost of the LSI 7 is increased, productivity is improved as repairing of defects is reduced. Thus, a benefit obtained by the productivity improvement is large, and thus the present invention has a large effect. Here, in a product with a small production amount, a benefit when a function of switching the light emitting elements is not used is large.

Modification Example of Fourth Embodiment

Figure 22:
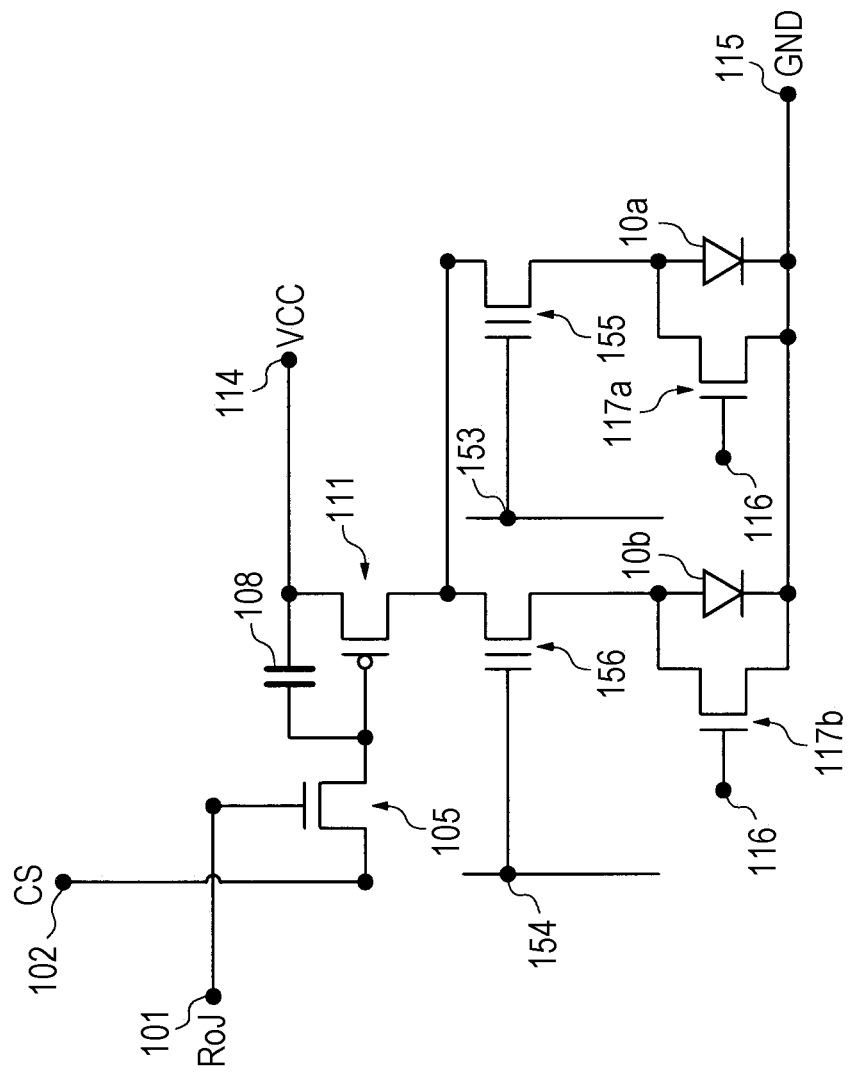
FIG. 22 is an equivalent circuit diagram illustrating another example of the pixel drive circuit according to the fourth embodiment.

FIG. 22 is an equivalent circuit diagram illustrating another example of the pixel drive circuit 100 according to the fourth embodiment. Similar to FIG. 21, the pixel drive circuit 100 illustrated in FIG. 22 includes a selection transistor 105, a holding capacitor 108, and a driving transistor 111. On the other hand, the first element selection transistor 121 is replaced by a first non-volatile memory transistor 155, and the second element selection transistor 122 is replaced by a second non-volatile memory transistor 156. In addition, a test transistor 117a is disposed in parallel with an LED 10a, and a test transistor 117b is disposed in parallel with an LED 10b. In the configuration of FIG. 22, as compared with the configuration of FIG. 21, the number of the non-volatile memory transistors and the number of the test transistors are increased to two. On the other hand, the light emitting element selection circuit 140 is deleted, and the circuit is simplified. In addition, in the pixel drive circuit 100, a first control gate 153 and a second control gate 154 are provided. The first control gate 153 controls a gate terminal of the first non-volatile memory transistor 155. The second control gate 154 controls a gate terminal of the second nonvolatile memory transistor 156. These components are monolithically formed on the silicon wafer W1 when the LSI 7 is manufactured.

By providing the test transistor 117a and the test transistor 117b, in a manufacturing step of the LSI 7, it is possible to test all circuits of the pixel portion including characteristics of the first non-volatile memory transistor 155 and the second non-volatile memory transistor 156. For example, the characteristics of the first non-volatile memory transistor 155 can be tested as follows. Both of the test transistors 117a and 117b transition to an ON state. The second non-volatile memory transistor 156 transitions to an OFF state. By increasing a potential of the row selection line 101 to a high level and decreasing a potential of the column selection line 102 to the GND level, the driving transistor 111 transitions to an ON state, and a voltage from the power supply Vcc is applied to a drain of the first non-volatile memory transistor 155 (a terminal connected to a drain of the driving transistor 111). When the first control gate 153 transitions to an ON state, a current flowing through the first non-volatile memory transistor 155 can be evaluated. In addition, when a voltage applied from the power supply Vcc and a voltage applied to the first control gate 153 are appropriately selected, writing can be performed. For example, the voltage applied from the power supply Vcc is set to approximately 3 V to 6 V, and the control gate voltage is set to approximately 4 V to 12 V. After the writing, a result of the writing can be confirmed by evaluating the current again. An evaluation of the second non-volatile memory transistor 156 can also be performed in the same manner. Although it is desirable to perform a test of writing, when the test is ended, it is necessary to erase a writing result by ultraviolet irradiation or the like. As a result, test equipment is required, and a test time is also increased. For this reason, a test of writing may be omitted.

When the LED display chip 1 is completed, in a light emission test of the first light emitting element 10a and the second light emitting element 10b, first, a light emission test of the first light emitting element 10a is performed. In a state before the light emission test, both of the first non-volatile memory transistor 155 and the second non-volatile memory transistor 156 have a low threshold voltage, and can transition to an ON state by a control gate voltage Vn (for example, 3 V to 12 V) in operation. The first non-volatile memory transistor 155 transitions to an ON state, and the second non-volatile memory transistor 156 transitions to an OFF state. At this time, light emission characteristics of each pixel 3 are sequentially evaluated. When the evaluation of all pixels is completed, for a pixel 3 which is determined to be normal, writing on the second non-volatile memory transistor 156 is performed, and the second non-volatile memory transistor 156 does not transition to an ON state by the control gate voltage Vn. When the writing on the second non-volatile memory transistor 156 is completed, similarly to the test in the manufacturing step of the LSI 7, the test transistor 117a transitions to an ON state, the first non-volatile memory transistor 155 transitions to an OFF state, and thus writing is performed.

For a pixel which is determined to be defective in the light emission test of the first light emitting element 10a, writing on the first non-volatile memory transistor 155 is performed, and the first non-volatile memory transistor 155 does not transition to an ON state by the control gate voltage Vn. Only for a pixel which is determined to be defective in the tight emission test of the first light emitting element 10a, a light emission test of the second light emitting element 10b is performed. As a result, a non-defective chip can be obtained if there is no problem. In a normal state, the number of pixels which are determined to be defective in the light emission test of the first light emitting element 10a is very small as compared with the total number of pixels. Thus, in the test of the second light emitting element 10b, a possibility of occurrence of a problem is very little. In a case here the second light emitting element 10b is determined to be defective, for example, by performing writing on the non-volatile memory transistor 156b, it is possible to prevent the current from flowing into the second light emitting element 10b. Thereby, a leakage current can be blocked, and thus the defective pixel can become a perfect black pixel (non-light-emission state). Therefore, the present embodiment can be used for a case where black pixels are allowable. Therefore, a yield can be further improved.

As described above, according to the present embodiment, the image-forming element 1 is configured such that the plurality of light emitting elements 10a and 10b with the same configuration are provided for each pixel 3.

According to this configuration, even when one light emitting element 10a becomes defective, in a case where the other light emitting element 10b is normal, the normal light emitting element 10b can be used without replacement. Therefore, a defect occurrence rate is reduced, and thus production efficiency can be improved.

In addition, in the image-forming element 1, the drive circuit 100 is configured to include at least one non-volatile memory transistor 145 for selecting any one of the plurality of light emitting elements 10a and 10b with the same configuration.

According to this configuration, at least one non-volatile memory transistor 145 can select any one of the light emitting elements 10a and 10b with same configuration, and thus it is possible to greatly reduce defects in light emission of the light emitting elements 10.

Fifth Embodiment

Next, a fifth embodiment will be described. In the fifth embodiment, a configuration of the pixel drive circuit 100 for reducing a variation in light emission intensity of the light emitting elements 10 between different pixels 3 will be described. The light emitting elements 10 are the same as those in other embodiments. In the pixel drive circuit 100 according to the present embodiment, a non-volatile memory transistor 161 is provided in order to finely adjust an amount of the current flowing through the light emitting elements 10.

In a case where a variation in light emission intensity of the light emitting elements 10 of the pixel 3 is not within a predetermined range, abnormally bright points and/or abnormally dark points occur in the image. Alternatively, there is a problem that a spot occurs in a uniform display region. As a result, a display quality of the image is degraded. Therefore, in a lighting test of the pixels 3, a pixel 3F with a large variation in light emission intensity is regarded as a defective pixel, and is replaced with a normal product. In a case where a variation in characteristics of the light emitting elements 10 is large, a production cost increases due to an increase in repairing time. In addition, in a case where the wavelength conversion layer 62 causes a variation in light emission Intensity, such replacement is difficult. For this reason, the LED display chip 1 itself is regarded as a defective chip.

Therefore, in the present embodiment, after the LED display chip 1 is completed as a display element, by adding a function of adjusting the light emission intensity of each pixel 3, it is possible to widen an allowable range of a variation in light emission intensity of the light emitting elements 10. Thereby, it is possible to reduce the number of pixels to be repaired. Further, in a case where the wavelength conversion layer 62 is used, occurrence of defects due to a variation in the wavelength conversion layer 62 can be suppressed, and thus it is possible to reduce a manufacturing cost of the display element. Regarding such a configuration, a configuration different from those of the first embodiment to the fourth embodiment will be described. In addition, the same reference numerals are given to the same components as those of the first embodiment to the fourth embodiment, and explanations thereof will be omitted.

Figure 23:
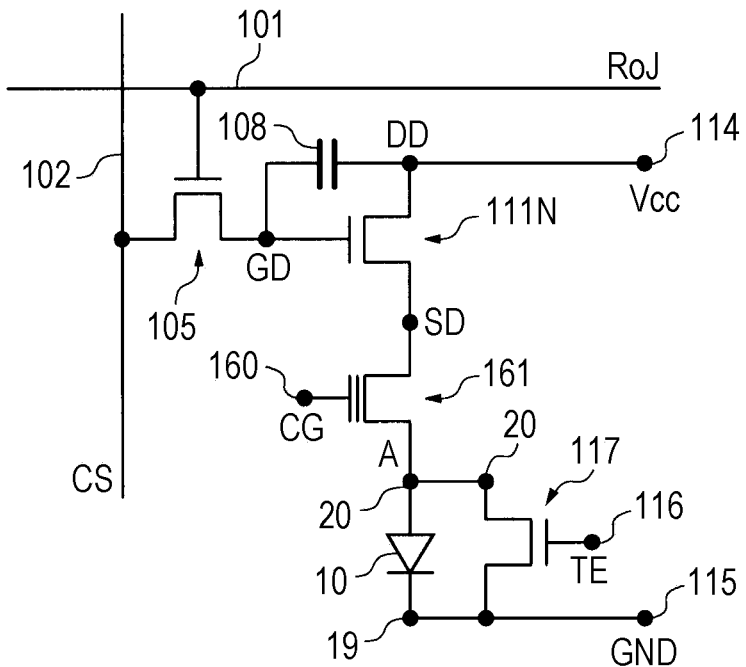
FIG. 23 is an equivalent circuit diagram illustrating an example of a pixel drive circuit according to a fifth embodiment.

FIG. 23 is an equivalent circuit diagram illustrating an example of the pixel drive circuit 100 according to a fifth embodiment. As illustrated in FIG. 23, the pixel drive circuit 100 includes a selection transistor 105, a holding capacitor 108, a driving transistor 111N, a test transistor 117, and a non-volatile memory transistor 161. These components are monolithically formed on the silicon wafer when the LSI 7 is manufactured. The present embodiment is different from the first embodiment in that the driving transistor 111N is configured with an NMOS transistor, in that the non-volatile memory transistor 161 is provided between the driving transistor 111N and the light emitting element 10, and in that a control gate (CG) signal line 160 of the non-volatile memory transistor 161 is provided. Here, although stack gate transistor having a floating gate is used as the non-volatile memory transistor 161, the present invention is not limited to the example, and a transistor having another type of non-volatile memory effect such as a charge trap type can be used. In addition, an element having a non-volatile memory effect can be used in combination with a transistor. In addition, the number of the non-volatile memory transistor 161 included in the pixel drive circuit 100 is not limited to the example illustrated in FIG. 23, and may be plural. That is, the pixel drive circuit 100 may be configured to include at least one non-volatile memory transistor 161. In addition, a circuit configuration for adjusting a current amount by the non-volatile memory transistor 161 is not limited to that in FIG. 23. As a circuit configuration different from that in FIG. 23, the non-volatile memory transistor 161 does not necessarily have to be disposed in the pixel drive circuit 100, and may be disposed in another portion of the LSI 7.

Next, a method of adjusting light emission intensity of the light emitting element 10 using the non-volatile memory transistor 161 will be described. First, when the LED display chip 1 is completed, the light emission intensity of each pixel is measured, and a pixel 3F (in some cases, a plurality of pixels 3F) with which the light emission intensity exceeds an upper limit of a specification (that is an allowable range of a variation in light emission intensity) is specified. Then, by decreasing the light emission intensity of the pixel 3F with light emission intensity exceeding the upper limit of the specification such that the light emission intensity of the pixel 3F is within the specification, it is possible to make the pixel 3F into a non-defective product. By decreasing a current flowing through the driving transistor 111N, the light emission intensity is decreased. That is, by increasing a threshold value of the non-volatile memory transistor 161, source-drain conductance of the non-volatile memory transistor 161 is decreased, and thus a source-drain potential difference of the non-volatile memory transistor 161 (a potential difference between a terminal A and a terminal SD) is increased. Therefore, by increasing a source potential of the driving transistor 111N (a potential of the terminal SD), the current flowing through the driving transistor 111N is decreased. A signal potential is written into a gate electrode of the driving transistor 111N with reference to the power supply Vcc 114. This signal potential is held by the holding capacitor 108. An output current of the driving transistor 111N is mainly determined by a source-gate potential difference of the driving transistor 111N (a potential difference between a terminal GD and a terminal SD). Therefore, when a source potential (a potential of the terminal SD) increases, the output current decreases.

The threshold value of the non-volatile memory transistor 161 is adjusted as follows. First, by applying a voltage to the row selection line 101 and the column signal line 102, the driving transistor 111N transitions to an ON state via the selection transistor 105, and the test transistor 117 transitions to an ON state. In this manner, a current can flow through the non-volatile memory transistor 161. In this state, a pulse voltage is applied to a control gate terminal 160 of the non-volatile memory transistor 161. Thereby, electrons are injected into a floating gate, and thus the threshold value can be increased. In order to perform writing, the voltage applied to the control gate terminal 160 and a voltage of the power supply Vcc 114 are appropriately adjusted. In a case of a stack gate transistor, a source-drain voltage is generally 3 V or more, and a source-control gate voltage is generally 4 V or more. Here, the voltages differ depending on a size, a structure, and the like of the stack gate transistor. When lightening the light emitting element 10, the non-volatile memory transistor 161 is caused to operate in a linear operation region in which a potential much higher than the threshold voltage is applied to the control gate voltage. In this manner, the non-volatile memory transistor 161 functions as a resistor, and a potential difference that is substantially proportional to an amount of the current flowing through the light emitting element 10 occurs between the source and the drain of the non-volatile memory transistor 161. As the threshold voltage increases, the source-drain potential difference increases, and thus a source voltage of the driving transistor 111N increases. Therefore, the drive current can be reduced.

The threshold voltage of the stack gate transistor can be continuously controlled with high accuracy by the applied voltage and the number of the applied pulse. Therefore, it is possible to finely adjust the drive current of the light emitting element 10. Thereby, it is possible to reduce a variation in light emission intensity of the light emitting elements, and thus it is possible to manufacture a display element having an excellent display quality with high yield.

First Modification Example of Fifth Embodiment

Figure 24:
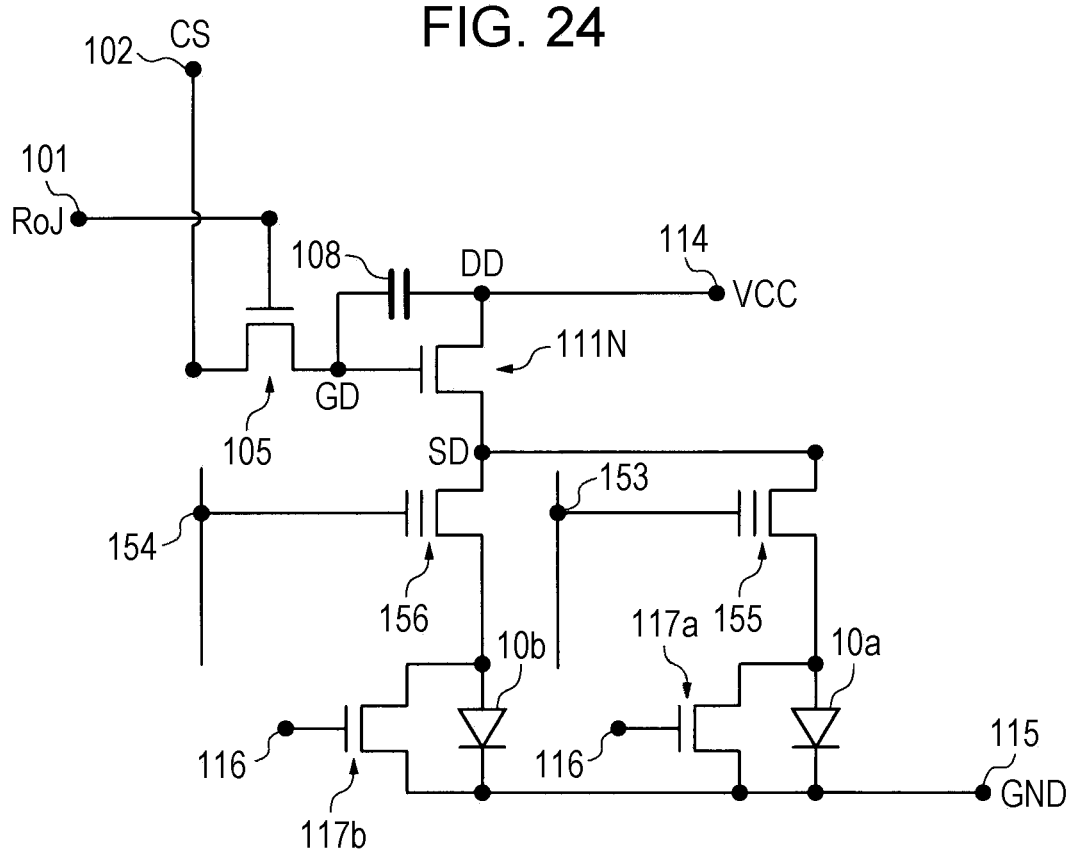
FIG. 24 is an equivalent circuit diagram illustrating an example of a pixel drive circuit obtained by combining a configuration according to the fourth embodiment with a configuration according to the fifth embodiment.

FIG. 24 is an equivalent circuit diagram illustrating an example of a pixel drive circuit 100 obtained by combining a configuration according to the fourth embodiment with a configuration according to the fifth embodiment. Similar to FIG. 23, the pixel drive circuit 100 illustrated in FIG. 24 includes a selection transistor 105, a holding capacitor 108, and a driving transistor 111N. In FIG. 23, the non-volatile memory transistor 161, the light emitting element 10, and the test transistor 117 are included in one system. On the other hand, in FIG. 24, similar to FIG. 22, two systems are provided. That is, a system configured with a first non-volatile memory transistor 155, a first light emitting element 10a, and a test transistor 117a is connected to a system configured with a second non-volatile memory transistor 156, a second light emitting element 10b, and a test transistor 117b in parallel.

When manufacturing the LSI 7, similar to FIG. 22, the pixel drive circuit 100 is tested including characteristics of the first non-volatile memory transistor 155 and the second non-volatile memory transistor 156. A difference is that the driving transistor 111N is replaced by a NMOS transistor instead of a PMOS transistor and thus the signal applied to the column signal line 102 is reversed. As described in FIG. 22, when the LED display chip 1 is completed, a light emission test of the first light emitting element 10a and the second light emitting element 10b is performed, and thus each pixel 3 can emit light. That is, in a case where the first emitting element 10a is a non-defective product, the threshold value of the second non-volatile memory transistor 156 is increased such that access to the first light emitting element 10b is not allowed. On the other hand, in a case where the first light emitting element 10a is a defective product, the threshold value of the first non-volatile memory transistor 155 is increased such that access to the first light emitting element 10a is not allowed, and thus the second light emitting element 10b can emit light. Thereafter, in the pixel 3F of which the light emission amount exceeds a specification value (for example, an upper limit value of a specification), a threshold value of the first non-volatile memory transistor 155 or a threshold value of the second non-volatile memory transistor 156 is finely adjusted, and thus a light emission amount of the first light emitting element 10a or a light emission amount of the second light emitting element 10b is adjusted. This point is as described in FIG. 23. The selection of the first light emitting element 10a and the second light emitting element 10b and the light emission amount adjustment may be performed at the same time.

Second Modification Example of Fifth Embodiment

Figure 25:
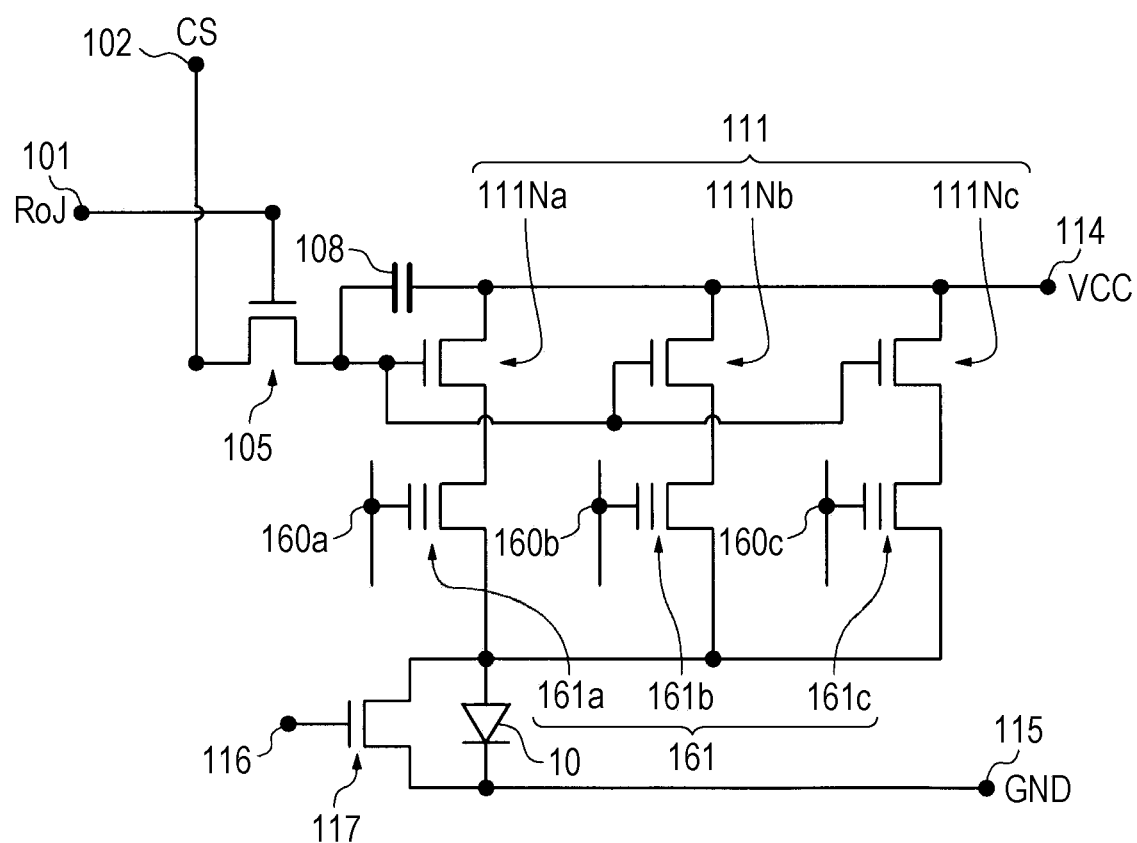
FIG. 25 is an equivalent circuit diagram illustrating another example of the pixel drive circuit according to the fifth embodiment.

FIG. 25 is an equivalent circuit diagram illustrating another example of the pixel drive circuit 100 according to the fifth embodiment. In the configuration of FIG. 23, by adjusting the current flowing through the light emitting element 10 to be decreased, luminance of the light emitting element 10 which is too bright is reduced. Thereby, it is possible to reduce a variation in luminance of the light emitting element 10. On the other hand, in some cases, there is a light emitting element 10 having very low luminance as compared with other light emitting elements 10. In this case, only when the current is greatly increased, the light emitting element 10 can reach luminance satisfying a specification. FIG. 25 illustrates an example of the pixel drive circuit 100 which is intended to improve luminance and reduce defects by allowing a large current to flow through the light emitting element 10 with low luminance. That is, by providing a plurality of driving transistors 111N, it is possible to supply a current larger than a normal current to the light emitting element 10.

Similar to FIG. 23, the pixel drive circuit 100 illustrated in FIG. 25 includes a selection transistor 105, a holding capacitor 108, a test transistor 117, and a light emitting element 10. A difference from FIG. 23 is that three driving transistors 111Na, 111Nb, and 111Nc are disposed in parallel, and that non-volatile memory transistors 161a, 161b, and 161c are respectively connected to the driving transistors 111Na, 111Nb, and 111Nc in series. All of gate terminals of the driving transistors 111Na, 111Nb, and 111Nc are connected to one terminal of the holding capacitor 108. Each of the non-volatile memory transistors 161a, 161b, and 161c is driven by each of control gates 160a, 160b, and 160c.

When manufacturing the LSI 7, similar to FIG. 24, the pixel drive circuit 100 is tested including characteristics of the non-volatile memory transistors 161a, 161b, and 161c. Next, when the LED display chip 1 is completed, in a state where the control gate 160a transitions to an ON state and the control gates 160b and 160c transition to an OFF state, the light emission intensity of each pixel 3 is measured, and a pixel 3EL in some cases, a plurality of pixels) with which the light emission intensity is significantly lower than a lower limit of a specification (that is, an allowable range of a variation in light emission intensity) is specified. In normal pixels 3 other than the pixel 3EL, writing on the non-volatile memory transistors 161b and 161c is performed, and thus the threshold voltages of the non-volatile memory transistors 161b and 161c is increased. Thus, the non-volatile memory transistors 161b and 161c do not transition to an ON state by the control gate voltage Vn. Next, in the pixel EL, in a state where the control gates 160a and 160b transition to an ON state and the control gate 160c transitions to an OFF state, a light emission test is performed again. In this state, when the light emission intensity is equal to or greater than the lower limit of the specification, writing on the non-volatile memory transistor 161c is performed, and thus the threshold voltage of the non-volatile memory transistor 161c is increased. Thus, the non-volatile memory transistor 161c does not transition to an ON state by the control gate voltage Vn. At this time, in pixels with insufficient light emission intensity, in a state where all of the control gates 160a, 160b, and 160c transition to an ON state, a light emission test is performed again. In this configuration, in a normal pixel, it is possible to allow an approximately threefold current to flow through the light emitting element 10. In this manner, in the pixel EL with high light emission intensity, by adjusting the threshold voltages of the non-volatile memory transistors 161b and 161c, it is possible to adjust the current flowing through the light emitting element 10. Thus, the light emission intensity of the light emitting element 10 can be adjusted within a specification. In a case where the light emission intensity is higher than the specification, similar to FIG. 23, writing on the non-volatile memory transistor 161a is performed, and thus the threshold voltage of the non-volatile memory transistor 161a is increased. Thereby, the drive current of the driving transistor 111Na can be decreased, and thus it is possible to adjust luminance of the light emitting element 10.

In the above example, although three driving transistors 111Na, 111Nb, and 111Nc are disposed, the number of the driving transistors 111N is not limited to three, and may be plural. In addition, although the plurality of driving transistors 111N are supposed to have the same size and the same drive current, the driving transistors 111N do not necessarily have the same size and the same drive current. For example, in a case where almost all pixels 3 with low luminance can be repaired with a current up to 1.5 times the current flowing through a standard element, the number of the driving transistors 111N may be two. In this case, one driving transistor 111N may be a small transistor of which the drive current is approximately half that of the standard driving transistor 111N (a transistor of which the gate width is approximately half).

As described above, according to the present embodiment, there is provided an image-forming element 1. The image-forming element 1 includes a plurality of pixels 3, and projects and displays light emitted from the pixels 3. The image-forming element 1 includes light emitting elements 10 each in which a light source 50 emitting light is included (a blue LED chip 50, a blue-violet LED chip 70, and an LED chip emitting another color light may be used, and in the following, represented by a blue LED chip 50), and a mounting substrate 7 on which a plurality of light emitting elements 10 are provided on a mounting surface. A plurality of light sources 50 are provided by being segmented and included in at least one pixel 3, and each of the light sources 50 includes one or a plurality of power supply electrodes 40 and 41 provided on the same surface. The mounting substrate 7 includes drive circuits 100 for driving the light sources 50, and electrodes 19 and 20 which are provided on the mounting surface and are electrically connected to the power supply electrodes 40 and 41 of the light sources 50. Each of the drive circuits 100 is configured to include at least one non-volatile memory transistor 161 for adjusting light emission intensity of the light emitting element 10.

According to this configuration, when the light emitting element 10 including the light source 50 is provided on the mounting surface of the mounting substrate 7, the power supply electrodes 40 and 41 provided on the same surface of the light source 50 can be electrically connected to the electrodes 19 and 20 provided on the mounting surface. In addition, for example, when replacing the defective light source 56, removing of the defective light source 56 and adhering of the normal light source 55 can be performed relatively easily and efficiently. In addition, since each of the plurality of light sources 50 is segmented so as to be included in at least one pixel 3, it is possible to suppress light leakage to the adjacent pixels 3 via the inside of the light source 50. That is, light leakage to a dark pixel which is adjacent to a bright pixel can be suppressed. Therefore, it is possible to suppress or prevent a decrease of contrast of the image formed by the projected light of the pixel 3, and color mixing of the emitted light between the adjacent pixels 3. In addition, when the light sources 50 are segmented so as to be included in the plurality of pixels 3, it is possible to reduce the number of the light sources 50 when the light emitting element 10 including the light source 50 is provided on the mounting substrate 7, and a handling difficulty can also be improved. Therefore, working efficiency is improved, and thus this facilitates mass production. Further, at least one non-volatile memory transistor 161 adjusts the light emission intensity of the light emitting element 10. In this configuration, it is possible to widen an allowable range of a variation in light emission intensity of the light emitting elements 10, and thus it is possible to reduce the number of pixels to be repaired. Therefore, it is possible to manufacture an image-forming element having an excellent color rendering property and high contrast with low defects and high yield.

As described above, the embodiments according to the present invention have been described. The embodiments have been presented by way of example only, and it should be understood by those skilled in the art that the embodiments can be modified in various forms by combining the respective elements and processing processes, and the modification examples are included in the scope of the present invention.

For example, in the first embodiment to the fifth embodiment, the pixels 3 of the pixel array 2 may be disposed in a two-dimension arrangement other than N rows and M columns. For example, the plurality of pixels 3 may be arranged in a honeycomb shape.

The present invention is useful for, for example, a projector, a head-up display, a head mounted display, a wearable terminal, or the like.

REFERENCE SIGNS LIST

100: PIXEL DRIVE CIRCUIT
1: LED DISPLAY CHIP
2: PIXEL ARRAY
3, 3s, 3t, 3u, 3v: PIXEL
4: ROW SELECTION CIRCUIT
5: COLUMN SIGNAL OUTPUT CIRCUIT
6: IMAGE PROCESSING CIRCUIT
7: LSI
8: LIGHT EMITTING ARRAY
10, 10s, 10t, 10u, 10v: LIGHT EMITTING ELEMENT
10a: FIRST LIGHT EMITTING ELEMENT
10b: SECOND MIGHT EMITTING ELEMENT 11, 11s, 11t, 11s, 11v: RED LIGHT EMITTING ELEMENT
12, 12s, 12t, 12u, 12v: GREEN LIGHT EMITTING ELEMENT
13, 13s, 13t, 13u, 13v: BLUE LIGHT EMITTING ELEMENT
50: BLUE LED CHIP
70: BLUE-VIOLET LED CHIP
19: N-SIDE COMMON ELECTRODE
20: P-SIDE INDIVIDUAL ELECTRODE
30: SAPPHIRE SUBSTRATE
31: COMPOUND SEMICONDUCTOR LAYER
32: N-SIDE EPITAXIAL LAYER
33: LIGHT EMITTING LAYER
34: P-SIDE EPITAXIAL LAYER
35: TRANSPARENT CONDUCTIVE FILM
36: MESA PORTION
37: PROTECTION FILM
38: P-SIDE CONTACT HOLE
39: N-SIDE CONTACT HOLE
40: P-SIDE ELECTRODE
41: N-SIDE ELECTRODE
42: SEPARATION GROOVE
43: HOLDING SUBSTRATE
44: ADHESIVE LAYER
45: TRANSFER SUBSTRATE
46: ADHESIVE LAYER
51: ANISOTROPIC CONDUCTIVE FILM
52: TRANSPARENT SUBSTRATE
53: TRANSPARENT CUSHION LAYER
54: DRIVE CURRENT
55: NORMAL LED CHIP
56: ABNORMAL LED CHIP
57: MICROMANIPULATOR NEEDLE
58: RESIST PATTERN
60: LIGHT-SHIELDING REFLECTION LAYER
61: DAM LAYER
62, 62R, 62G, 62B: WAVELENGTH CONVERSION LAYER
63: POSITIVE RESIST PATTERN
100: PIXEL DRIVE CIRCUIT
101: ROW SELECTION LINE (RoI)
102, 102R, 102G, 102B: COLUMN SIGNAL LINE (CS)
105, 105R, 105G, 105B: SELECTION TRANSISTOR
108, 108R, 108G, 108B: HOLDING CAPACITOR
114: POWER SUPPLY LINE (Vcc)
115: GND LINE
111, 111R, 111G, 111B, 111N, 111Na, 111Nb, 111Nc: DRIVING TRANSISTOR
116: TEST TERMINAL (TE)
117, 117R, 117G, 117B: TEST TRANSISTOR
121: FIRST ELEMENT SELECTION TRANSISTOR
122: SECOND ELEMENT SELECTION TRANSISTOR
140: LIGHT EMITTING ELEMENT SELECTION CIRCUIT
145: NON-VOLATILE MEMORY TRANSISTOR
146: SELECT TRANSISTOR
147: FIRST INVERTER CIRCUIT
148: SECOND INVERTER CIRCUIT
149: LATCH TRANSISTOR
150: SIGNAL LINE (FG)
151: SIGNAL LINE (SE)
152: SIGNAL LINE (SE−)
153: FIRST CONTROL GATE
154: SECOND CONTROL GATE
155: FIRST NON-VOLATILE MEMORY TRANSISTOR
156: SECOND NON-VOLATILE MEMORY TRANSISTOR
160, 160a, 160b, 160c: CONTROL GATE TERMINAL
161, 161a, 161b, 161c: NON-VOLATILE MEMORY TRANSISTOR
160: CONTROL GATE TERMINAL
161: NON-VOLATILE MEMORY TRANSISTOR
200: SILICON SUBSTRATE
201: P-WELL LAYER
202: N-WELL LAYER
203: STI LAYER
204a, 204b: N+ DIFFUSION LAYER
205: P+ DIFFUSION LAYER
206: GATE poly-Si LAYER
210: FIRST LAYER METAL WIRING
220: SECOND LAYER METAL WIRING
230: THIRD LAYER METAL WIRING
240: FOURTH LAYER METAL WIRING
250: INTERLAYER INSULATING LAYER

The invention claimed is:

1. An image-forming element that includes a plurality of pixels and projects and displays light emitted from the pixels, the element comprising:
a light emitting element which includes a light source emitting the light; and
a mounting substrate on which a plurality of light emitting elements are provided on a mounting surface,
wherein a plurality of light sources which are segmented and included in at least one pixel are provided,
wherein each of the light sources includes one or a plurality of power supply electrodes provided on the same surface,
wherein the mounting substrate includes a drive circuit which drives the light source and electrodes which are provided on the mounting surface and are electrically connected to the power supply electrodes of the light source, and
wherein the drive circuit includes at least one non-volatile memory transistor to reduce a variation of light emission intensity between the light emitting elements.

2. The image-forming element according to claim 1,
wherein the mounting substrate is a semiconductor substrate, and
wherein the drive circuit, an array selection circuit which selects the pixels arranged in a predetermined direction, and a signal output circuit which outputs a drive signal to the drive circuit for driving the light source of the pixel selected by the array selection circuit are monolithically formed on the mounting substrate.

3. The image-forming element according to claim 1, further comprising:
an anisotropic conductive film which is provided on an entire surface of the mounting substrate,
wherein the power supply electrodes of each of the light sources are provided on the electrodes of the mounting substrate via the same anisotropic conductive film.

4. The image-forming element according to claim 1,
wherein the drive circuit includes a switch circuit which is disposed electrically in parallel with the light source and in serial with a drive transistor which controls current flow to the light source.

5. The image-forming element according to claim 1, wherein
the drive circuit includes a driving transistor, and the at least one non-volatile memory transistor is connected in series with the driving transistor and the light emitting element between the driving transistor and the light emitting element.

6. The image-forming element according to claim 1, wherein the plurality of light sources which are optically and mechanically segmented from each other.

7. The image-forming element according to claim 1, a threshold voltage of the at least one non-volatile memory transistor is increased to decrease light emission intensity of the light emitting element which exceeds an allowable range of the light emission intensity.

* * * * *